United States Patent
Yang et al.

(10) Patent No.: US 12,327,534 B2
(45) Date of Patent: Jun. 10, 2025

(54) ARRAY SUBSTRATE INCLUDING GATE DRIVE CIRCUIT WITH SHIFT REGISTER UNITS IN CASCADE, DISPLAY DEVICE AND DRIVING METHOD

(71) Applicants: Beijing BOE Display Technology Co., Ltd., Beijing (CN); BOE Technology Group Co., Ltd., Beijing (CN)

(72) Inventors: Tao Yang, Beijing (CN); Yingmeng Miao, Beijing (CN); Dongchuan Chen, Beijing (CN); Yue Yang, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/642,704

(22) Filed: Apr. 22, 2024

(65) Prior Publication Data
US 2024/0274099 A1    Aug. 15, 2024

Related U.S. Application Data

(63) Continuation of application No. PCT/CN2022/125737, filed on Oct. 17, 2022.

(51) Int. Cl.
G09G 3/36        (2006.01)
G09G 3/3266   (2016.01)
G11C 19/28    (2006.01)

(52) U.S. Cl.
CPC ......... *G09G 3/3677* (2013.01); *G09G 3/3266* (2013.01); *G09G 2300/0408* (2013.01);
(Continued)

(58) Field of Classification Search
CPC ............... G09G 3/3677; G09G 3/3266; G09G 2300/0408; G09G 2310/0286; G09G 2310/08; G09G 2330/021; G11C 19/28
See application file for complete search history.

(56) References Cited

U.S. PATENT DOCUMENTS 9,530,191 B2 * 12/2016 Choudhury ........... G06T 7/0004
2015/0287172 A1 * 10/2015 Choudhury ............ H04N 19/85
382/254

(Continued)

FOREIGN PATENT DOCUMENTS

CN      107016953 A    8/2017
CN      108461062 A    8/2018
(Continued)

*Primary Examiner* — Sejoon Ahn
(74) *Attorney, Agent, or Firm* — IPro, PLLC

(57) ABSTRACT

An array substrate includes a gate drive circuit including shift register units in cascade. The driving method includes: in a first driving mode, loading a first clock signal with an active level and an inactive level alternating periodically to a cascade clock signal terminal of a shift register unit, and loading a second clock signal with an active level and an inactive level alternating periodically to any one of K drive clock signal terminals of the shift register unit; and in a second driving mode, loading the first clock signal to the cascade clock signal terminal, and loading a third clock signal with an active level appearing within a target time period to a target drive clock signal terminal among the K drive clock signal terminals so that a target drive output terminal corresponding to the target drive clock signal terminal outputs a gate turn-on signal.

20 Claims, 25 Drawing Sheets

(52) U.S. Cl.
CPC . *G09G 2310/0286* (2013.01); *G09G 2310/08* (2013.01); *G09G 2330/021* (2013.01); *G11C 19/28* (2013.01)

(56) References Cited

U.S. PATENT DOCUMENTS

| | | | |
|---|---|---|---|
| 2018/0173359 A1* | 6/2018 | Ji | G06F 3/04166 |
| 2018/0173925 A1* | 6/2018 | Ding | G06V 40/1318 |
| 2018/0174521 A1* | 6/2018 | Zheng | G11C 19/28 |
| 2018/0174526 A1* | 6/2018 | Chesnokov | G09G 3/3611 |
| 2018/0174542 A1* | 6/2018 | Zheng | G09G 3/006 |
| 2018/0174552 A1* | 6/2018 | Zhang | H01L 27/124 |
| 2018/0174659 A1* | 6/2018 | Shao | G11C 19/28 |
| 2018/0174660 A1* | 6/2018 | Li | G09G 3/32 |
| 2019/0346954 A1* | 11/2019 | Jung | G06F 3/0416 |
| 2019/0346960 A1* | 11/2019 | Liang | G09G 3/3696 |
| 2019/0347972 A1* | 11/2019 | Kim | G09G 3/20 |

FOREIGN PATENT DOCUMENTS

| | | |
|---|---|---|
| CN | 108597437 A | 9/2018 |
| CN | 108831387 A | 11/2018 |
| CN | 111312136 A | 6/2020 |
| CN | 216388720 U | 4/2022 |
| CN | 115116398 A | 9/2022 |
| JP | 2015143844 A | 8/2015 |
| WO | 2022082519 A1 | 4/2022 |

\* cited by examiner

ARRAY SUBSTRATE INCLUDING GATE DRIVE CIRCUIT WITH SHIFT REGISTER UNITS IN CASCADE, DISPLAY DEVICE AND DRIVING METHOD

CROSS REFERENCE TO RELATED APPLICATION

This application is a continuation of International Application No. PCT/CN2022/125737 filed Oct. 17, 2022, the entire contents of which are incorporated herein by reference.

TECHNICAL FIELD

The disclosure relates to the field of display technology, and in particular to an array substrate, a display device and a driving method.

BACKGROUND

With the rapid development of display technology, the display panels are increasingly developing towards the direction of high integration and low cost. Here, the GOA (Gate Driver on Array) technology integrates a TFT (Thin Film Transistor) gate drive circuit on an array substrate of a display panel to establish a scan drive for the display panel. When the display panel displays an image, the sub-pixels are scanned through the gate drive circuit, so that the sub-pixels are charged according to the image data corresponding to the image to be displayed, to achieve the image display.

SUMMARY

Embodiments of the disclosure provide an array substrate, including: a gate drive circuit.

The gate drive circuit includes a plurality of shift register units in cascade.

Any shift register unit among the plurality of shift register units is configured to: in a first driving mode, load a first clock signal with an active level and an inactive level alternating periodically to a cascade clock signal terminal of the shift register unit so that a cascade output terminal of the shift register unit outputs a cascade signal, and load a second clock signal with an active level and an inactive level alternating periodically to any one of K drive clock signal terminals of the shift register unit so that a $k^{th}$ drive output terminal of the shift register unit corresponding to a $k^{th}$ drive clock signal terminal among the K drive clock signal terminals outputs a gate turn-on signal; where K is a positive integer, k is an integer and $1 \leq k \leq K$.

A target shift register unit among the plurality of shift register units is configured to: in a second driving mode, load the first clock signal to the cascade clock signal terminal so that the cascade output terminal of the shift register unit outputs a cascade signal, and load a third clock signal with an active level appearing within a target time period to a target drive clock signal terminal among the K drive clock signal terminals so that a target drive output terminal corresponding to the target drive clock signal terminal outputs a gate turn-on signal.

In some possible implementations of the disclosure, in one clock cycle of the first clock signal, a duration of the active level accounts for no more than 1¼K of the clock cycle of the first clock signal.

In some possible implementations of the disclosure, the clock cycle of the first clock signal is 4K*H, the duration of the active level is no more than 4(K−1)*H, and H represents a charging duration of a row of sub-pixels.

In some possible implementations of the disclosure, in one clock cycle of the second clock signal, a duration of the active level accounts for no more than (2K+1)/3K of the clock cycle of the second clock signal.

In some possible implementations of the disclosure, the clock cycle of the second clock signal is 3K*H, the duration of the active level is no more than (2K+1)*H, and H represents a charging duration of a row of sub-pixels.

In some possible implementations of the disclosure, the third clock signal is a clock signal with an active level and an inactive level alternately appearing in clock periodicity.

In one clock cycle of the third clock signal, a duration of the active level accounts for no more than (2K+1)/3K of the clock cycle of the third clock signal.

In some possible implementations of the disclosure, the clock cycle of the third clock signal is 3K*H, the duration of the active level is no more than (2K+1)*H, and H represents a charging duration of a row of sub-pixels.

In some possible implementations of the disclosure, $K \geq 2$, and the array substrate further includes 4 cascade clock signal lines and 3 drive clock signal line groups.

Among the plurality of shift register units, a cascade clock signal terminal of a $4p-3^{th}$ shift register unit is coupled to a $1^{st}$ cascade clock signal line among the 4 cascade clock signal lines, a cascade clock signal terminal of a $4p-2^{th}$ shift register unit is coupled to a $2^{nd}$ cascade clock signal line among the 4 cascade clock signal lines, a cascade clock signal terminal of a $4p-1^{th}$ shift register unit is coupled to a 3rd cascade clock signal line among the 4 cascade clock signal lines, and a cascade clock signal terminal of a $4p^{th}$ shift register unit is coupled to a $4^{th}$ cascade clock signal line among the 4 cascade clock signal lines, where p is a positive integer.

Each of the 3 drive clock signal line groups includes K drive clock signal lines, and drive clock signal lines in different drive clock signal line groups are different; where, among the plurality of shift register units, K drive clock signal terminals of a $3q-2^{th}$ shift register unit are correspondingly coupled to K drive clock signal lines of a first drive clock signal group among the 3 drive clock signal line groups, K drive clock signal terminals of a $3q-1^{th}$ shift register unit are correspondingly coupled to K drive clock signal lines of a second drive clock signal group among the 3 drive clock signal line groups, and K drive clock signal terminals of a $3q^{th}$ shift register unit are correspondingly coupled to K drive clock signal lines of a third drive clock signal group among the 3 drive clock signal line groups, where q is a positive integer.

In some possible implementations of the disclosure, a cascade output terminal of an $M^{th}$ shift register unit is coupled to a reset signal terminal of an $M-3^{th}$ shift register unit and an input signal terminal of an $M+2^{th}$ shift register unit respectively, and M is a positive integer.

In some possible implementations of the disclosure, K=1, and the first clock signal and the second clock signal input to the same shift register unit are same.

In some possible implementations of the disclosure, the array substrate further includes 2N cascade clock signal lines and 2N drive clock signal lines; and N is an integer greater than 0.

A first clock signal transmitted on an $x^{th}$ cascade clock signal line among the 2N cascade clock signal lines is same as a second clock signal transmitted on an $x^{th}$ drive clock signal line among the 2N drive clock signal lines; where x is an integer and $1 \leq x \leq 2N$.

In some possible implementations of the disclosure, a cascade output terminal of an $A^{th}$ shift register unit is coupled to a reset signal terminal of an $A-N-B^{th}$ shift register unit and an input signal terminal of an $A+N^{th}$ shift register unit respectively; A is a positive integer, B is an integer and $0 \leq B \leq N$.

In some possible implementations of the disclosure, $K \geq 2$, and a clock cycle of the first clock signal is greater than a clock cycle of the second clock signal.

In some possible implementations of the disclosure, the array substrate further includes 4 cascade clock signal lines and 2K drive clock signal lines.

An active level of a first clock signal transmitted on a $1^{st}$ cascade clock signal line among the 4 cascade clock signal lines corresponds to an active level of a first part of a second clock signal transmitted on a $1^{st}$ drive clock signal line among the 2K drive clock signal lines, an active level of a first clock signal transmitted on a 3rd cascade clock signal line among the 4 cascade clock signal lines corresponds to an active level of a second part of the second clock signal transmitted on the $1^{st}$ drive clock signal line, and the active level of the first part and the active level of the second part appear alternately.

An active level of a first clock signal transmitted on a $2^{nd}$ cascade clock signal line among the 4 cascade clock signal lines corresponds to an active level of a third part of a second clock signal transmitted on a $K+1^{th}$ drive clock signal line among the 2K drive clock signal lines, an active level of a first clock signal transmitted on a $4^{th}$ cascade clock signal line among the 4 cascade clock signal lines corresponds to an active level of a fourth part of the second clock signal transmitted on the $K+1^{th}$ drive clock signal line, and the active level of the third part and the active level of the fourth part appear alternately.

In some possible implementations of the disclosure, the clock cycle of the first clock signal is K times the clock cycle of the second clock signal.

In one clock cycle of the first clock signal, a duration of the active level accounts for no more than ½ of the clock cycle of the first clock signal.

A duration of an active level of the third clock signal is same as a duration of an active level of the first clock signal.

In some possible implementations of the disclosure, K=4, and the array substrate further includes 5 cascade clock signal lines and 10 drive clock signal lines.

A first clock signal transmitted on a $1^{st}$ cascade clock signal line among the 5 cascade clock signal lines is same as a second clock signal transmitted on a $1^{st}$ drive clock signal line among the 10 drive clock signal lines.

A first clock signal transmitted on a $2^{nd}$ cascade clock signal line among the 5 cascade clock signal lines is same as a second clock signal transmitted on a $5^{th}$ drive clock signal line among the 10 drive clock signal lines.

A first clock signal transmitted on a $3^{rd}$ cascade clock signal line among the 5 cascade clock signal lines is same as a second clock signal transmitted on a $9^{th}$ drive clock signal line among the 10 drive clock signal lines.

A first clock signal transmitted on a $4^{th}$ cascade clock signal line among the 5 cascade clock signal lines is same as a second clock signal transmitted on a $3^{rd}$ drive clock signal line among the 10 drive clock signal lines.

A first clock signal transmitted on a $5^{th}$ cascade clock signal line among the 5 cascade clock signal lines is same as a second clock signal transmitted on a $7^{th}$ drive clock signal line among the 10 drive clock signal lines.

In some possible implementations of the disclosure, in one clock cycle of the first clock signal, a duration of the active level accounts for no more than ⅖ of the clock cycle of the first clock signal.

In one clock cycle of the second clock signal, a duration of the active level accounts for no more than ⅖ of the clock cycle of the second clock signal.

In some possible implementations of the disclosure, K=4, and the array substrate further includes 3 cascade clock signal lines and 12 drive clock signal lines.

A first clock signal transmitted on a $1^{st}$ cascade clock signal line among the 3 cascade clock signal lines is same as a second clock signal transmitted on a $1^{st}$ drive clock signal line among the 12 drive clock signal lines.

A first clock signal transmitted on a $2^{nd}$ cascade clock signal line among the 3 cascade clock signal lines is same as a second clock signal transmitted on a $5^{th}$ drive clock signal line among the 12 drive clock signal lines.

A first clock signal transmitted on a $3^{rd}$ cascade clock signal line among the 3 cascade clock signal lines is same as a second clock signal transmitted on a $9^{th}$ drive clock signal line among the 12 drive clock signal lines.

In some possible implementations of the disclosure, in one clock cycle of the first clock signal, a duration of the active level accounts for no more than ⅓ of the clock cycle of the first clock signal.

In one clock cycle of the second clock signal, a duration of the active level accounts for no more than ⅓ of the clock cycle of the second clock signal.

In some possible implementations of the disclosure, a cascade output terminal of a $D^{th}$ shift register unit is coupled to a reset signal terminal of a $D-2^{th}$ shift register unit and an input signal terminal of a $D+1^{th}$ shift register unit respectively, and D is a positive integer.

In some possible implementations of the disclosure, K=2, the array substrate further includes F cascade clock signal lines and 2F drive clock signal lines, and F is an integer greater than 2.

A first clock signal transmitted on an $f^{th}$ cascade clock signal line among the F cascade clock signal lines is same as a second clock signal transmitted on a $2f-1^{th}$ drive clock signal line among the 2F drive clock signal lines; where f is an integer and $1 \leq f \leq F$.

In some possible implementations of the disclosure, a cascade output terminal of a $C^{th}$ shift register unit is coupled to a reset signal terminal of a $C-Y-1^{th}$ shift register unit and an input signal terminal of a $C+Y^{th}$ shift register unit respectively, C is a positive integer, and Y is an integer part of F/2.

Embodiments of the disclosure further provide a driving method for the above-mentioned array substrate. The array substrate includes: a gate drive circuit including a plurality of shift register units in cascade.

The driving method includes:

in a first driving mode, loading a first clock signal with an active level and an inactive level alternating periodically to a cascade clock signal terminal of the shift register unit so that a cascade output terminal of the shift register unit outputs a cascade signal, and loading a second clock signal with an active level and an inactive level alternating periodically to any one of K drive clock signal terminals of the shift register unit so that a $k^{th}$ drive output terminal of the shift register unit corresponding to a $k^{th}$ drive clock signal terminal among the K drive clock signal terminals outputs a gate turn-on signal; where K is a positive integer, k is an integer and $1 \leq k \leq K$; and in a second driving mode, loading the first clock signal to the cascade clock signal terminal so that the cascade output terminal of the shift register unit outputs a cascade signal, and loading a third clock signal with an active level appearing within a target time period to a target drive clock signal terminal among the K drive clock signal terminals so that a target drive output terminal corresponding to the target drive clock signal terminal outputs a gate turn-on signal.

In some possible implementations of the disclosure, in one clock cycle of the first clock signal, a duration of the active level accounts for no more than 1¼K of the clock cycle of the first clock signal.

In some possible implementations of the disclosure, the clock cycle of the first clock signal is 4K*H, the duration of the active level is no more than 4(K−1)*H, and H represents a charging duration of a row of sub-pixels.

In some possible implementations of the disclosure, in one clock cycle of the second clock signal, a duration of the active level accounts for no more than (2K+1)/3K of the clock cycle of the second clock signal.

In some possible implementations of the disclosure, the clock cycle of the second clock signal is 3K*H, the duration of the active level is no more than (2K+1)*H, and H represents a charging duration of a row of sub-pixels.

In some possible implementations of the disclosure, the third clock signal is a clock signal with an active level and an inactive level alternately appearing in clock periodicity. In one clock cycle of the third clock signal, a duration of the active level accounts for no more than (2K+1)/3K of the clock cycle of the third clock signal.

In some possible implementations of the disclosure, the clock cycle of the third clock signal is 3K*H, the duration of the active level is no more than (2K+1)*H, and H represents a charging duration of a row of sub-pixels.

Embodiments of the disclosure further provide a display device, including the above-mentioned array substrate.

DETAILED DESCRIPTION

In order to make the purposes, technical solutions and advantages of the disclosure clearer, the technical solutions of the embodiments of the disclosure will be described clearly and completely below in combination with the accompanying drawings of the embodiments of the disclosure. Obviously the described embodiments are a part of the embodiments of the disclosure but not all the embodiments. Also in the case of no conflict, the embodiments and the features therein in the disclosure can be combined with each other. Based upon the embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, quantity or importance, and are only used to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect.

It is necessary to note that the size and shape of each diagram in the accompanying drawings do not reflect the true proportion, and are merely for purpose of schematically illustrating the content of the invention. Also, the same or similar reference numbers represent the same or similar elements or the elements having the same or similar functions all the way.

In embodiments of the disclosure, the display device may be a liquid crystal display device or an organic electroluminescence display device. Exemplarily, the organic electroluminescent display device may include but not limited to: an Organic Light Emitting Diode (OLED) display device or a Quantum Dot Light Emitting Diode (QLED) display device. The following description takes the display device as a liquid crystal display device as an example.

Figure 1:
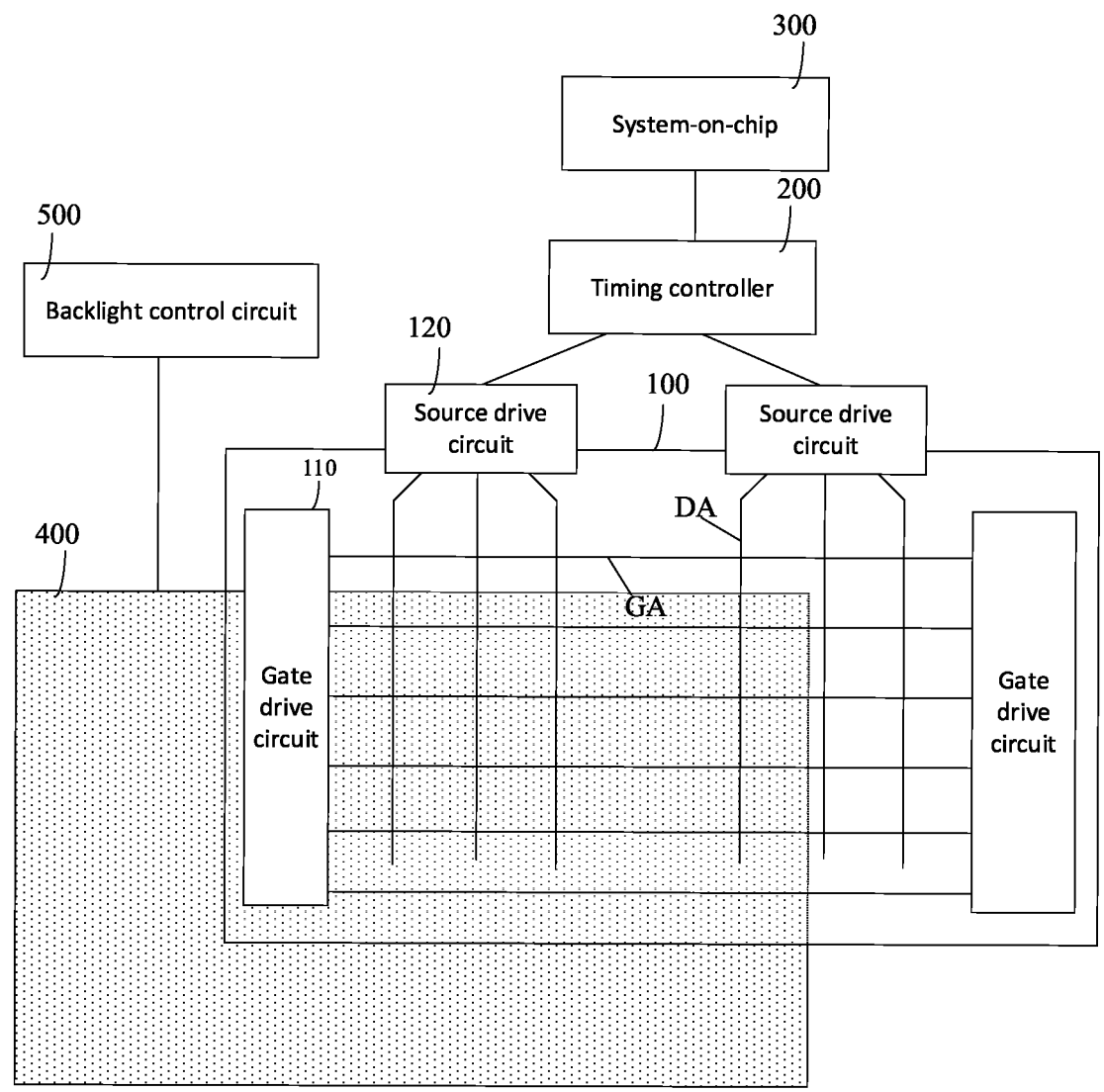
FIG. 1 is a schematic structural diagram of some display devices according to an embodiment of the disclosure.
Figure 2:
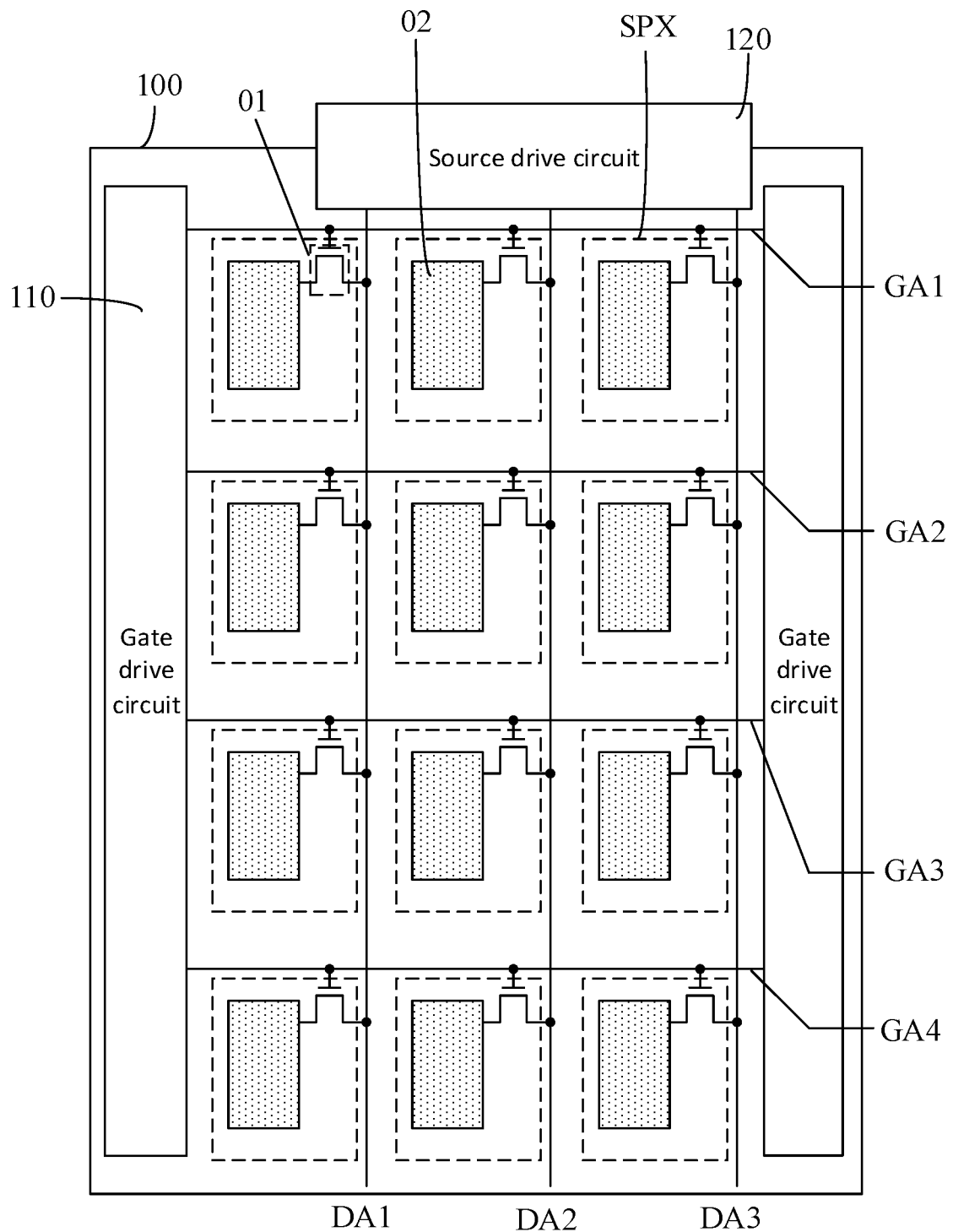
FIG. 2 is a schematic structural diagram of some array substrates according to an embodiment of the disclosure.

Referring to FIGS. 1 and 2, the display device may include: a display panel 100, a timing controller 200, a system-on-chip 300, a backlight module 400 and a backlight control circuit 500. Here, the display panel 100 may include an array substrate. The array substrate includes: a plurality of pixel units arranged in an array, a plurality of gate lines GA (for example, GA1, GA2, GA3, GA4), a plurality of data lines DA (for example, DA1, DA2, DA3), a gate drive circuit 110 and a source drive circuit 120. The gate drive circuit 110 is coupled to the gate lines GA1, GA2, GA3 and GA4 respectively, and the source drive circuit 120 is coupled to the data lines DA1, DA2 and DA3 respectively. Here, the backlight control circuit 500 may generate a Pulse Width Modulation (PWM) signal to control the luminous brightness of the backlight module 400 through the PWM signal, thereby providing a light source for the display panel. The system-on-chip 300 may receive the display data of an image to be displayed, and then render the display data. After the system-on-chip 300 completes rendering of the display data of the image to be displayed, the system-on-chip 300 sends the rendered display data to the timing controller 200. The timing controller 200 may input a control signal to the gate drive circuit 110 through a level shift circuit, so that the gate drive circuit 110 outputs signals to the gate lines GA1, GA2, GA3 and GA4, so as to drive the gate lines GA1, GA2, GA3 and GA4. The timing controller 200 inputs the display data to the source drive circuit 120, so that the source drive circuit 120 inputs a data voltage to the data line according to the display data, thereby charging the sub-pixel SPX, and making the sub-pixel SPX input a corresponding data voltage to achieve the picture display function.

Exemplarily, two source drive circuits 120 may be provided, where one source drive circuit 120 may be connected to one half of the data lines, and the other source drive circuit 120 may be connected to the other half of the data lines. Of course, in practical applications, three, four or more source drive circuits 120 may also be provided, which may be determined according to the requirements of the actual application environment, and is not limited in the disclosure.

Exemplarily, each pixel unit includes a plurality of sub-pixels SPX. For example, the pixel unit may include a red sub-pixel, a green sub-pixel and a blue sub-pixel, so that the red, green and blue colors can be mixed to realize the color display. Alternatively, the pixel unit may also include a red sub-pixel, a green sub-pixel, a blue sub-pixel and a white sub-pixel, so that the red, green, blue and white colors can be mixed to realize the color display. Of course, in practical applications, the light-emitting colors of the sub-pixels in the pixel unit may be designed and determined according to the actual application environment, which is not limited here.

As shown in FIG. 2, each sub-pixel SPX includes a transistor 01 and a pixel electrode 02. Here, one row of sub-pixels SPX may correspond to one gate line, and one column of sub-pixels SPX may correspond to one data line. Exemplarily, the gate of the transistor 01 is electrically connected to the corresponding gate line, the source of the transistor 01 is electrically connected to the corresponding data line, and the drain of the transistor 01 is electrically connected to the pixel electrode 02, so that the pixel array structure is a single gate structure.

It should be noted that the pixel array structure of the disclosure may also be a double-gate structure, that is, two gate lines are provided between two adjacent rows of sub-pixels. This arrangement can reduce the number of data lines by half, that is, there is a data line between some adjacent columns of pixels, and there is no data line between some adjacent columns of pixels. The disclosure limits neither the specific arrangement structure of pixels nor the arrangement of data lines and scan lines.

Exemplarily, the display panel in the liquid crystal display device may include an array substrate and an opposite substrate arranged oppositely, and liquid crystal molecules encapsulated between the array substrate and the opposite substrate. When a picture is displayed, due to the voltage difference between the data voltage loaded on the pixel electrode of each sub-pixel SPX and the common electrode voltage on the common electrode, this voltage difference may form an electric field, so that the liquid crystal molecules are deflected under the action of the electric field. Since the electric fields with different strengths cause different deflection degrees of the liquid crystal molecules, the sub-pixels SPX have different transmittances, so that the sub-pixels SPX achieve brightness of different grayscales, thereby achieving the picture display.

In some examples, the gate drive circuit may include a plurality of shift register units in cascade. Exemplarily, the drive output terminal of one shift register unit may be coupled to at least one gate line, to output a gate turn-on signal to the coupled gate line through the shift register unit, thereby controlling the transistor 01 coupled to the gate line to turn on or off through the gate turn-on signal, to make the sub-pixel be charged or maintain voltage.

Figure 3:
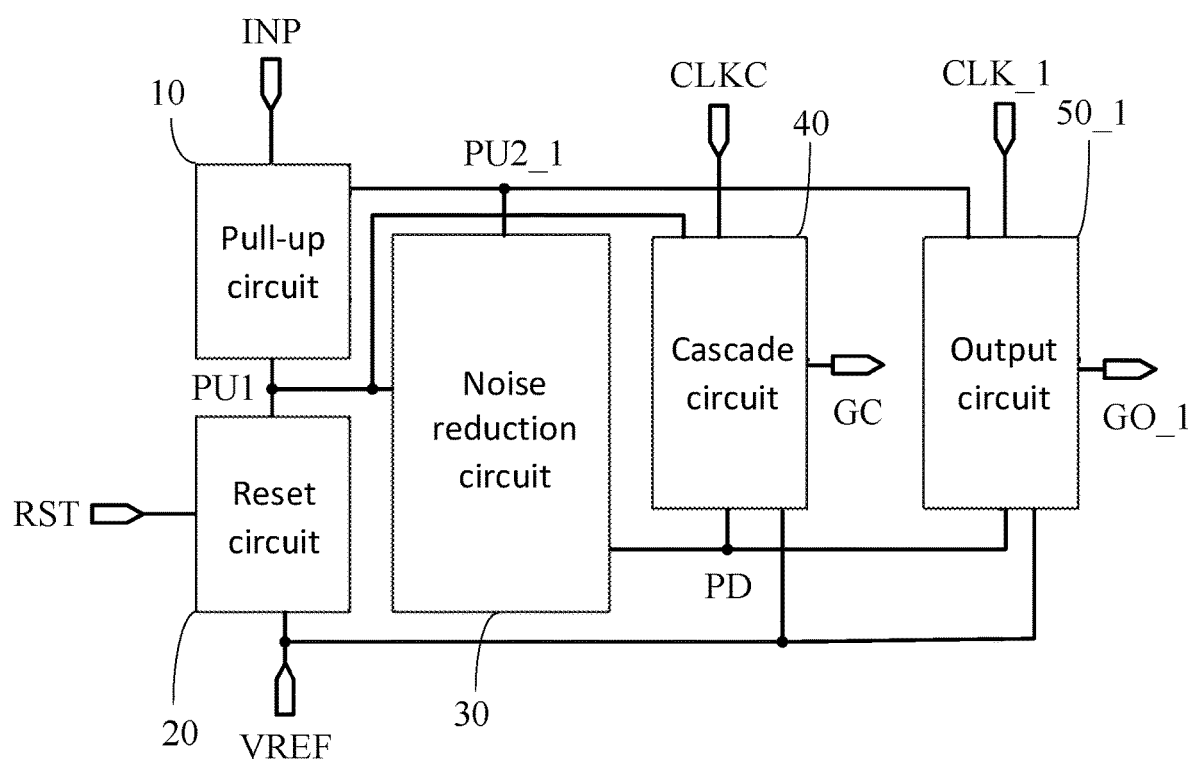
FIG. 3 is a schematic structural diagram of some shift register units according to an embodiment of the disclosure.

In embodiments of the disclosure, as shown in FIG. 3, the shift register unit may include: a pull-up circuit 10 configured to provide the signal of the input signal terminal INP to the first pull-up node PU1 and K second pull-up nodes (PU2_1 to PU2_K, where K=1 as an example in FIG. 3) in response to the signal of the input signal terminal INP; where K is an integer greater than 0;
  a reset circuit 20 configured to provide the signal of the reference voltage signal terminal VREF to the first pull-up node PU1 in response to the signal of the reset signal terminal RST;
  a noise reduction circuit 30 configured to control the signal of the pull-down node PD according to the signal of the first pull-up node PU1, and control signals of the first pull-up node and K second pull-up nodes (PU2_1 to PU2_K) according to the signal of the pull-down node PD;
  a cascade circuit 40 configured to provide the signal of the cascade clock signal terminal CLKC to the cascade output terminal GC in response to the signal of the first pull-up node PU1, and provide the signal of the reference voltage signal terminal VREF to the cascade output terminal GC in response to the signal of the pull-down node PD; and
  K output circuits 50_k, where the $k^{th}$ output circuit 50_k among the K output circuits (50_1 to 50_K) is coupled to the $k^{th}$ second pull-up node PU2_k among K second pull-up nodes (PU2_1 to PU2_K) and the $k^{th}$ drive clock signal terminal CLK_k among K drive clock signal terminals (CLK_1 to CLK_K) respectively, and the $k^{th}$ output circuit 50_$k$ is configured to provide the signal of the $k^{th}$ drive clock signal terminal CLK_k to the $k^{th}$ drive output terminal GO_k in response to the signal of the $k^{th}$ second pull-up node PU2_$k$, and provide the signal of the reference voltage signal terminal VREF to the $k^{th}$ drive output terminal GO_k in response to the signal of the pull-down node PD; where k is an integer and 1≤k≤K.

Figure 4:
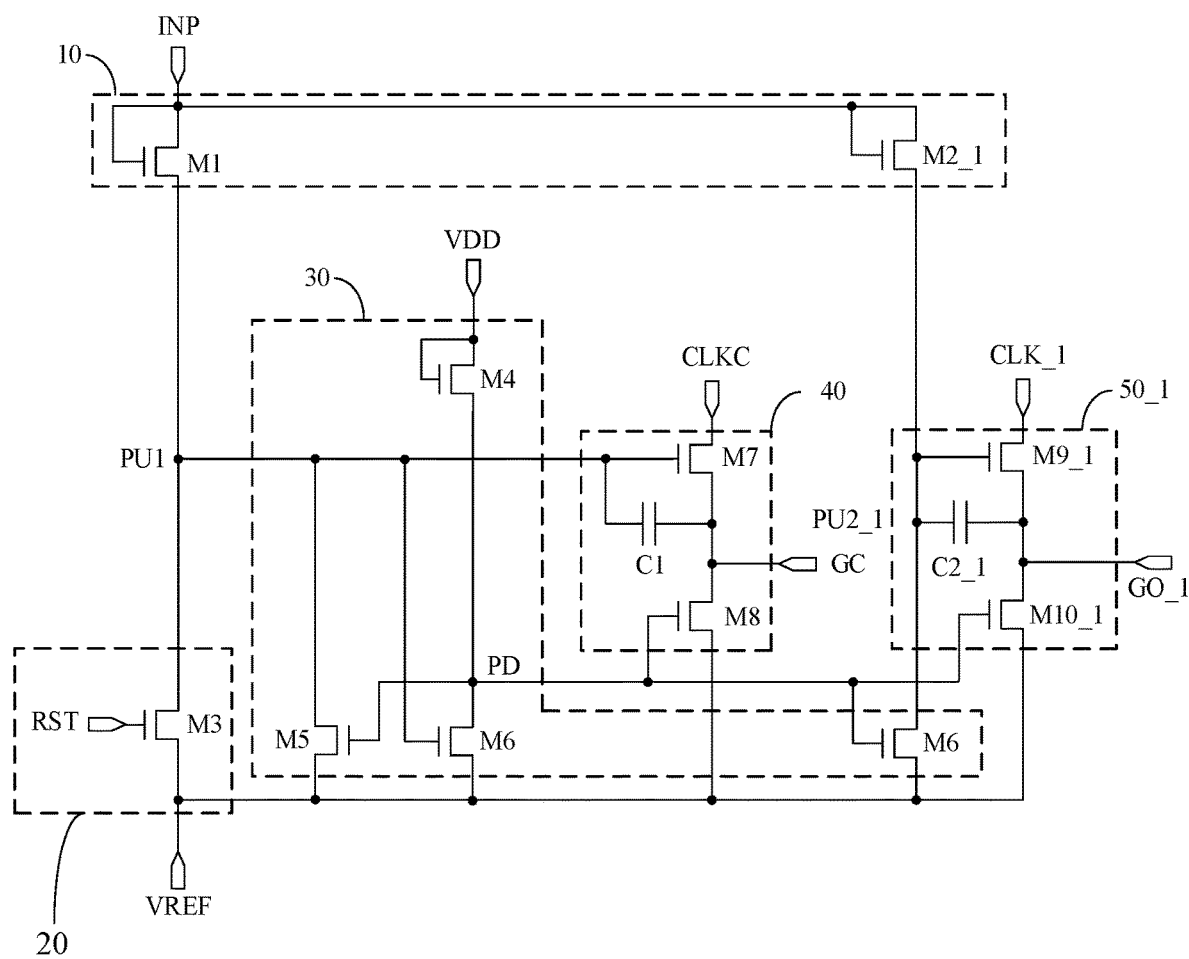
FIG. 4 is a schematic diagram of specific structures of some shift register units according to an embodiment of the disclosure.

In some embodiments of the disclosure, as shown in FIG. 4, the pull-up circuit 10 includes a first transistor M1 and K second transistors M2_1 to M2_K. Here, the K second transistors M2_1 to M2_K correspond to the K output circuits 50_1 to 50_K one by one, that is, the $k^{th}$ second transistor among the K second transistors M2_1 to M2_K corresponds to the $k^{th}$ output circuit 50_$k$ among the K output circuits 50_1 to 50_K.

Exemplarily, as shown in FIG. 4, the gate electrode and the first electrode of the first transistor M1 are both coupled to the input signal terminal INP, and the second electrode of the first transistor M1 is coupled to the first pull-up node PU1. Optionally, the first transistor M1 is turned on under the control of the active level of the signal of the input signal terminal INP, and is turned off under the control of the inactive level of the signal of the input signal terminal INP. For example, the first transistor M1 may be set as an N-type transistor, and then the active level is high level and the inactive level is low level for the signal of the input signal terminal INP. Alternatively, the first transistor M1 may also be set as a P-type transistor, and then the active level is low level and the inactive level is high level for the signal of the input signal terminal INP.

Exemplarily, as shown in FIG. 4, the gate electrode and the first electrode of the $1^{st}$ second transistor M2_1 are both coupled to the input signal terminal INP, and the second electrode of the $1^{st}$ second transistor M2_1 is coupled to the $1^{st}$ second pull-up node PU2_1. Optionally, the $1^{st}$ second transistor M2_1 is turned on under the control of the active level of the signal of the input signal terminal INP, and is turned off under the control of the inactive level of the signal of the input signal terminal INP. For example, the $1^{st}$ second transistor M2_1 may be set as an N-type transistor, and then the active level is high level and the inactive level is low level for the signal of the input signal terminal INP. Alternatively, the $1^{st}$ second transistor M2_1 may also be set as a P-type transistor, and then the active level is low level and the inactive level is high level for the signal of the input signal terminal INP.

In some embodiments of the disclosure, as shown in FIG. 4, the reset circuit 20 may include: a third transistor M3. Here, the gate electrode of the third transistor M3 is coupled to the reset signal terminal RST, the first electrode of the third transistor M3 is coupled to the reference voltage signal terminal VREF, and the second electrode of the third transistor M3 is coupled to the first pull-up node PU1.

Optionally, as shown in FIG. 4, the third transistor M3 is turned on under the control of the active level of the signal of the reset signal terminal RST, and is turned off under the control of the inactive level of the signal of the reset signal terminal RST. For example, the third transistor M3 may be set as an N-type transistor, and then the active level is high level and the inactive level is low level for the signal of the reset signal terminal RST. Alternatively, the third transistor M3 may also be set as a P-type transistor, and then the active level is low level and the inactive level is high level for the signal of the reset signal terminal RST.

In some embodiments of the disclosure, as shown in FIG. 4, the noise reduction circuit 30 may include: a fourth transistor M4, a fifth transistor M5 and a sixth transistor M6. Here, the gate electrode and the first electrode of the fourth transistor M4 are both coupled to the noise reduction signal terminal VDD, and the second electrode of the fourth transistor M4 is coupled to the pull-down node PD. The gate electrode of the fifth transistor M5 is coupled to the pull-down node PD, the first electrode of the fifth transistor M5 is coupled to the reference voltage signal terminal VREF, and the second electrode of the fifth transistor M5 is coupled to the first pull-up node PU1. The gate electrode of the sixth transistor M6 is coupled to the first pull-up node PU1, the first electrode of the sixth transistor M6 is coupled to the reference voltage signal terminal VREF, and the second electrode of the sixth transistor M6 is coupled to the pull-down node PD.

Optionally, as shown in FIG. 4, the fourth transistor M4 is turned on under the control of the active level of the signal of the noise reduction signal terminal VDD, and is turned off under the control of the inactive level of the signal of the noise reduction signal terminal VDD. For example, the fourth transistor M4 may be set as an N-type transistor, and then the active level is high level and the inactive level is low level for the signal of the noise reduction signal terminal VDD. Alternatively, the fourth transistor M4 may also be set as a P-type transistor, and then the active level is low level and the inactive level is high level for the signal of the noise reduction signal terminal VDD.

Optionally, as shown in FIG. 4, the fifth transistor M5 is turned on under the control of the active level of the signal of the pull-down node PD, and is turned off under the control of the inactive level of the signal of the pull-down node PD. For example, the fifth transistor M5 may be set as an N-type transistor, and then the active level is high level and the inactive level is low level for the signal of the pull-down node PD. Alternatively, the fifth transistor M5 may also be set as a P-type transistor, and then the active level is low level and the inactive level is high level for the signal of the pull-down node PD.

Optionally, as shown in FIG. 4, the sixth transistor M6 is turned on under the control of the active level of the signal of the first pull-up node PU1, and is turned off under the control of the inactive level of the signal of the first pull-up node PU1. For example, the sixth transistor M6 may be set as an N-type transistor, and then the active level is high level and the inactive level is low level for the signal of the first pull-up node PU1. Alternatively, the sixth transistor M6 may also be set as a P-type transistor, and then the active level is low level and the inactive level is high level for the signal of the first pull-up node PU1.

In some embodiments of the disclosure, as shown in FIG. 4, the cascade circuit 40 may include: a seventh transistor M7, an eighth transistor M8 and a first capacitor C1. Here, the gate electrode of the seventh transistor M7 is coupled to the first pull-up node PU1, the first electrode of the seventh transistor M7 is coupled to the cascade clock signal terminal CLKC, and the second electrode of the seventh transistor M7 is coupled to the cascade output terminal GC. The gate electrode of the eighth transistor M8 is coupled to the pull-down node PD, the first electrode of the eighth transistor M8 is coupled to the reference voltage signal terminal VREF, and the second electrode of the eighth transistor M8 is coupled to the cascade output terminal GC. The first capacitor C1 is coupled between the first pull-up node PU1 and the cascade output terminal GC.

Optionally, as shown in FIG. 4, the seventh transistor M7 is turned on under the control of the active level of the signal of the first pull-up node PU1, and is turned off under the control of the inactive level of the signal of the first pull-up node PU1. For example, the seventh transistor M7 may be set as an N-type transistor, and then the active level is high level and the inactive level is low level for the signal of the first pull-up node PU1. Alternatively, the seventh transistor M7 may also be set as a P-type transistor, and then the active level is low level and the inactive level is high level for the signal of the first pull-up node PU1.

Optionally, as shown in FIG. 4, the eighth transistor M8 is turned on under the control of the active level of the signal of the pull-down node PD, and is turned off under the control of the inactive level of the signal of the pull-down node PD. For example, the eighth transistor M8 may be set as an N-type transistor, and then the active level is high level and the inactive level is low level for the signal of the pull-down node PD. Alternatively, the eighth transistor M8 may also be set as a P-type transistor, and then the active level is low level and the inactive level is high level for the signal of the pull-down node PD.

In some embodiments of the disclosure, as shown in FIG. 4, the $1^{st}$ output circuit 50_1 may include: a $1^{st}$ ninth transistor M9_1, a $1^{st}$ tenth transistor M10_1, and a $1^{st}$ second capacitor C2_1. Here, the gate electrode of the $1^{st}$ ninth transistor M9_1 is coupled to the $1^{st}$ second pull-up node PU2_1, the first electrode of the $1^{st}$ ninth transistor M9_1 is coupled to the $1^{st}$ drive clock signal terminal CLK_1, and the second electrode of the $1^{st}$ ninth transistor M9_1 is coupled to the $1^{st}$ drive output terminal GO_1. The gate electrode of the $1^{st}$ tenth transistor M10_1 is coupled to the pull-down node PD, the first electrode of the $1^{st}$ tenth transistor M10_1 is coupled to the reference voltage signal terminal VREF, and the second electrode of the $1^{st}$ tenth transistor M10_1 is coupled to the $1^{st}$ drive output terminal GO_1. The $1^{st}$ second capacitor C2_1 is coupled between the $1^{st}$ second pull-up node PU2_1 and the $1^{st}$ drive output terminal GO_1.

Optionally, as shown in FIG. 4, the $1^{st}$ ninth transistor M9_1 is turned on under the control of the active level of the signal of the $1^{st}$ second pull-up node PU2_1, and is turned off under the control of the inactive level of the signal of the $1^{st}$ second pull-up node PU2_1. For example, the $1^{st}$ ninth transistor M9_1 may be set as an N-type transistor, and then the active level is high level and the inactive level is low level for the signal of the $1^{st}$ second pull-up node PU2_1. Alternatively, the $1^{st}$ ninth transistor M9_1 may also be set as a P-type transistor, and then the active level is low level and the inactive level is high level for the signal of the $1^{st}$ second pull-up node PU2_1.

Optionally, as shown in FIG. 4, the $1^{st}$ tenth transistor M10_1 is turned on under the control of the active level of the signal of the pull-down node PD, and is turned off under the control of the inactive level of the signal of the pull-down node PD. For example, the $1^{st}$ tenth transistor M10_1 may be set as an N-type transistor, and then the active level is high level and the inactive level is low level for the signal of the pull-down node PD. Alternatively, the $1^{st}$ tenth transistor M10_1 may also be set as a P-type transistor, and then the active level is low level and the inactive level is high level for the signal of the pull-down node PD.

The above is just an example to illustrate the specific structure of the shift register unit provided by the embodiments of the disclosure. In implementations, the specific structures of the above-mentioned circuits are not limited to the above-mentioned structures provided by the embodiments of the disclosure, and may also be other structures known to those skilled in the art, which are not limited here.

In some embodiments of the disclosure, the active levels of the cascade clock signal terminal CLKC and each drive clock signal terminal are high level, and then the level of the signal of the reference voltage signal terminal VREF is low level, and the level of the signal of the noise reduction signal terminal VDD is high level. Alternatively, the active levels of the cascade clock signal terminal CLKC and each drive clock signal terminal are low level, and then the level of the signal of the reference voltage signal terminal VREF is high level, and the level of the signal of the noise reduction signal terminal VDD is low level. The following description takes the active level of each signal terminal as high level as an example.

In some embodiments of the disclosure, the array substrate further includes 2N cascade clock signal lines and 2N drive clock signal lines. Here, the cascade clock signal terminal CLKC of the 2Na–b$^{th}$ shift register unit among the plurality of shift register units in the gate drive circuit is coupled to the 2N–b$^{th}$ cascade clock signal line among the 2N cascade clock signal lines. Further, the drive clock signal terminal of the 2Na–b$^{th}$ shift register unit among the plurality of shift register units is coupled to the 2N–b$^{th}$ drive clock signal line among the 2N drive clock signal lines. Here, N is an integer greater than 0, a is a positive integer, b is an integer and 0≤b≤2N−1.

In some embodiments of the disclosure, based on the structure of the shift register units described above, the cascade relationship of the shift register units in the gate drive circuit includes but is not limited to: the input signal terminal INP of the first shift register unit is coupled to the frame start signal terminal, and the cascade output terminal GC of the A$^{th}$ shift register unit is coupled to the reset signal terminal RST of the A−N−B$^{th}$ shift register unit and the input signal terminal INP of the A+N$^{th}$ shift register unit respectively; where A is a positive integer, B is an integer and 0≤B≤N.

Figure 5:
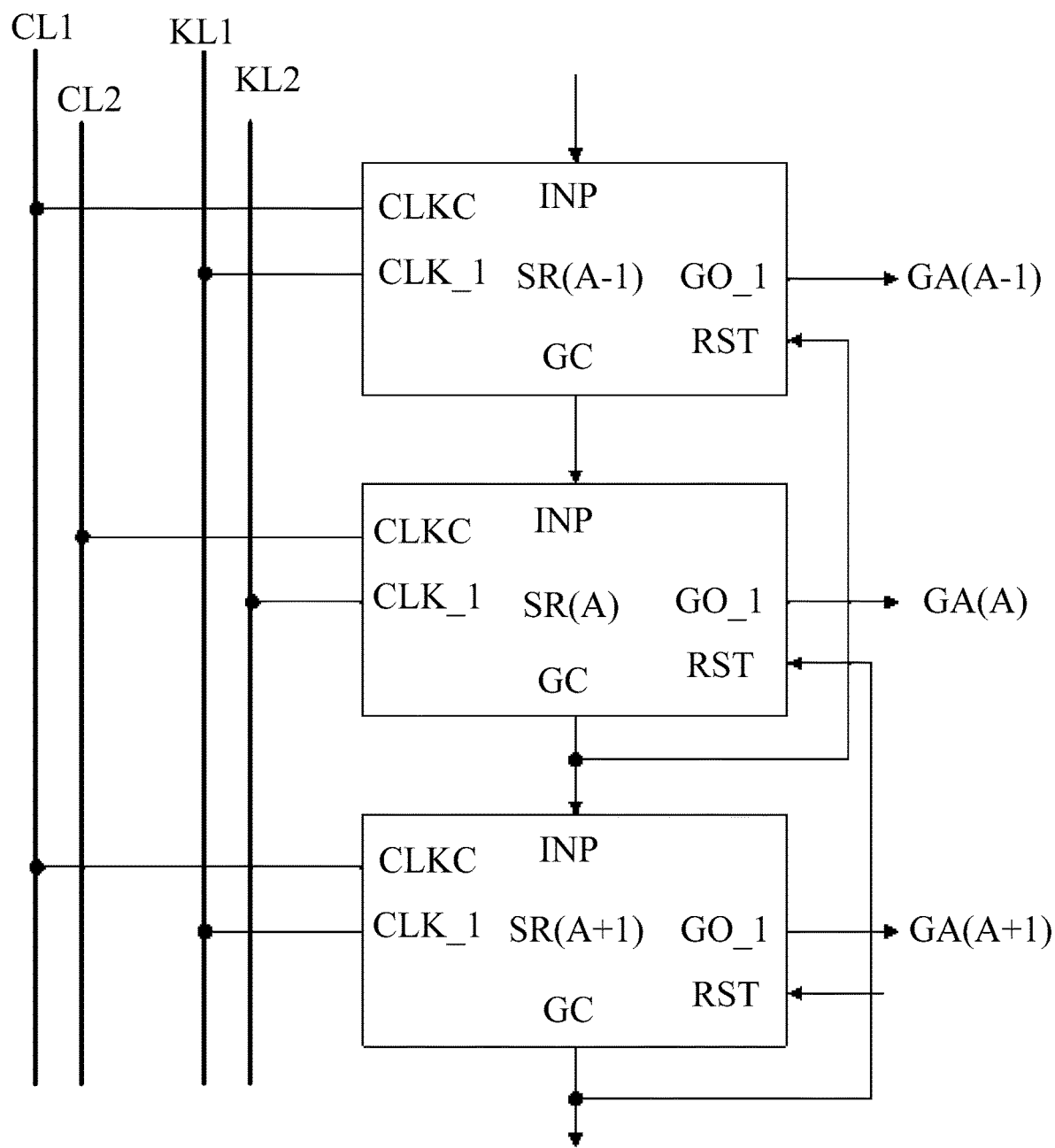
FIG. 5 is a schematic structural diagram of some gate drive circuits according to an embodiment of the disclosure.

The specific numerical values of N and B are not limited in the embodiments of the disclosure. Exemplarily, as shown in FIG. 5, N=1, B=0, b=0 or 1, then the array substrate includes two cascade clock signal lines (such as the $1^{st}$ cascade clock signal line CL1 and the $2^{nd}$ cascade clock signal lines CL2) and two drive clock signal lines (such as the $1^{st}$ drive clock signal line KL1 and the $2^{nd}$ drive clock signal line KL2). Here, the cascade clock signal terminal CLKC of the 2a$^{th}$ shift register unit is coupled to the $2^{nd}$ cascade clock signal line CL2, and the cascade clock signal terminal CLKC of the 2a−1$^{th}$ shift register unit is coupled to the $1^{st}$ cascade clock signal line CL1. The drive clock signal terminal CLK_1 of the 2a$^{th}$ shift register unit is coupled to the $2^{nd}$ drive clock signal line KL2, the drive clock signal terminal CLK_1 of the 2a−1$^{th}$ shift register unit is coupled to the $1^{st}$ drive clock signal line KL1. The cascade output terminal GC of the A$^{th}$ shift register unit SR(A) is coupled to the reset signal terminal RST of the A−1$^{th}$ shift register unit SR(A−1) and the input signal terminal INP of the A+1$^{th}$ shift register unit SR(A+1) respectively.

In some embodiments of the disclosure, any shift register unit among the plurality of shift register units is configured to: in a first driving mode, load a first clock signal with an active level and an inactive level alternating periodically to a cascade clock signal terminal CLKC of the shift register unit so that a cascade output terminal GC of the shift register unit outputs a cascade signal, and load a second clock signal with an active level and an inactive level alternating periodically to any one of K drive clock signal terminals of the shift register unit so that a $k^{th}$ drive output terminal GO_k of the shift register unit corresponding to a $k^{th}$ drive clock signal terminal CLK_k among the K drive clock signal terminals outputs a gate turn-on signal; where K is a positive integer, k is an integer and 1≤k≤K.

Exemplarily, taking K=1 as an example, in the first driving mode, the first clock signal with an active level and an inactive level alternating periodically is loaded to the cascade clock signal terminal CLKC of the shift register unit so that the cascade output terminal GC of the shift register unit outputs a cascade signal, and the second clock signal with an active level and an inactive level alternating periodically is loaded to the $1^{st}$ drive clock signal terminal CLK_1 of the shift register unit so that the $1^{st}$ drive output terminal GO_1 outputs a gate turn-on signal.

Exemplarily, one drive output terminal is coupled to one gate line. Taking K=1 as an example, one shift register unit corresponds to one gate line, and the drive output terminal of the shift register unit is coupled to the corresponding gate line. Then the drive output terminal inputs a corresponding signal to the coupled gate line, to control the transistor in the sub-pixel connected to the gate line to turn on or off. Exemplarily, as shown in FIG. 5, the $1^{st}$ drive output terminal GO_1 of the A–$1^{th}$ shift register unit SR(A–1) is coupled to the gate line GA(A–1), the $1^{st}$ drive output terminal GO_1 of the $A^{th}$ shift register unit SR(A) is coupled to the gate line GA(A), and the $1^{st}$ drive output terminal GO_1 of the A+$1^{th}$ shift register unit SR(A+1) is coupled to the gate line GA(A+1).

Exemplarily, the first clock signal and the second clock signal input to the same shift register unit may be the same. That is to say, the first clock signal and the second clock signal input to the same shift register unit have the same cycle, and the proportion of the duration of the active level of the first clock signal in the clock cycle of the first clock signal is the same as the proportion of the duration of the active level of the second clock signal in the clock cycle of the second clock signal. And, the rising edges and falling edges of the first clock signal and the second clock signal input to the same shift register unit may be aligned.

Exemplarily, as shown in FIG. 5, for the A–$1^{th}$ shift register unit SR(A–1), the first clock signal input to the cascade clock signal terminal CLKC may the same as the second clock signal input to the $1^{st}$ drive clock signal terminal CLK_1.

Exemplarily, as shown in FIG. 5, for the $A^{th}$ shift register unit SR(A), the first clock signal input to the cascade clock signal terminal CLKC may the same as the second clock signal input to the $1^{st}$ drive clock signal terminal CLK_1.

Exemplarily, as shown in FIG. 5, for the A+$1^{th}$ shift register unit SR(A+1), the first clock signal input to the cascade clock signal terminal CLKC may the same as the second clock signal input to the $1^{st}$ drive clock signal terminal CLK_1.

Optionally, in the first clock signal, the duration of the active level accounts for no more than ½ of the clock cycle of the first clock signal; and then, in the second clock signal, the duration of the active level also accounts for no more than ½ of the clock cycle of the second clock signal. Exemplarily, in the first clock signal, the duration of the active level accounts for ½ of the clock cycle of the second clock signal; and then, in the second clock signal, the duration of the active level also accounts for ½ of the clock cycle of the second clock signal.

Exemplarily, the duration of one active level of the second clock signal is the same as the duration of one active level of the first clock signal.

In some embodiments of the disclosure, the first clock signal transmitted on the $x^{th}$ cascade clock signal line among the 2N cascade clock signal lines may be the same as the second clock signal transmitted on the $x^{th}$ drive clock signal line among the 2N drive clock signal lines; where x is an integer and 1≤x≤2N.

Figure 6:
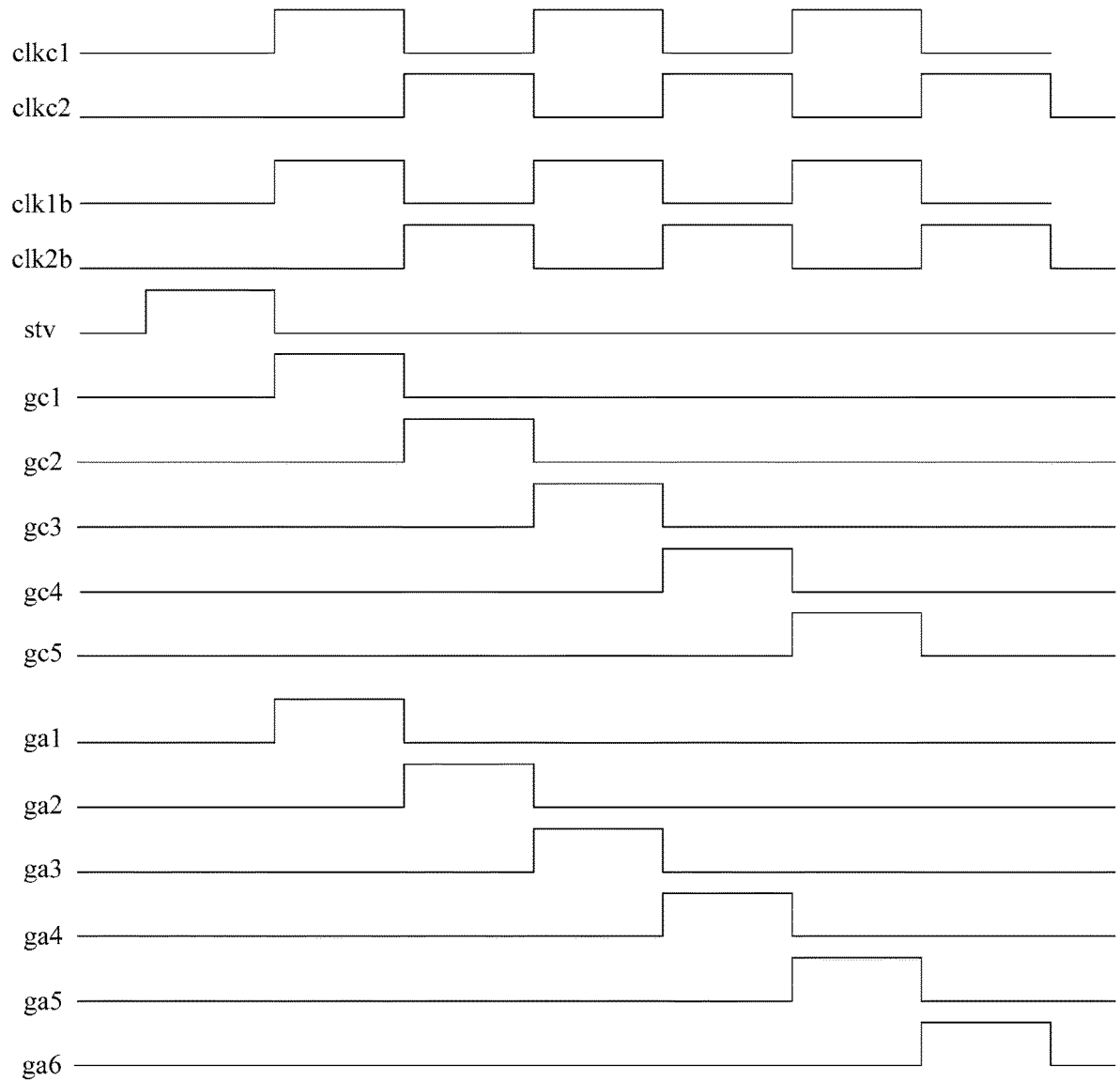
FIG. 6 is a timing diagram of some signals according to an embodiment of the disclosure.
Figure 7:
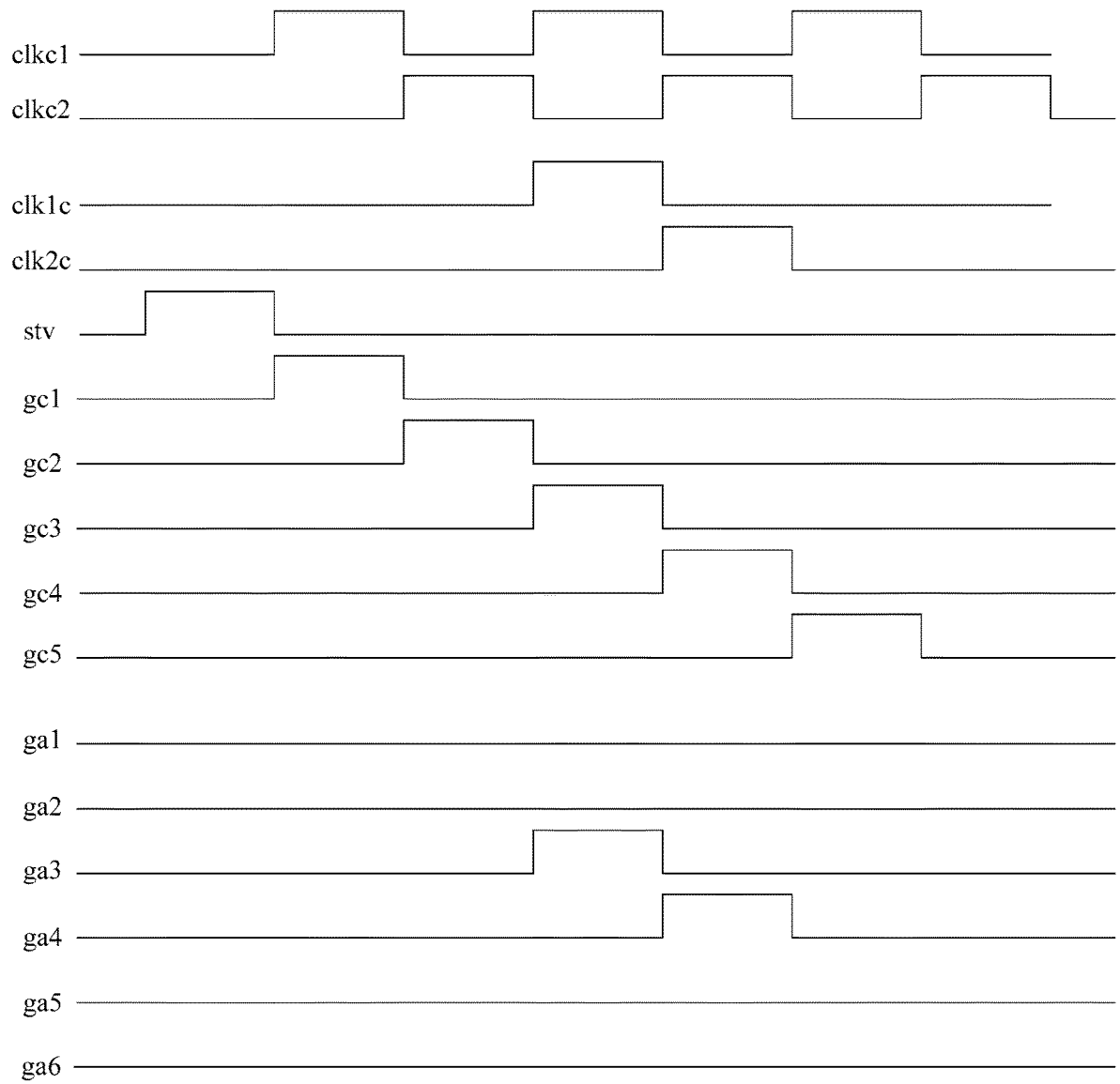
FIG. 7 is a timing diagram of some other signals according to an embodiment of the disclosure.

For example, taking N=1 as an example, as shown in FIG. 6 and FIG. 7, clkc1 represents the first clock signal transmitted on the $1^{st}$ cascade clock signal line CL1, clkc2 represents the first clock signal transmitted on the $2^{nd}$ cascade clock signal line CL2, clk1b represents the second clock signal transmitted on the $1^{st}$ drive clock signal line KL1, and clk2b represents the second clock signal transmitted on the $2^{nd}$ drive clock signal line KL2. Here, the first clock signal clkc1 transmitted on the $1^{st}$ cascade clock signal line CL1 may be the same as the second clock signal clk1b transmitted on the $1^{st}$ drive clock signal line KL1, and the first clock signal clkc2 transmitted on the $2^{nd}$ cascade clock signal line CL2 may be the same as the second clock signal clk2b transmitted on the $2^{nd}$ drive clock signal line KL2.

Exemplarily, in the first driving mode, the first clock signal is input to the cascade clock signal terminal CLKC through the cascade clock signal line, and the second clock signal is input to the drive clock signal terminal through the drive clock signal line. Exemplarily, as shown in FIG. 6, stv represents the signal of the frame start signal terminal, gc1 to gc5 represent the cascade signals output by the cascade output terminals GC of the $1^{st}$ to $5^{th}$ shift register units, and ga1 to ga6 represent signals output by the drive output terminals (i.e., the $1^{st}$ drive output terminals GO_1) of the $1^{st}$ to $6^{th}$ shift register units onto the gate lines GA1 to GA6, where the high level in the signals ga1 to ga6 is the gate turn-on signal, and the low level in the signals ga1 to ga6 is the gate turn-off signal. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, each shift register unit may input the high level of the second clock signal input to the $1^{st}$ drive clock signal terminal CLK_1 to the $1^{st}$ drive output terminal GO_1, as the high-level gate turn-on signal in the signals ga1 to ga6, so as to realize the output process of the gate turn-on signal. Thus the gate drive circuit may output the gate turn-on signal row by row. Therefore, when the display device displays a picture, the timing controller controls the gate drive circuit to output the gate turn-on signal (that is, the high level in the gate turn-on signal) to the pixel area row by row from top to bottom, and the gates of the transistors in the sub-pixel rows are turned on row by row while the source drive circuit outputs the sub-pixel display data and writes it into the corresponding sub-pixel row, so that the sub-pixels in the pixel area refresh the display data row by row. After all rows are refreshed, the refresh of the overall display picture is achieved.

In some embodiments of the disclosure, since the cascade control function can be realized through the cascade circuit and the output function of the gate turn-on signal can be realized through the output circuit in the shift register unit, the cascade control function is separated from the output function of the gate turn-on signal. The gate turn-on signal may be output as needed, and in cooperation with the data voltage output of the source drive circuit, the changed part of the picture may be selectively refreshed, that is, partially refreshed, so as to reduce the operating power consumption of the overall display device under the condition of the unchanged refresh frequency. Exemplarily, the shift register unit coupled to a gate line coupled to a sub-pixel row that needs to refresh display data may be defined as a target shift register unit, so that only the target shift register unit outputs a gate turn-on signal to the coupled gate line, and the remaining shift register units output no signals or output gate turn-off signals, so as to achieve partial refresh.

In some embodiments of the disclosure, the target shift register unit among the plurality of shift register units in the gate drive circuit is configured to: in a second driving mode, load the first clock signal to the cascade clock signal terminal CLKC so that the cascade output terminal GC of the shift register unit outputs a cascade signal, and load a third clock signal with an active level appearing within a target time period to a target drive clock signal terminal among the K drive clock signal terminals so that a target drive output terminal corresponding to the target drive clock signal terminal outputs a gate turn-on signal. The gate turn-off signals with inactive level are loaded to the drive clock signal terminals of other shift register units than the target shift register unit and to other drive clock signal terminals than the target drive clock signal terminal, so that the drive output terminals of these other shift register units output gate turn-off signals.

Exemplarily, taking K=1 as an example, the gate turn-on signals are output to the gate lines GA(3) and GA4(4) as an example, and then the target shift register units include the $3^{rd}$ shift register unit and the $4^{th}$ shift register unit. Then, in the second driving mode, the first clock signal is loaded to the cascade clock signal terminal CLKC, so that the cascade output terminal GC of the shift register unit outputs a cascade signal. Also, the third clock signal with the active level appearing within the target time period is loaded to the target drive clock signal terminal (i.e., the $1^{st}$ drive clock signal terminal CLK_1) of the $3^{rd}$ shift register unit, so that the target drive output terminal (i.e., the $1^{st}$ drive output terminal GO_1) corresponding to the target drive clock signal terminal (i.e., the $1^{st}$ drive clock signal terminal CLK_1) outputs a gate turn-on signal. And, the third clock signal with the active level appearing within the target time period is loaded to the target drive clock signal terminal (i.e., the $1^{st}$ drive clock signal terminal CLK_1) of the $4^{th}$ shift register unit, so that the target drive output terminal (i.e., the $1^{st}$ drive output terminal GO_1) corresponding to the target drive clock signal terminal (i.e., the $1^{st}$ drive clock signal terminal CLK_1) outputs a gate turn-on signal.

For example, as shown in FIG. 7, clkc1 represents the first clock signal transmitted on the $1^{st}$ cascade clock signal line CL1, clkc2 represents the first clock signal transmitted on the $2^{nd}$ cascade clock signal line CL2, clk1c represents the third clock signal transmitted on the $1^{st}$ drive clock signal line KL1, and clk2c represents the third clock signal transmitted on the $2^{nd}$ drive clock signal line KL2. Exemplarily, in the second driving mode, the first clock signal is input to the cascade clock signal terminal CLKC through the cascade clock signal line, and the third clock signal is input to the drive clock signal terminal through the drive clock signal line. Exemplarily, as shown in FIG. 7, stv represents the signal of the frame start signal terminal, gc1 to gc5 represent the cascade signals output by the cascade output terminals GC of the $1^{st}$ to $5^{th}$ shift register units, ga1 to ga2 represent gate turn-off signals (such as low level) output by the drive output terminals (i.e., the $1^{st}$ drive output terminals GO_1) of the $1^{st}$ to $2^{nd}$ shift register units onto the gate lines GA(1) to GA(2); ga3 to ga4 represent signals output by the drive output terminals (i.e., the $1^{st}$ drive output terminals GO_1) of the $3^{rd}$ to $4^{th}$ shift register units onto the gate lines GA3 to GA4, where the high level in the signals ga3 to ga4 is the gate turn-on signal, and the low level in the signals ga3 to ga4 is the gate turn-off signal; ga5 to ga6 represent gate turn-off signals (such as low level) output by the drive output terminals of the $5^{th}$ to $6^{th}$ shift register units onto the gate lines GA(5) to GA(6). Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, the target shift register unit (such as the 3rd shift register unit or the $4^{th}$ shift register unit) may input the high level of the third clock signal input to the $1^{st}$ drive clock signal terminal CLK_1 to the $1^{st}$ drive output terminal GO_1, as the high level output of the signals ga3 to ga4, so as to realize the output process of the gate turn-on signal. Each of the remaining shift register units may input the low-level signal input to the $1^{st}$ drive clock signal terminal CLK_1 to the $1^{st}$ drive output terminal GO_1, as the low-level gate turn-off signal in the signals ga1 to ga2 and ga5 to ga6, so as to realize the output process of the gate turn-off signal. In this way, the cascade circuit in the gate drive circuit can realize the cascade control function, and the output circuit can realize the output function of the gate turn-on signal, so that the cascade control function is separated from the output function of the gate turn-on signal. The gate turn-on signal may be output as needed, and in cooperation with the data voltage output of the source drive circuit, the changed part of the picture may be selectively refreshed, that is, partially refreshed, so as to reduce the operating power consumption of the overall display device under the condition of the unchanged refresh frequency.

Figure 8:
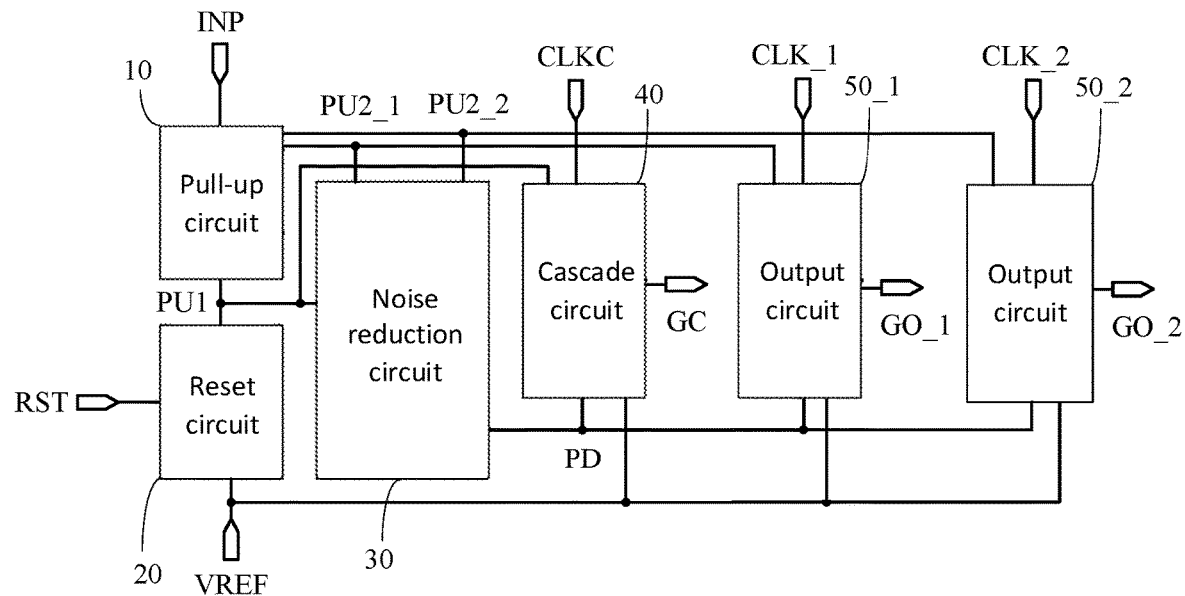
FIG. 8 is a schematic structural diagram of some other shift register units according to an embodiment of the disclosure.

Embodiments of the present invention provide other structural schematic diagrams of the array substrate, as shown in FIG. 8, which is modified from the implementations in the above embodiments. Only the differences between the below embodiments and the above embodiments are illustrated below, and the similarities thereof are not repeated here.

In some embodiments of the disclosure, K may also be equal to 2. Exemplarily, as shown in FIG. 8, the shift register unit may include two output circuits: a $1^{st}$ output circuit 50_1 and a $2^{nd}$ output circuit 50_2. Here, the $1^{st}$ output circuit 50_1 is configured to provide the signal of the $1^{st}$ drive clock signal terminal CLK_1 to the $1^{st}$ drive output terminal GO_1 in response to the signal of the $1^{st}$ second pull-up node PU2_1, and provides the signal of the reference voltage signal terminal VREF to the $1^{st}$ drive output terminal GO_1 in response to the signal of the pull-down node PD. The $2^{nd}$ output circuit 502 is configured to provide the signal of the $2^{nd}$ drive clock signal terminal CLK_2 to the $2^{nd}$ drive output terminal GO_2 in response to the signal of the $2^{nd}$ second pull-up node PU2_2, and provide the signal of the reference voltage signal terminal VREF to the $2^{nd}$ drive output terminal GO_2 in response to the signal of the pull-down node PD.

Figure 9:
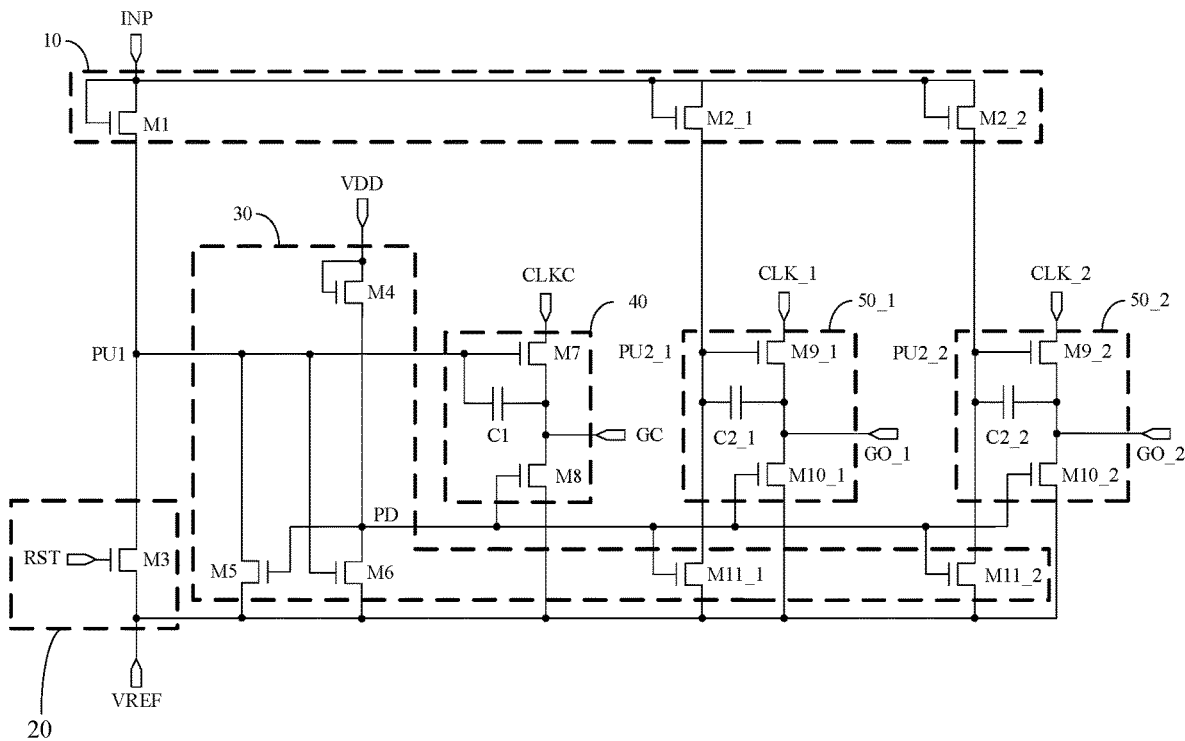
FIG. 9 is a schematic diagram of specific structures of some other shift register units according to an embodiment of the disclosure.

In some embodiments of the disclosure, as shown in FIG. 9, the pull-up circuit 10 may include a first transistor M1 and two second transistors, i.e., a $1^{st}$ second transistor M2_1 and a $2^{nd}$ second transistor M2_2. Here, the $1^{st}$ second transistor M2_1 corresponds to the $1^{st}$ output circuit 50_1, and the $2^{nd}$ second transistor M2_2 corresponds to the $2^{nd}$ output circuit 50_2.

Exemplarily, as shown in FIG. 9, the gate electrode and the first electrode of the $1^{st}$ second transistor M2_1 are both coupled to the input signal terminal INP, and the second electrode of the $1^{st}$ second transistor M2_1 is coupled to the $1^{st}$ second pull-up node PU2_1. Optionally, the $1^{st}$ second transistor M2_1 is turned on under the control of the active level of the signal of the input signal terminal INP, and is turned off under the control of the inactive level of the signal of the input signal terminal INP. For example, the $1^{st}$ second transistor M2_1 may be set as an N-type transistor, and then the active level is high level and the inactive level is low level for the signal of the input signal terminal INP. Alternatively, the $1^{st}$ second transistor M2_1 may also be set as a P-type transistor, and then the active level is low level and the inactive level is high level for the signal of the input signal terminal INP.

Exemplarily, as shown in FIG. 9, the gate electrode and the first electrode of the $2^{nd}$ second transistor M2_2 are both coupled to the input signal terminal INP, and the second electrode of the $2^{nd}$ second transistor M2_2 is coupled to the $2^{nd}$ second pull-up node PU2_2. Optionally, the $2^{nd}$ second transistor M2_2 is turned on under the control of the active level of the signal of the input signal terminal INP, and is turned off under the control of the inactive level of the signal of the input signal terminal INP. For example, the $2^{nd}$ second transistor M2_2 may be set as an N-type transistor, and then the active level is high level and the inactive level is low level for the signal of the input signal terminal INP. Alternatively, the $2^{nd}$ second transistor M2_2 may also be set as a P-type transistor, and then the active level is low level and the inactive level is high level for the signal of the input signal terminal INP.

In some embodiments of the disclosure, as shown in FIG. 9, the $1^{st}$ output circuit 50_1 may include: a $1^{st}$ ninth transistor M9_1, a $1^{st}$ tenth transistor M10_1, and a $1^{st}$ second capacitor C2_1. Here, the gate electrode of the $1^{st}$ ninth transistor M9_1 is coupled to the $1^{st}$ second pull-up node PU2_1, the first electrode of the $1^{st}$ ninth transistor M9_1 is coupled to the $1^{st}$ drive clock signal terminal CLK_1, and the second electrode of the $1^{st}$ ninth transistor M9_1 is coupled to the $1^{st}$ drive output terminal GO_1. The gate electrode of the $1^{st}$ tenth transistor M10_1 is coupled to the pull-down node PD, the first electrode of the $1^{st}$ tenth transistor M10_1 is coupled to the reference voltage signal terminal VREF, and the second electrode of the $1^{st}$ tenth transistor M10_1 is coupled to the $1^{st}$ drive output terminal GO_1. The $1^{st}$ second capacitor C2_1 is coupled between the $1^{st}$ second pull-up node PU2_1 and the $1^{st}$ drive output terminal GO_1.

In some embodiments of the disclosure, as shown in FIG. 9, the $2^{nd}$ output circuit 50_2 may include: a $2^{nd}$ ninth transistor M9_2, a $2^{nd}$ tenth transistor M10_2, and a $2^{nd}$ second capacitor C2_2. Here, the gate electrode of the $2^{nd}$ ninth transistor M9_2 is coupled to the $2^{nd}$ second pull-up node PU2_2, the first electrode of the $2^{nd}$ ninth transistor M9_2 is coupled to the $2^{nd}$ drive clock signal terminal CLK_2, and the second electrode of the $2^{nd}$ ninth transistor M9_2 is coupled to the $2^{nd}$ drive output terminal GO_2. The gate electrode of the $2^{nd}$ tenth transistor M10_2 is coupled to the pull-down node PD, the first electrode of the $2^{nd}$ tenth transistor M10_2 is coupled to the reference voltage signal terminal VREF, and the second electrode of the $2^{nd}$ tenth transistor M10_2 is coupled to the $2^{nd}$ drive output terminal GO_2. The $2^{nd}$ second capacitor C2_2 is coupled between the $2^{nd}$ second pull-up node PU2_2 and the $2^{nd}$ drive output terminal GO_2.

Optionally, as shown in FIG. 9, the $2^{nd}$ ninth transistor M9_2 is turned on under the control of the active level of the signal of the $2^{nd}$ second pull-up node PU2_2, and is turned off under the control of the inactive level of the signal of the $2^{nd}$ second pull-up node PU2_2. For example, the $2^{nd}$ ninth transistor M9_2 may be set as an N-type transistor, and then the active level is high level and the inactive level is low level for the signal of the $2^{nd}$ second pull-up node PU2_2. Alternatively, the $2^{nd}$ ninth transistor M9_2 may also be set as a P-type transistor, and then the active level is low level and the inactive level is high level for the signal of the $2^{nd}$ second pull-up node PU2_2.

Optionally, as shown in FIG. 9, the $2^{nd}$ tenth transistor M10_2 is turned on under the control of the active level of the signal of the pull-down node PD, and is turned off under the control of the inactive level of the signal of the pull-down node PD. For example, the $2^{nd}$ tenth transistor M10_2 may be set as an N-type transistor, and then the active level is high level and the inactive level is low level for the signal of the pull-down node PD. Alternatively, the $2^{nd}$ tenth transistor M10_2 may also be set as a P-type transistor, and then the active level is low level and the inactive level is high level for the signal of the pull-down node PD.

Figure 10:
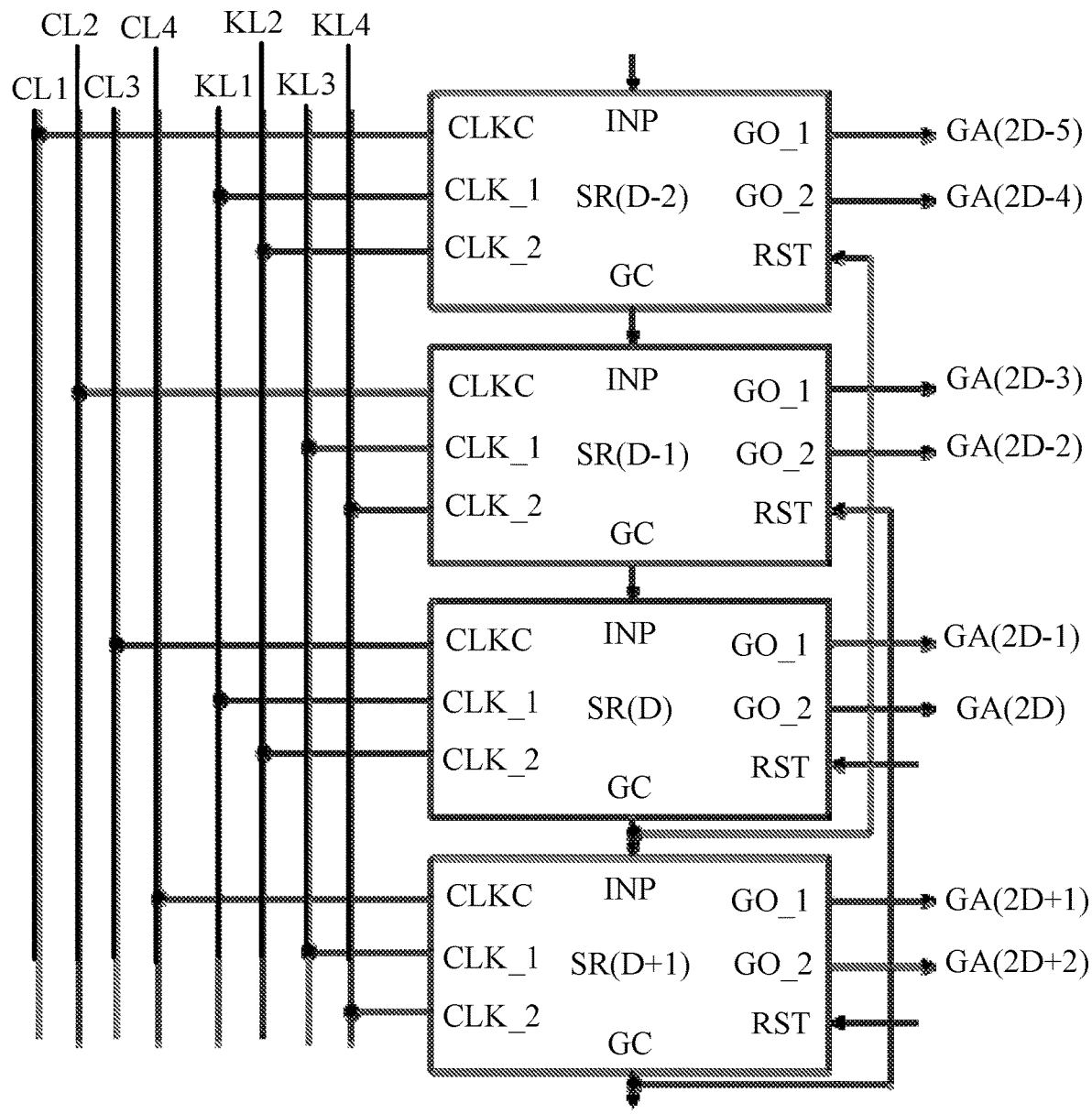
FIG. 10 is a schematic structural diagram of some other gate drive circuits according to an embodiment of the disclosure.

In some embodiments of the disclosure, as shown in FIG. 10, the input signal terminal INP of the $1^{st}$ shift register unit is coupled to the frame start signal terminal, and the cascade output terminal GC of the $D^{th}$ shift register unit SR(D) is coupled to the reset signal terminal RST of the D-$2^{th}$ shift register unit SR(D-2) and the input signal terminal INP of the D+$1^{th}$ shift register unit SR(D+1) respectively, where D is a positive integer.

For example, as shown in FIG. 10, in the D-$2^{th}$ shift register unit, the $1^{st}$ drive output terminal GO_1 is coupled to the gate line GA(2D-5), and the $2^{nd}$ drive output terminal GO_2 is coupled to the gate line GA(2D-4). In the D-$1^{th}$ shift register unit, the $1^{st}$ drive output terminal GO_1 is coupled to the gate line GA(2D-3), and the $2^{nd}$ drive output terminal GO_2 is coupled to the gate line GA(2D-2). In the $D^{th}$ shift register unit, the $1^{st}$ drive output terminal GO_1 is coupled to the gate line GA(2D-1), and the $2^{nd}$ drive output terminal GO_2 is coupled to the gate line GA(2D). In the D+$1^{th}$ shift register unit, the $1^{st}$ drive output terminal GO_1 is coupled to the gate line GA(2D+1), and the $2^{nd}$ drive output terminal GO_2 is coupled to the gate line GA(2D+2).

In some embodiments of the disclosure, as shown in FIG. 10, the array substrate further includes four cascade clock signal lines. Here, among the plurality of shift register units in the gate drive circuit, the cascade clock signal terminal CLKC of the 4c-$3^{th}$ shift register unit is coupled to the $1^{st}$ cascade clock signal line CL1 among the 4 cascade clock signal lines, the cascade clock signal terminal CLKC of the 4c-$2^{th}$ shift register unit is coupled to the $2^{nd}$ cascade clock signal line CL2 among the 4 cascade clock signal lines, the cascade clock signal terminal CLKC of the 4c-$1^{th}$ shift register unit is coupled to the $3^{rd}$ cascade clock signal line CL3 among the 4 cascade clock signal lines, and the cascade clock signal terminal CLKC of the $4c^{th}$ shift register unit is coupled to the $4^{th}$ cascade clock signal line CL4 among the 4 cascade clock signal lines.

Here, c is a positive integer.

In some embodiments of the disclosure, the array substrate further includes 2K drive clock signal lines. Exemplarily, taking K=2 as an example, as shown in FIG. 10, the $1^{st}$ drive clock signal terminal CLK_1 of the 2d-$1^{th}$ shift register unit is coupled to the $1^{st}$ drive clock signal line KL1, the $2^{nd}$ drive clock signal terminal CLK_2 of the 2d-$1^{th}$ shift register unit is coupled to the $2^{nd}$ drive clock signal line KL2, the $1^{st}$ drive clock signal terminal CLK_1 of the $2d^{th}$ shift register unit is coupled to the $3^{rd}$ drive clock signal line KL3, and the $2^{nd}$ drive clock signal terminal of the $2d^{th}$ shift register unit is coupled to the $4^{th}$ drive clock signal line KL4, where d is a positive integer.

In some embodiments of the disclosure, the clock cycle of the first clock signal may be greater than the clock cycle of the second clock signal. Exemplarily, the clock cycle of the first clock signal is K times the clock cycle of the second clock signal. Moreover, in one clock cycle of the first clock signal, the duration of the active level (for example, high level) accounts for no more than ½ (may be equal to ½, or less than ½) of the clock cycle of the first clock signal. And, the duration of one active level of the second clock signal is the same as the duration of one active level of the first clock signal.

For example, when K=2, the clock cycle of the first clock signal is twice the clock cycle of the second clock signal. Of course, the value of K may also be 3, 4, 5, etc., which is not limited in the disclosure.

In some embodiments of the disclosure, the active level of the first clock signal transmitted on the $1^{st}$ cascade clock signal line CL1 may correspond to the active level of the first part of the second clock signal transmitted on the $1^{st}$ drive clock signal line among the 2K drive clock signal lines, the active level of the first clock signal transmitted on the $3^{rd}$ cascade clock signal line CL3 may correspond to the active level of the second part of the second clock signal transmitted on the $1^{st}$ drive clock signal line, and the active level of the first part and the active level of the second part appear alternately. The active level of the first clock signal transmitted on the $2^{nd}$ cascade clock signal line CL2 corresponds to the active level of the third part of the second clock signal transmitted on the $K+1^{th}$ drive clock signal line among the 2K drive clock signal lines, the active level of the first clock signal transmitted on the $4^{th}$ cascade clock signal line CL4 corresponds to the active level of the fourth part of the second clock signal transmitted on the $K+1^{th}$ drive clock signal line, and the active level of the third part and the active level of the fourth part appear alternately.

Figure 11:
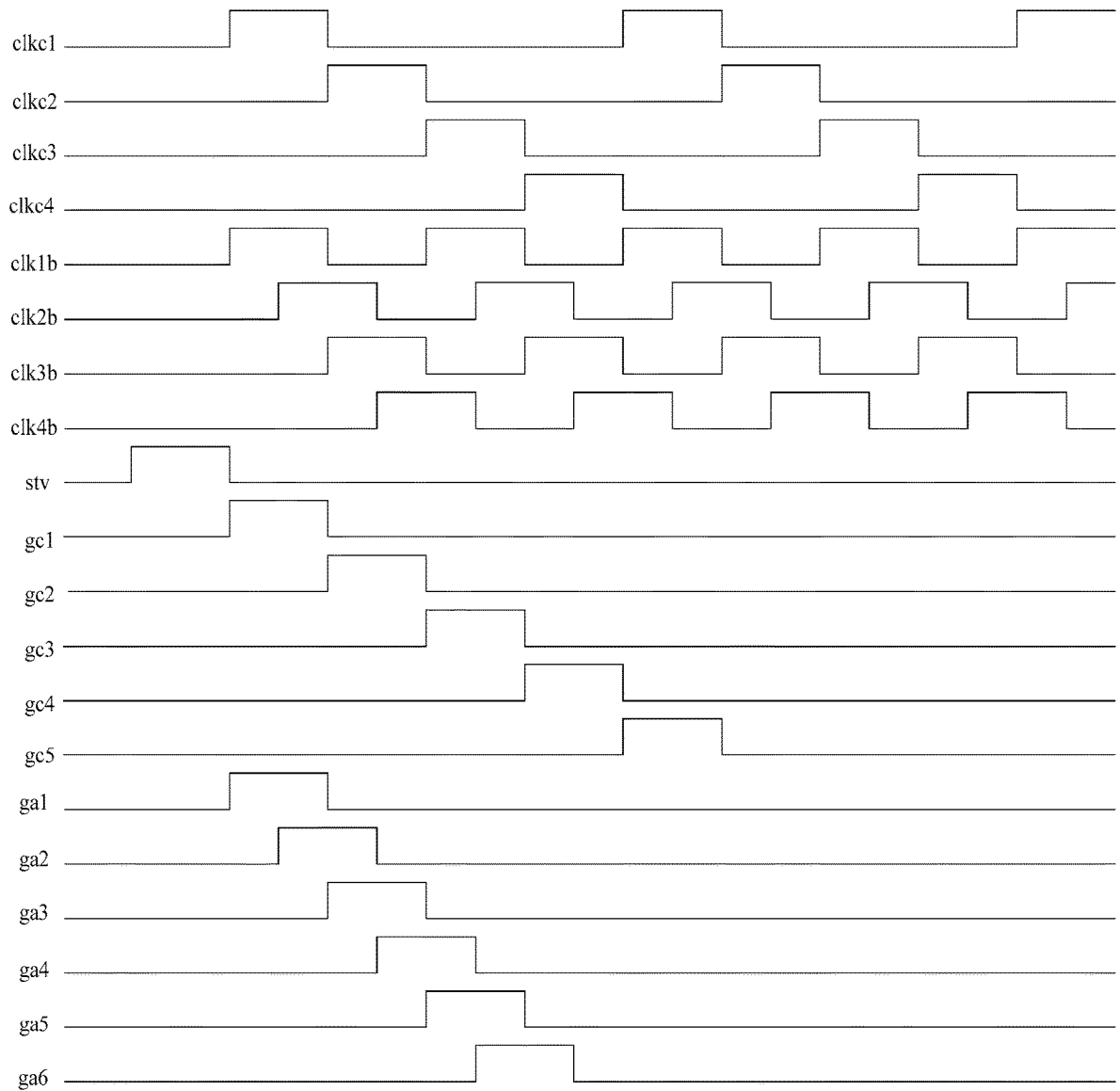
FIG. 11 is a timing diagram of yet other signals according to an embodiment of the disclosure.
Figure 12:
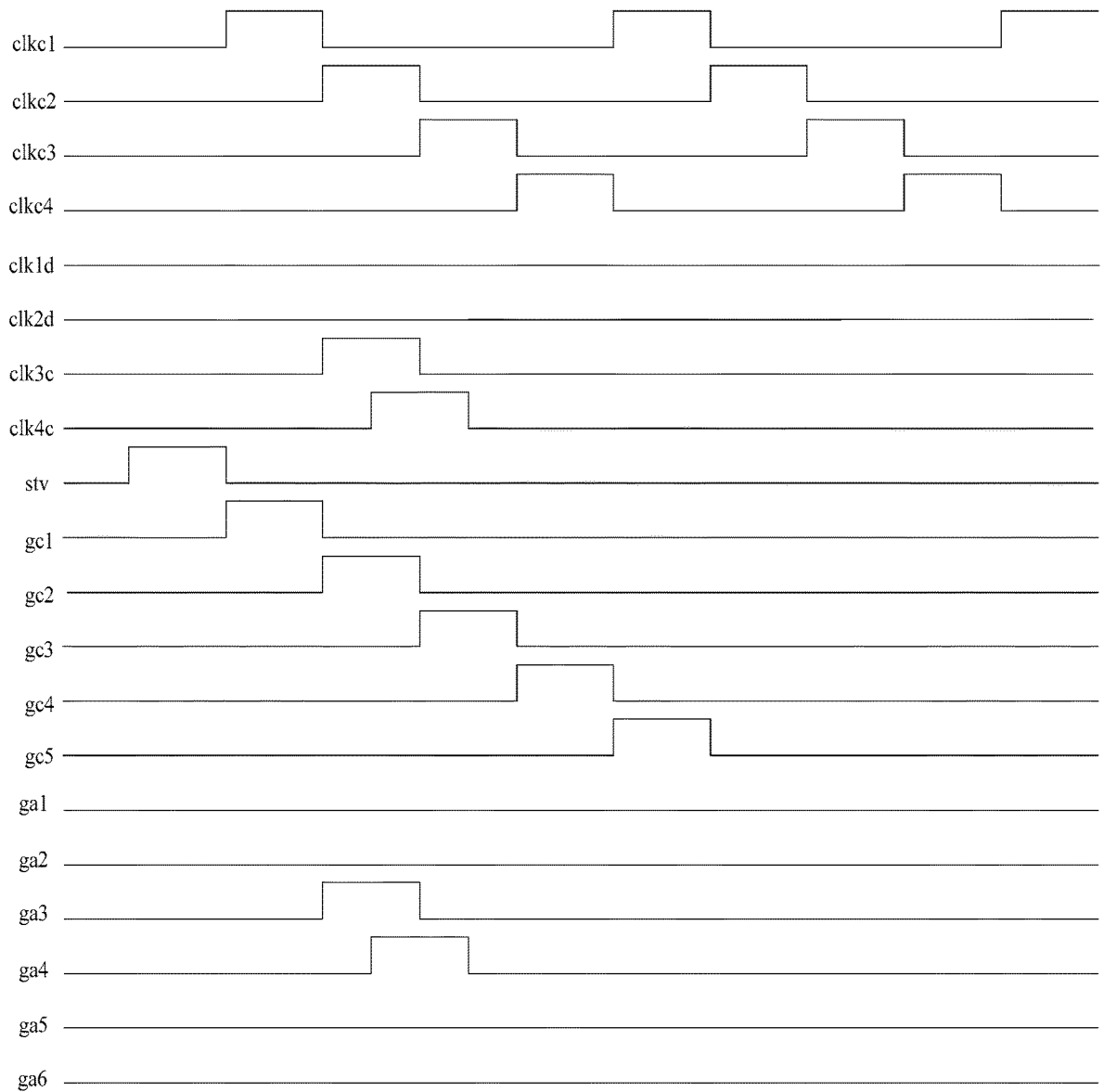
FIG. 12 is a timing diagram of yet other signals according to an embodiment of the disclosure.

Exemplarily, taking K=2 as an example, as shown in FIGS. 11 and 12, the active level (such as high level) of the first clock signal clkc1 transmitted on the $1^{st}$ cascade clock signal line CL1 corresponds to the active level (such as high level) of the first part of the second clock signal clk1b transmitted on the $1^{st}$ drive clock signal line KL1, the active level (such as high level) of the first clock signal clkc3 transmitted on the $3^{rd}$ cascade clock signal line CL3 corresponds to the active level (such as high level) of the second part of the second clock signal clk1b transmitted on the $1^{st}$ drive clock signal line KL1, and the active level (such as high level) of the first part and the active level (such as high level) of the second part appear alternately in the second clock signal clk1b transmitted on the $1^{st}$ drive clock signal line KL1. Also, the active level (such as high level) of the first clock signal clkc2 transmitted on the $2^{nd}$ cascade clock signal line CL2 corresponds to the active level (such as high level) of the third part of the second clock signal clk3b transmitted on the $3^{rd}$ drive clock signal line KL3, the active level (such as high level) of the first clock signal clkc4 transmitted on the $4^{th}$ cascade clock signal line CL4 corresponds to the active level (such as high level) of the fourth part of the second clock signal clk3b transmitted on the $3^{rd}$ drive clock signal line KL3, and the active level (such as high level) of the third part and the active level (such as high level) of the fourth part appear alternately in the second clock signal clk3b transmitted on the $3^{rd}$ drive clock signal line KL3.

For example, as shown in FIG. 11, taking the active level as high level as an example, the rising edge of the high level of the first clock signal clkc1 transmitted on the $1^{st}$ cascade clock signal line CL1 is aligned with the rising edge of the high level of the first part of the corresponding second clock signal clk1b, and the falling edge of the high level of the first clock signal clkc1 transmitted on the $1^{st}$ cascade clock signal line CL1 is aligned with the falling edge of the high level of the first part of the corresponding second clock signal clk1b. The rising edge of the high level of the first clock signal clkc3 transmitted on the $3^{rd}$ cascade clock signal line CL3 is aligned with the rising edge of the high level of the second part of the corresponding second clock signal clk1b, and the falling edge of the high level of the first clock signal clkc3 transmitted on the $3^{rd}$ cascade clock signal line CL3 is aligned with the falling edge of the high level of the second part of the corresponding second clock signal clk1b. The rising edge of the high level of the first clock signal clkc2 transmitted on the $2^{nd}$ cascade clock signal line CL2 is aligned with the rising edge of the high level of the third part of the corresponding second clock signal clk3b, and the falling edge of the high level of the first clock signal clkc2 transmitted on the $2^{nd}$ cascade clock signal line CL2 is aligned with the falling edge of the high level of the third part of the corresponding second clock signal clk3b. The rising edge of the high level of the first clock signal clkc4 transmitted on the $4^{th}$ cascade clock signal line CL4 is aligned with the rising edge of the high level of the fourth part of the corresponding second clock signal clk3b, and the falling edge of the high level of the first clock signal clkc4 transmitted on the $4^{th}$ cascade clock signal line CL4 is aligned with the falling edge of the high level of the fourth part of the corresponding second clock signal clk3b.

Exemplarily, taking K=2 as an example, in the first driving mode, the first clock signal with an active level and an inactive level alternating periodically is loaded to the cascade clock signal terminal CLKC of any shift register unit so that the cascade output terminal GC of the shift register unit outputs a cascade signal, and the second clock signal with an active level and an inactive level alternating periodically is loaded to the $1^{st}$ drive clock signal terminal CLK_1 of any shift register unit so that the $1^{st}$ drive output terminal GO_1 outputs a gate turn-on signal. The second clock signal with an active level and an inactive level alternating periodically is loaded to the $2^{nd}$ drive clock signal terminal CLK_2 of the shift register unit so that the $2^{nd}$ drive output terminal GO_2 outputs a gate turn-on signal.

Exemplarily, in the first driving mode, the first clock signal is input to the cascade clock signal terminal CLKC through the cascade clock signal line, and the second clock signal is input to the drive clock signal terminal through the drive clock signal line. Exemplarily, as shown in FIG. 11, stv represents the signal of the frame start signal terminal, clkc1 represents the first clock signal transmitted on the $1^{st}$ cascade clock signal line CL1, clkc2 represents the first clock signal transmitted on the $2^{nd}$ cascade clock signal line CL2, clkc3 represents the first clock signal transmitted on the $3^{rd}$ cascade clock signal line CL3, clkc4 represents the first clock signal transmitted on the $4^{th}$ cascade clock signal line CL4, clk1b represents the second clock signal transmitted on the $1^{st}$ drive clock signal line KL1, clk2b represents the second clock signal transmitted on the $2^{nd}$ drive clock signal line KL2, clk3b represents the second clock signal transmitted on the $3^{rd}$ drive clock signal line KL3, clk4b represents the second clock signal transmitted on the $4^{th}$ drive clock signal line KL4, gc1 to gc5 represent cascade signals output by the cascade output terminals GC of the $1^{st}$ to $5^{th}$ shift register units, and ga1 to ga6 represent signals output by the drive output terminals of the $1^{st}$ to $3^{rd}$ shift register units onto the gate lines GA1 to GA6, where the high level in the signals ga1 to ga6 is the gate turn-on signal, and the low level in the signals ga1 to ga6 is the gate turn-off signal. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, each shift register unit may input the high level of the second clock signal input to the $1^{st}$ drive clock signal terminal CLK_1 to the $1^{st}$ drive output terminal GO_1, as the high-level gate turn-on signal in the signals ga1, ga3 and ga5; and each shift register unit may input the high level of the second clock signal input to the $2^{nd}$ drive clock signal terminal CLK_2 to the $2^{nd}$ drive output terminal GO_2, as the high-level gate turn-on signal in the signals ga2, ga4 and ga6, so as to realize the output process of the gate turn-on signal. Thus the gate drive circuit can output the gate turn-on signal row by row. Therefore, when the display device displays a picture, the timing controller controls the gate drive circuit to output the gate turn-on signal (that is, the high level in the gate turn-on signal) to the pixel area row by row from top to bottom, and the gates of the transistors in the sub-pixel rows are turned on row by row while the source drive circuit outputs the sub-pixel display data and writes it into the corresponding sub-pixel row, so that the sub-pixels in the pixel area refresh the display data row by row. After all rows are refreshed, the refresh of the overall display picture is achieved.

Exemplarily, taking K=2 as an example, in the second driving mode, the first clock signal is loaded to the cascade clock signal terminal CLKC of any shift register unit so that the cascade output terminal GC of the shift register unit outputs a cascade signal, and the third clock signal with the active level appearing within the target time period is loaded to the target drive clock signal terminals (i.e., the $1^{st}$ drive clock signal terminal CLK_1 and the $2^{nd}$ drive clock signal terminal CLK_2 of the $2^{nd}$ shift register unit) of the target shift register unit (taking the drive gate lines GA3 to GA4 as an example, the target shift register unit includes the $2^{nd}$ shift register unit), so that the target drive output terminals (i.e., the $1^{st}$ drive output terminal GO_1 and the $2^{nd}$ drive output terminal GO_2 of the $2^{nd}$ shift register unit) corresponding to the target drive clock signal terminals (i.e., the $1^{st}$ drive clock signal terminal CLK_1 and the $2^{nd}$ drive clock signal terminal CLK_2 of the $2^{nd}$ shift register unit) output gate turn-on signals. The inactive level (such as low level) signals are loaded to the $1^{st}$ drive clock signal terminals CLK_1 and the $2^{nd}$ drive clock signal terminals CLK_2 of the remaining shift register units, so that the $1^{st}$ drive output terminals GO_1 and the $2^{nd}$ drive output terminals GO_2 thereof output gate turn-off signals (such as low level signals).

For example, as shown in FIG. 12, clkc1 represents the first clock signal transmitted on the $1^{st}$ cascade clock signal line CL1, clkc2 represents the first clock signal transmitted on the $2^{nd}$ cascade clock signal line CL2, clkc3 represents the first clock signal transmitted on the $3^{rd}$ cascade clock signal line CL3, clkc4 represents the first clock signal transmitted on the $4^{th}$ cascade clock signal line CL4, clk1d represents the inactive level (such as low level) signal transmitted on the $1^{st}$ drive clock signal line KL1, clk2d represents the inactive level (such as low level) signal transmitted on the $2^{nd}$ drive clock signal line KL2, clk3c represents the third clock signal transmitted on the $3^{rd}$ drive clock signal line KL3, and clk4c represents the third clock signal transmitted on the $4^{th}$ drive clock signal line KL4. Exemplarily, in the second driving mode, the first clock signal is input to the cascade clock signal terminal CLKC through the cascade clock signal line, and the third clock signal is input to the drive clock signal terminal through the drive clock signal line. Exemplarily, as shown in FIG. 12, stv represents the signal of the frame start signal terminal, gc1 to gc5 represent the cascade signals output by the cascade output terminals GC of the $1^{st}$ to $5^{th}$ shift register units, ga1 to ga2 represent gate turn-off signals (such as low level) output by the $1^{st}$ drive output terminal GO_1 and the $2^{nd}$ drive output terminal GO_2 of the $1^{st}$ shift register unit onto the gate lines GA1 to GA2, ga3 to ga4 represent gate turn-on signals output by the $1^{st}$ drive output terminal GO_1 and the $2^{nd}$ drive output terminal GO_2 of the $2^{nd}$ shift register unit onto the gate lines GA3 to GA4, and ga5 to ga6 represent gate turn-off signals (such as low level) output by the $1^{st}$ drive output terminal GO_1 and the $2^{nd}$ drive output terminal GO_2 of the $3^{rd}$ shift register unit onto the gate lines GA5 to GA6. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, the target shift register unit (i.e., the $2^{nd}$ shift register unit) may input the high level of the third clock signal input to the $1^{st}$ drive clock signal terminal CLK_1 of the target shift register unit to the $1^{st}$ drive output terminal GO_1, as the high level output of the signal ga3; and input the high level of the third clock signal input to the $2^{nd}$ drive clock signal terminal CLK_2 of the target shift register unit to the $2^{nd}$ drive output terminal GO_2, as the high level output of the signal ga4, so as to realize the output process of the gate turn-on signals. Each of the remaining shift register units may input the low-level signal input to the $1^{st}$ drive clock signal terminal CLK_1 of the remaining shift register unit to the $1^{st}$ drive output terminal GO_1, and input the low-level signal input to the $2^{nd}$ drive clock signal terminal CLK_2 of the remaining shift register unit to the $2^{nd}$ drive output terminal GO_2, as the low-level gate turn-off signals in the signals ga1 to ga2 and ga5 to ga6, so as to realize the output process of the gate turn-off signals. In this way, the cascade circuit in the gate drive circuit can realize the cascade control function, and the output circuit can realize the output function of the gate turn-on signal, so that the cascade control function is separated from the output function of the gate turn-on signal. The gate turn-on signal may be output as needed, and in cooperation with the data voltage output of the source drive circuit, the changed part of the picture is selectively refreshed, that is, partially refreshed, so as to reduce the operating power consumption of the overall display device under the condition of the unchanged refresh frequency.

Figure 13:
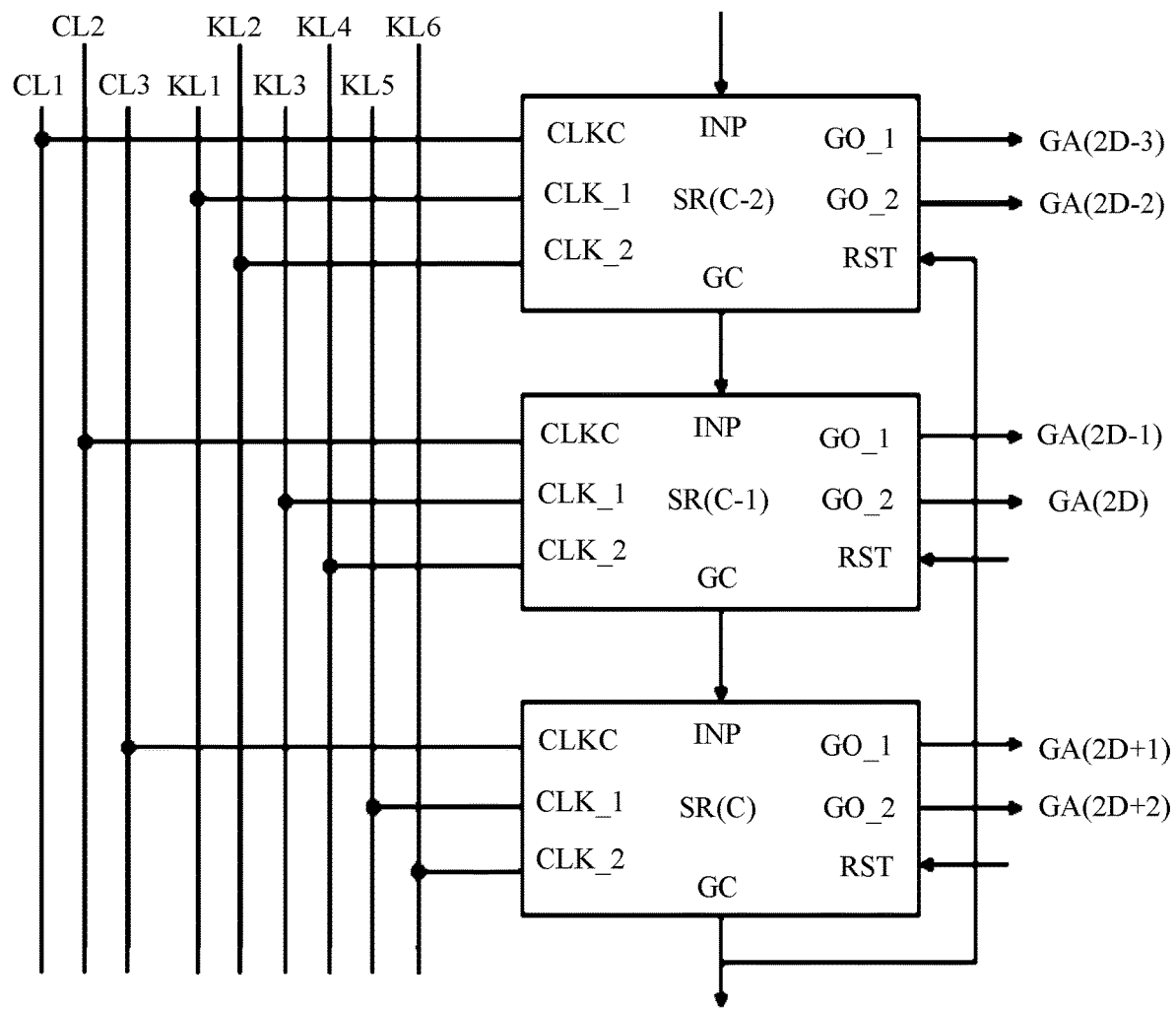
FIG. 13 is a schematic structural diagram of yet other gate drive circuits according to an embodiment of the disclosure.

Embodiments of the present invention provide yet other structural schematic diagrams of the array substrate, as shown in FIG. 13, which is modified from the implementations in the above embodiments. Only the differences between below embodiments and the above embodiments are illustrated below, and the similarities thereof are not repeated here.

In yet other embodiments of the disclosure, K may also be equal to 2. Exemplarily, the structure of the shift register units may be as shown in FIG. 8, and details will not be described again here. Of course, K may also be equal to 1, 3, 4 or more, which will not be described in detail here.

In some embodiments of the disclosure, the array substrate further includes F cascade clock signal lines and 2F drive clock signal lines, where the first clock signal transmitted on the $f^{th}$ cascade clock signal line among the F cascade clock signal lines is the same as the second clock signal transmitted on the 2f-1$^{th}$ drive clock signal line among the 2F drive clock signal lines. F is an integer greater than 2, f is an integer and 1≤f≤F.

Figure 14:
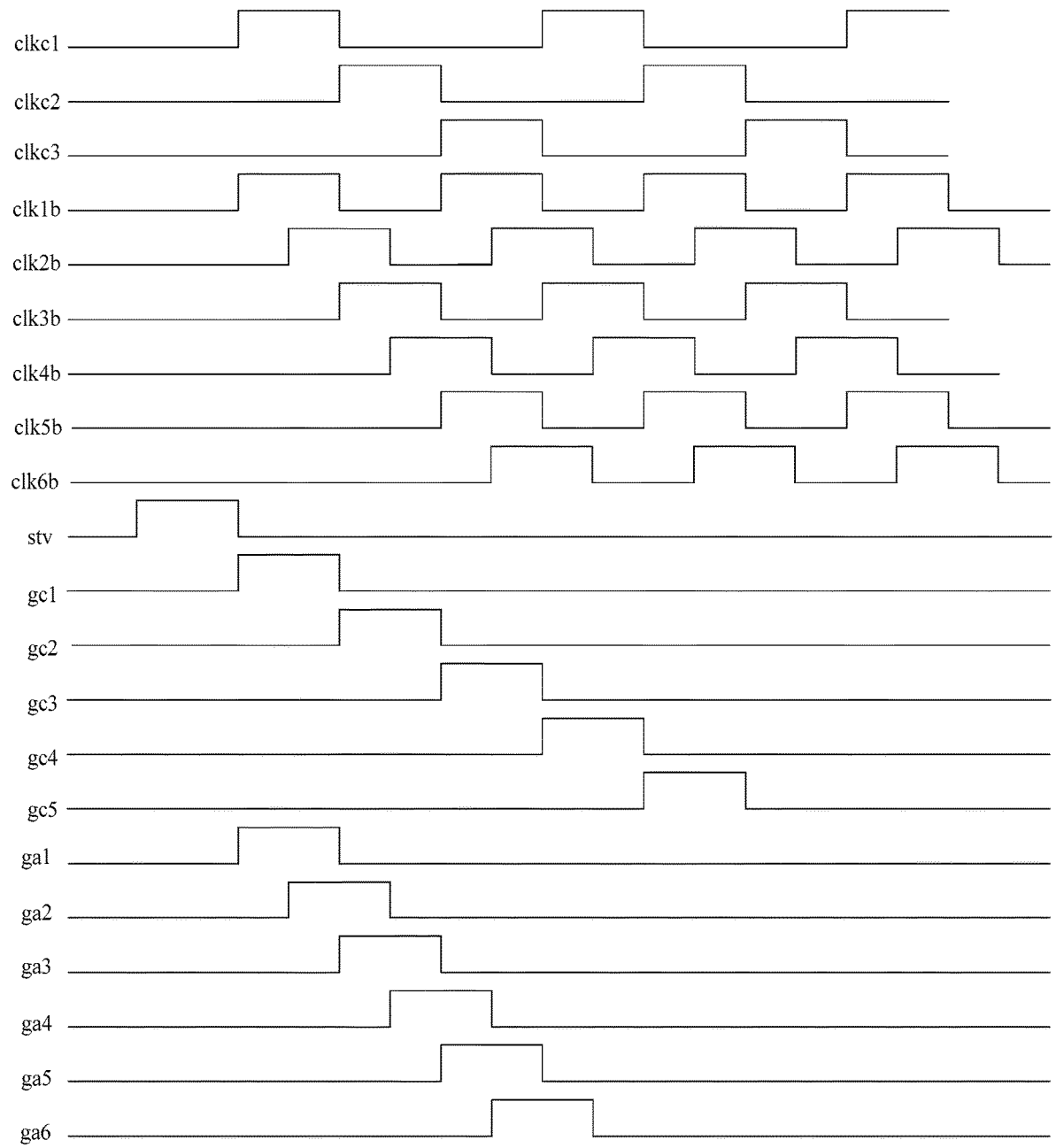
FIG. 14 is a timing diagram of yet other signals according to an embodiment of the disclosure.

Exemplarily, F=3, and then the array substrate includes 3 cascade clock signal lines and 6 drive clock signal lines. Also, as shown in FIG. 14, the first clock signal clkc1 transmitted on the 1$^{st}$ cascade clock signal line CL1 among the 3 cascade clock signal lines is the same as the second clock signal clk1b transmitted on the 1$^{st}$ drive clock signal line KL1 among the 6 drive clock signal lines, that is, the rising edge and falling edge of the first clock signal clkc1 transmitted on the 1$^{st}$ cascade clock signal line CL1 are aligned with the rising edge and falling edge of the second clock signal clk1b transmitted on the 1$^{st}$ drive clock signal line KL1.

And, the first clock signal clkc2 transmitted on the 2$^{nd}$ cascade clock signal line CL2 among the 3 cascade clock signal lines is the same as the second clock signal clk3b transmitted on the 3$^{rd}$ drive clock signal line KL3 among the 6 drive clock signal lines, that is, the rising edge and falling edge of the first clock signal clkc2 transmitted on the 2$^{nd}$ cascade clock signal line CL2 are aligned with the rising edge and falling edge of the second clock signal clk3b transmitted on the 3$^{rd}$ drive clock signal line KL3.

And, the first clock signal clkc3 transmitted on the 3$^{rd}$ cascade clock signal line CL3 among the 3 cascade clock signal lines is the same as the second clock signal clk5b transmitted on the 5$^{th}$ drive clock signal line KL5 among the 6 drive clock signal lines, that is, the rising edge and falling edge of the first clock signal clkc3 transmitted on the 3$^{rd}$ cascade clock signal line CL3 are aligned with the rising edge and falling edge of the second clock signal clk5b transmitted on the 5$^{th}$ drive clock signal line KL5.

Of course, F may also be 4, 5, 6, 7 or more, which can be determined according to the requirements of the actual application environment, and is not limited in the disclosure.

In some embodiments of the disclosure, the input signal terminal INP of the 1$^{st}$ shift register unit is coupled to the frame start signal terminal, and the cascade output terminal GC of the C$^{th}$ shift register unit is coupled to the reset signal terminal RST of the C-Y-1$^{th}$ shift register unit and the input signal terminal INP of the C+Y$^{th}$ shift register unit respectively, where C is a positive integer, and Y is an integer part of F/2. For example, F=3, and then Y is 1. As shown in FIG. 13, the cascade relationship of the shift register units in the gate drive circuit includes but is not limited to: the cascade output terminal GC of the C$^{th}$ shift register unit SR(C) is coupled to the reset signal terminal RST of the C-2$^{th}$ shift register unit SR(C-2) and the input signal terminal INP of the C+1$^{th}$ shift register unit SR(C+1) respectively. If F=4, then Y is 2, and the cascade relationship of the shift register units in the gate drive circuit is: the cascade output terminal GC of the C$^{th}$ shift register unit SR(C) is coupled to the reset signal terminal RST of the C-3$^{th}$ shift register unit SR(C-3) and the input signal terminal INP of the C+2$^{th}$ shift register unit SR(C+2) respectively.

In some embodiments of the disclosure, as shown in FIG. 13, in the C-2$^{th}$ shift register unit SR(C-2), the 1$^{st}$ drive output terminal GO_1 is coupled to the gate line GA(2D-3), and the 2$^{nd}$ drive output terminal GO_2 is coupled to the gate line GA(2D-2). In the C-1$^{th}$ shift register unit SR(C-1), the 1$^{st}$ drive output terminal GO_1 is coupled to the gate line GA(2D-1), and the 2$^{nd}$ drive output terminal GO_2 is coupled to the gate line GA(2D). In the C$^{th}$ shift register unit SR(C), the 1$^{st}$ drive output terminal GO_1 is coupled to the gate line GA(2D+1), and the 2$^{nd}$ drive output terminal GO_2 is coupled to the gate line GA(2D+2).

Exemplarily, taking K=2 as an example, in the first driving mode, the first clock signal with an active level and an inactive level alternating periodically is loaded to the cascade clock signal terminal CLKC of any shift register unit so that the cascade output terminal GC of the shift register unit outputs a cascade signal, and the second clock signal with an active level and an inactive level alternating periodically is loaded to the 1$^{st}$ drive clock signal terminal CLK_1 of any shift register unit so that the 1$^{st}$ drive output terminal GO_1 outputs a gate turn-on signal. And, the second clock signal with an active level and an inactive level alternating periodically is loaded to the 2$^{nd}$ drive clock signal terminal CLK_2 of the shift register unit so that the 2$^{nd}$ drive output terminal GO_2 outputs a gate turn-on signal.

Exemplarily, in the first driving mode, the first clock signal is input to the cascade clock signal terminal CLKC through the cascade clock signal line, and the second clock signal is input to the drive clock signal terminal through the drive clock signal line. Exemplarily, as shown in FIG. 14, stv represents the signal of the frame start signal terminal, clkc1 represents the first clock signal transmitted on the 1$^{st}$ cascade clock signal line CL1, clkc2 represents the first clock signal transmitted on the 2$^{nd}$ cascade clock signal line CL2, and clkc3 represents the first clock signal transmitted on the 3$^{rd}$ cascade clock signal line CL3. clk1b represents the second clock signal transmitted on the 1$^{st}$ drive clock signal line KL1, clk2b represents the second clock signal transmitted on the 2$^{nd}$ drive clock signal line KL2, clk3b represents the second clock signal transmitted on the 3$^{rd}$ drive clock signal line KL3, clk4b represents the second clock signal transmitted on the 4$^{th}$ drive clock signal line KL4, clk5b represents the second clock signal transmitted on the 5$^{th}$ drive clock signal line KL5, and clk6b represents the second clock signal transmitted on the 6$^{th}$ drive clock signal line KL6. gc1 to gc5 represent the cascade signals output by the cascade output terminals GC of the 1$^{st}$ to 5$^{th}$ shift register units, and ga1 to ga6 represent signals output by the drive output terminals of the 1$^{st}$ to 3$^{rd}$ shift register units onto the gate lines GA1 to GA6, where the high level in the signals ga1 to ga6 is the gate turn-on signal, and the low level in the signals ga1 to ga6 is the gate turn-off signal. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, each shift register unit may input the high level of the second clock signal input to the 1$^{st}$ drive clock signal terminal CLK_1 to the 1$^{st}$ drive output terminal GO_1, as the high-level gate turn-on signal in the signals ga1, ga3 and ga5; and each shift register unit may input the high level of the second clock signal input to the 2$^{nd}$ drive clock signal terminal CLK_2 to the 2$^{nd}$ drive output terminal GO_2, as the high-level gate turn-on signal in the signals ga2, ga4 and ga6, so as to realize the output process of the gate turn-on signal. Thus the gate drive circuit can output the gate turn-on signal row by row. Therefore, when the display device displays a picture, the timing controller controls the gate drive circuit to output the gate turn-on signal (that is, the high level in the gate turn-on signal) to the pixel area row by row from top to bottom, and the gates of the transistors in the sub-pixel rows are turned on row by row while the source drive circuit outputs the sub-pixel display data and writes it into the corresponding sub-pixel row, so that the sub-pixels in the pixel area refresh the display data row by row. After all rows are refreshed, the refresh of the overall display picture is achieved.

Exemplarily, taking K=2 as an example, in the second driving mode, the first clock signal is loaded to the cascade clock signal terminal CLKC of each shift register unit so that the cascade output terminal GC of the shift register unit outputs a cascade signal, and the third clock signal with the active level appearing within the target time period is loaded to the target drive clock signal terminals (i.e., the $1^{st}$ drive clock signal terminal CLK_1 and the $2^{nd}$ drive clock signal terminal CLK_2 of the $2^{nd}$ shift register unit) of the target shift register unit (taking the drive gate lines GA3 to GA4 as an example, the target shift register unit includes the $2^{nd}$ shift register unit), so that the target drive output terminals (i.e., the $1^{st}$ drive output terminal GO_1 and the $2^{nd}$ drive output terminal GO_2 of the $2^{nd}$ shift register unit) corresponding to the target drive clock signal terminals (i.e., the $1^{st}$ drive clock signal terminal CLK_1 and the $2^{nd}$ drive clock signal terminal CLK_2 of the $2^{nd}$ shift register unit) output gate turn-on signals.

Figure 15:
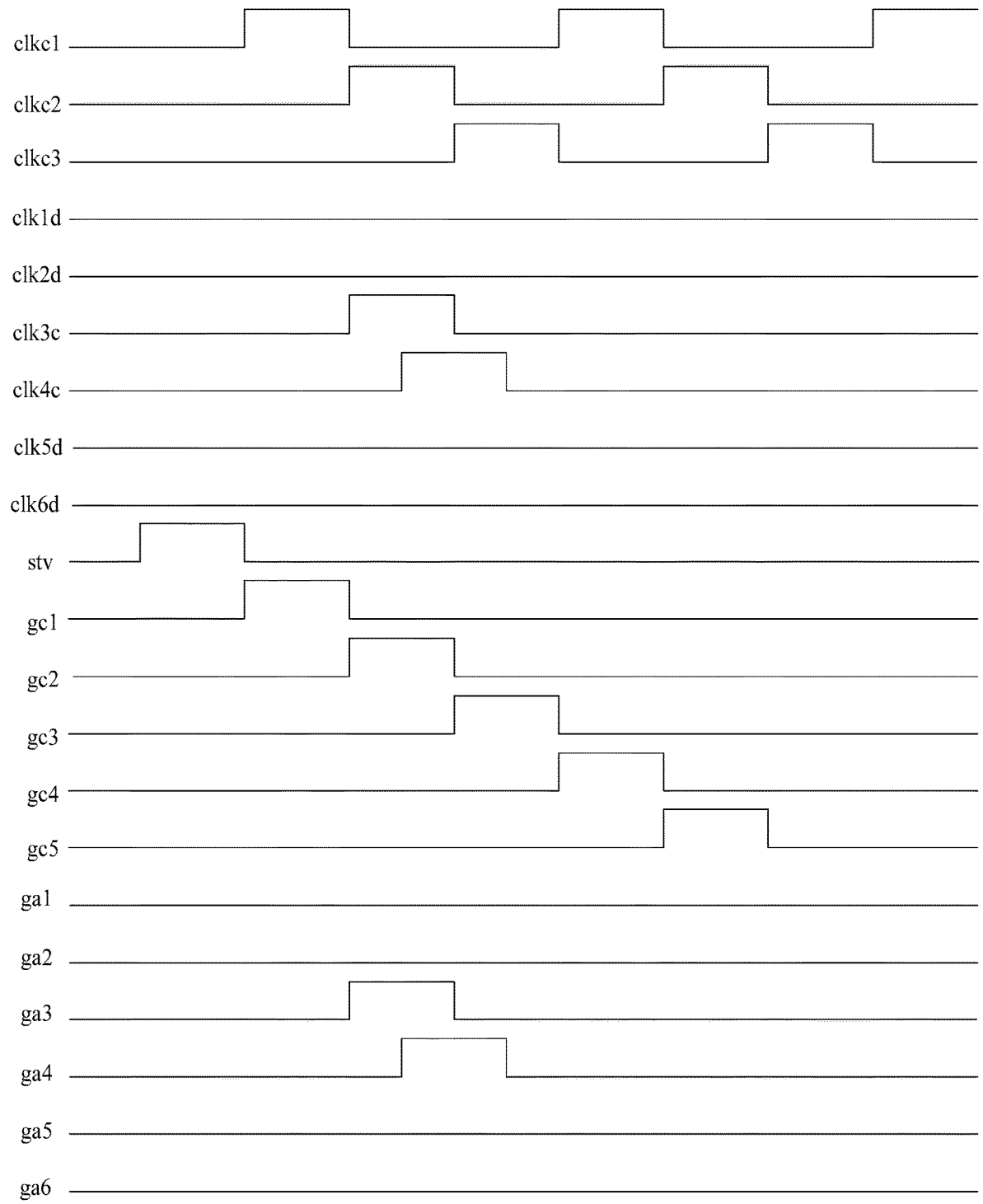
FIG. 15 is a timing diagram of yet other signals according to an embodiment of the disclosure.

For example, as shown in FIG. 15, clkc1 represents the first clock signal transmitted on the $1^{st}$ cascade clock signal line CL1, clkc2 represents the first clock signal transmitted on the $2^{nd}$ cascade clock signal line CL2, and clkc3 represents the first clock signal transmitted on the $3^{rd}$ cascade clock signal line CL3. clk1$d$ represents the inactive level (such as low level) signal transmitted on the $1^{st}$ drive clock signal line KL1, clk2$d$ represents the inactive level (such as low level) signal transmitted on the $2^{nd}$ drive clock signal line KL2, clk3$c$ represents the third clock signal transmitted on the $3^{rd}$ drive clock signal line KL3, clk4$c$ represents the third clock signal transmitted on the $4^{th}$ drive clock signal line KL4, clk5$d$ represents the inactive level (such as low level) signal transmitted on the $5^{th}$ drive clock signal line KL5, and clk6$d$ represents the inactive level (such as low level) signal transmitted on the $6^{th}$ drive clock signal line KL6. Exemplarily, in the second driving mode, the first clock signal is input to the cascade clock signal terminal CLKC through the cascade clock signal line, and the third clock signal is input to the drive clock signal terminal through the drive clock signal line. Exemplarily, as shown in FIG. 15, stv represents the signal of the frame start signal terminal, gc1 to gc5 represent the cascade signals output by the cascade output terminals GC of the $1^{st}$ to $5^{th}$ shift register units, ga1 to ga2 represent gate turn-off signals (such as low level) output by the $1^{st}$ drive output terminal GO_1 and the $2^{nd}$ drive output terminal GO_2 of the $1^{st}$ shift register unit onto the gate lines GA1 to GA2, ga3 to ga4 represent gate turn-on signals output by the $1^{st}$ drive output terminal GO_1 and the $2^{nd}$ drive output terminal GO_2 of the $2^{nd}$ shift register unit onto the gate lines GA3 to GA4, and ga5 to ga6 represent gate turn-off signals (such as low level) output by the $1^{st}$ drive output terminal GO_1 and the $2^{nd}$ drive output terminal GO_2 of the $3^{rd}$ shift register unit onto the gate lines GA5 to GA6. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, the target shift register unit (i.e., the $2^{nd}$ shift register unit) may input the high level of the third clock signal input to the $1^{st}$ drive clock signal terminal CLK_1 to the $1^{st}$ drive output terminal GO_1, as the high level output of the signal ga3; and input the high level of the third clock signal input to the $2^{nd}$ drive clock signal terminal CLK_2 to the $2^{nd}$ drive output terminal GO_2, as the high level output of the signal ga4, so as to realize the output process of the gate turn-on signals. Each of the remaining shift register units may input the low-level signal input to the $1^{st}$ drive clock signal terminal CLK_1 to the $1^{st}$ drive output terminal GO_1, and input the low-level signal input to the $2^{nd}$ drive clock signal terminal CLK_2 to the $2^{nd}$ drive output terminal GO_2, as the low-level gate turn-off signals in the signals ga1 to ga2 and ga5 to ga6, so as to realize the output process of the gate turn-off signals. In this way, the cascade circuit in the gate drive circuit can realize the cascade control function, and the output circuit can realize the output function of the gate turn-on signal, so that the cascade control function is separated from the output function of the gate turn-on signal. The gate turn-on signal may be output as needed, and then cooperate with the data voltage output of the source drive circuit to selectively refresh the changed part of the picture, that is, partial refresh, so as to reduce the operating power consumption of the overall display device under the condition of the unchanged refresh frequency.

Figure 16:
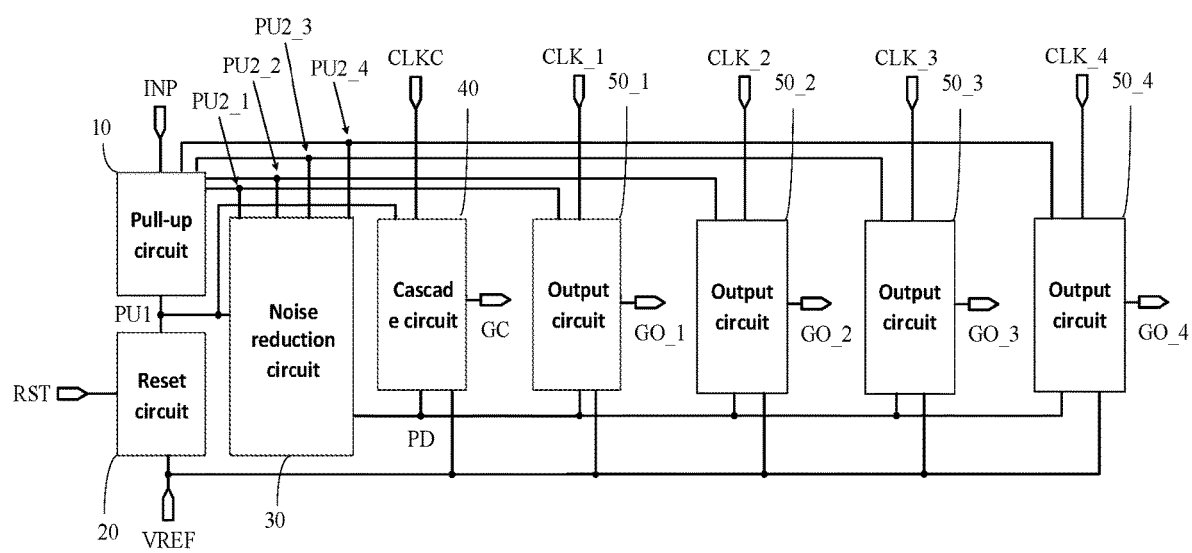
FIG. 16 is a schematic structural diagram of yet other shift register units according to an embodiment of the disclosure.

Embodiments of the present invention provide yet other structural schematic diagrams of the array substrate, as shown in FIG. 16, which is modified from the implementations in the above embodiments. Only the differences between below embodiments and the above embodiments are illustrated below, and the similarities thereof are not repeated here.

In yet other embodiments of the disclosure, K may also be equal to 4. Exemplarily, as shown in FIG. 16, the shift register unit may include 4 output circuits: a $1^{st}$ output circuit 50_1 to a $4^{th}$ output circuit 504. Here, the $1^{st}$ output circuit 50_1 is configured to provide the signal of the $1^{st}$ drive clock signal terminal CLK_1 to the $1^{st}$ drive output terminal GO_1 in response to the signal of the $1^{st}$ second pull-up node PU2_1, and provides the signal of the reference voltage signal terminal VREF to the $1^{st}$ drive output terminal GO_1 in response to the signal of the pull-down node PD. The $2^{nd}$ output circuit 50_2 is configured to provide the signal of the $2^{nd}$ drive clock signal terminal CLK_2 to the $2^{nd}$ drive output terminal GO_2 in response to the signal of the $2^{nd}$ second pull-up node PU2_2, and provide the signal of the reference voltage signal terminal VREF to the $2^{nd}$ drive output terminal GO_2 in response to the signal of the pull-down node PD. The $3^{rd}$ output circuit 503 is configured to provide the signal of the $3^{rd}$ drive clock signal terminal CLK_3 to the $3^{rd}$ drive output terminal GO_3 in response to the signal of the $3^{rd}$ second pull-up node PU2_3, and provide the signal of the reference voltage signal terminal VREF to the $3^{rd}$ drive output terminal GO_3 in response to the signal of the pull-down node PD. The $4^{th}$ output circuit 50_4 is configured to provide the signal of the $4^{th}$ drive clock signal terminal CLK_4 to the $4^{th}$ drive output terminal GO_4 in response to the signal of the $4^{th}$ second pull-up node PU2_4, and provide the signal of the reference voltage signal terminal VREF to the $4^{th}$ drive output terminal GO_4 in response to the signal of the pull-down node PD.

Figure 17:
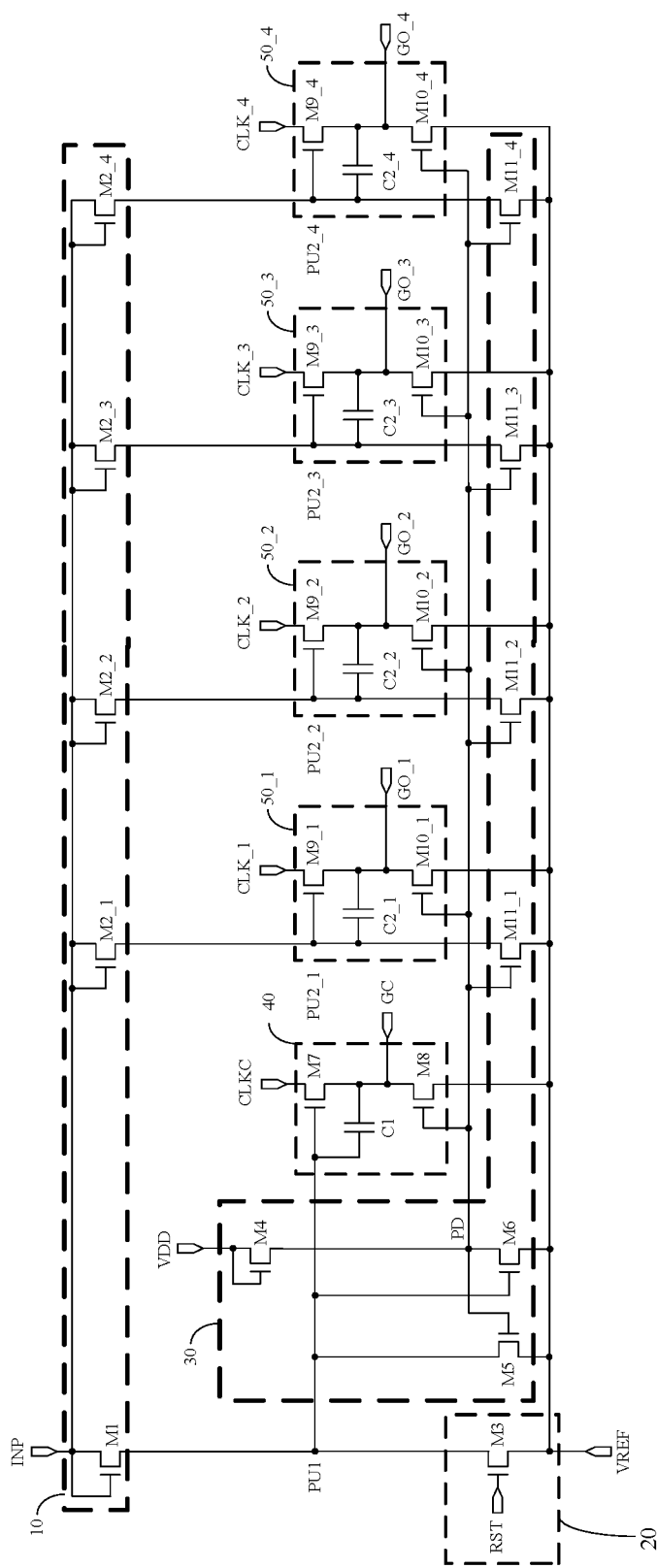
FIG. 17 is a schematic diagram of specific structures of yet other shift register units according to an embodiment of the disclosure.

In some embodiments of the disclosure, as shown in FIG. 17, the pull-up circuit 10 may include a first transistor M1 and four second transistors: a $1^{st}$ second transistor M2_1 to a $4^{th}$ second transistor M2_4. Here, the $1^{st}$ second transistor M2_1 corresponds to the $1^{st}$ output circuit 50_1, and the $2^{nd}$ second transistor M2_2 corresponds to the $2^{nd}$ output circuit 50_2, the $3^{rd}$ second transistor M2_3 corresponds to the $3^{rd}$ output circuit 50_3, and the $4^{th}$ second transistor M2_4 corresponds to the $4^{th}$ output circuit 50_4.

Exemplarily, as shown in FIG. 17, the gate electrode and the first electrode of the $1^{st}$ second transistor M2_1 are both coupled to the input signal terminal INP, and the second electrode of the $1^{st}$ second transistor M2_1 is coupled to the $1^{st}$ second pull-up node PU2_1. Optionally, the $1^{st}$ second transistor M2_1 is turned on under the control of the active level of the signal of the input signal terminal INP, and is turned off under the control of the inactive level of the signal of the input signal terminal INP. For example, the $1^{st}$ second transistor M2_1 may be set as an N-type transistor, and then the active level is high level and the inactive level is low level for the signal of the input signal terminal INP. Alternatively, the $1^{st}$ second transistor M2_1 may also be set as a P-type transistor, and then the active level is low level and the inactive level is high level for the signal of the input signal terminal INP.

Exemplarily, as shown in FIG. 17, the gate electrode and the first electrode of the $2^{nd}$ second transistor M2_2 are both coupled to the input signal terminal INP, and the second electrode of the $2^{nd}$ second transistor M2_2 is coupled to the $2^{nd}$ second pull-up node PU2_2. Optionally, the $2^{nd}$ second transistor M2_2 is turned on under the control of the active level of the signal of the input signal terminal INP, and is turned off under the control of the inactive level of the signal of the input signal terminal INP. For example, the $2^{nd}$ second transistor M2_2 may be set as an N-type transistor, and then the active level is high level and the inactive level is low level for the signal of the input signal terminal INP. Alternatively, the $2^{nd}$ second transistor M2_2 may also be set as a P-type transistor, and then the active level is low level and the inactive level is high level for the signal of the input signal terminal INP.

Exemplarily, as shown in FIG. 17, the gate electrode and the first electrode of the $3^{rd}$ second transistor M2_3 are both coupled to the input signal terminal INP, and the second electrode of the $3^{rd}$ second transistor M2_3 is coupled to the $3^{rd}$ second pull-up node PU2_3. Optionally, the $3^{rd}$ second transistor M2_3 is turned on under the control of the active level of the signal of the input signal terminal INP, and is turned off under the control of the inactive level of the signal of the input signal terminal INP. For example, the $3^{rd}$ second transistor M2_3 may be set as an N-type transistor, and then the active level is high level and the inactive level is low level for the signal of the input signal terminal INP. Alternatively, the $3^{rd}$ second transistor M2_3 may also be set as a P-type transistor, and then the active level is low level and the inactive level is high level for the signal of the input signal terminal INP.

Exemplarily, as shown in FIG. 17, the gate electrode and the first electrode of the $4^{th}$ second transistor M2_4 are both coupled to the input signal terminal INP, and the second electrode of the $4^{th}$ second transistor M2_4 is coupled to the $4^{th}$ second pull-up node PU2_4. Optionally, the $4^{th}$ second transistor M2_4 is turned on under the control of the active level of the signal of the input signal terminal INP, and is turned off under the control of the inactive level of the signal of the input signal terminal INP. For example, the $4^{th}$ second transistor M2_4 may be set as an N-type transistor, and then the active level is high level and the inactive level is low level for the signal of the input signal terminal INP. Alternatively, the $4^{th}$ second transistor M2_4 may also be set as a P-type transistor, and then the active level is low level and the inactive level is high level for the signal of the input signal terminal INP.

In some embodiments of the disclosure, as shown in FIG. 17, the $1^{st}$ output circuit 50_1 may include: a $1^{st}$ ninth transistor M9_1, a $1^{st}$ tenth transistor M10_1, and a $1^{st}$ second capacitor C2_1. Here, the gate electrode of the $1^{st}$ ninth transistor M9_1 is coupled to the $1^{st}$ second pull-up node PU2_1, the first electrode of the $1^{st}$ ninth transistor M9_1 is coupled to the $1^{st}$ drive clock signal terminal CLK_1, and the second electrode of the $1^{st}$ ninth transistor M9_1 is coupled to the $1^{st}$ drive output terminal GO_1. The gate electrode of the $1^{st}$ tenth transistor M10_1 is coupled to the pull-down node PD, the first electrode of the $1^{st}$ tenth transistor M10_1 is coupled to the reference voltage signal terminal VREF, and the second electrode of the $1^{st}$ tenth transistor M10_1 is coupled to the $1^{st}$ drive output terminal GO_1. The $1^{st}$ second capacitor C2_1 is coupled between the $1^{st}$ second pull-up node PU2_1 and the $1^{st}$ drive output terminal GO_1.

In some embodiments of the disclosure, as shown in FIG. 17, the $2^{nd}$ output circuit 50_2 may include: a $2^{nd}$ ninth transistor M9_2, a $2^{nd}$ tenth transistor M10_2, and a $2^{nd}$ second capacitor C2_2. Here, the gate electrode of the $2^{nd}$ ninth transistor M9_2 is coupled to the $2^{nd}$ second pull-up node PU2_2, the first electrode of the $2^{nd}$ ninth transistor M9_2 is coupled to the $2^{nd}$ drive clock signal terminal CLK_2, and the second electrode of the $2^{nd}$ ninth transistor M9_2 is coupled to the $2^{nd}$ drive output terminal GO_2. The gate electrode of the $2^{nd}$ tenth transistor M10_2 is coupled to the pull-down node PD, the first electrode of the $2^{nd}$ tenth transistor M10_2 is coupled to the reference voltage signal terminal VREF, and the second electrode of the $2^{nd}$ tenth transistor M10_2 is coupled to the $2^{nd}$ drive output terminal GO_2. The $2^{nd}$ second capacitor C2_2 is coupled between the $2^{nd}$ second pull-up node PU2_2 and the $2^{nd}$ drive output terminal GO_2.

In some embodiments of the disclosure, as shown in FIG. 17, the $3^{rd}$ output circuit 50_3 may include: a $3^{rd}$ ninth transistor M9_3, a $3^{rd}$ tenth transistor M10_3, and a $3^{rd}$ second capacitor C2_3. Here, the gate electrode of the $3^{rd}$ ninth transistor M9_3 is coupled to the $3^{rd}$ second pull-up node PU2_3, the first electrode of the $3^{rd}$ ninth transistor M9_3 is coupled to the $3^{rd}$ drive clock signal terminal CLK_3, and the second electrode of the $3^{rd}$ ninth transistor M9_3 is coupled to the $3^{rd}$ drive output terminal GO_3. The gate electrode of the $3^{rd}$ tenth transistor M10_3 is coupled to the pull-down node PD, the first electrode of the $3^{rd}$ tenth transistor M10_3 is coupled to the reference voltage signal terminal VREF, and the second electrode of the $3^{rd}$ tenth transistor M10_3 is coupled to the $3^{rd}$ drive output terminal GO_3. The $3^{rd}$ second capacitor C2_3 is coupled between the $3^{rd}$ second pull-up node PU2_3 and the $3^{rd}$ drive output terminal GO_3.

Optionally, as shown in FIG. 17, the $3^{rd}$ ninth transistor M9_3 is turned on under the control of the active level of the signal of the $3^{rd}$ second pull-up node PU2_3, and is turned off under the control of the inactive level of the signal of the $3^{rd}$ second pull-up node PU2_3. For example, the $3^{rd}$ ninth transistor M9_3 may be set as an N-type transistor, and then the active level is high level and the inactive level is low level for the signal of the $3^{rd}$ second pull-up node PU2_3. Alternatively, the $3^{rd}$ ninth transistor M9_3 may also be set as a P-type transistor, and then the active level is low level and the inactive level is high level for the signal of the $3^{rd}$ second pull-up node PU2_3.

Optionally, as shown in FIG. 17, the $3^{rd}$ tenth transistor M10_3 is turned on under the control of the active level of the signal of the pull-down node PD, and is turned off under the control of the inactive level of the signal of the pull-down node PD. For example, the $3^{rd}$ tenth transistor M10_3 may be set as an N-type transistor, and then the active level is high level and the inactive level is low level for the signal of the pull-down node PD. Alternatively, the $3^{rd}$ tenth transistor M10_3 may also be set as a P-type transistor, and then the active level is low level and the inactive level is high level for the signal of the pull-down node PD.

In some embodiments of the disclosure, as shown in FIG. 17, the $4^{th}$ output circuit 50_4 may include: a $4^{th}$ ninth transistor M9_4, a $4^{th}$ tenth transistor M10_4, and a $4^{th}$ second capacitor C2_4. Here, the gate electrode of the $4^{th}$ ninth transistor M9_4 is coupled to the $4^{th}$ second pull-up node PU2_4, the first electrode of the $4^{th}$ ninth transistor M9_4 is coupled to the $4^{th}$ drive clock signal terminal CLK_4, and the second electrode of the $4^{th}$ ninth transistor M9_4 is coupled to the $4^{th}$ drive output terminal GO_4. The gate electrode of the $4^{th}$ tenth transistor M10_4 is coupled to the pull-down node PD, the first electrode of the $4^{th}$ tenth transistor M10_4 is coupled to the reference voltage signal terminal VREF, and the second electrode of the $4^{th}$ tenth transistor M10_4 is coupled to the $4^{th}$ drive output terminal GO_4. The $4^{th}$ second capacitor C2_4 is coupled between the $4^{th}$ second pull-up node PU2_4 and the $4^{th}$ drive output terminal GO_4.

Optionally, as shown in FIG. 17, the $4^{th}$ ninth transistor M9_4 is turned on under the control of the active level of the signal of the $4^{th}$ second pull-up node PU2_4, and is turned off under the control of the inactive level of the signal of the $4^{th}$ second pull-up node PU2_4. For example, the $4^{th}$ ninth transistor M9_4 may be set as an N-type transistor, and then the active level is high level and the inactive level is low level for the signal of the $4^{th}$ second pull-up node PU2_4. Alternatively, the $4^{th}$ ninth transistor M9_4 may also be set as a P-type transistor, and then the active level is low level and the inactive level is high level for the signal of the $4^{th}$ second pull-up node PU2_4.

Optionally, as shown in FIG. 17, the $4^{th}$ tenth transistor M10_4 is turned on under the control of the active level of the signal of the pull-down node PD, and is turned off under the control of the inactive level of the signal of the pull-down node PD. For example, the $4^{th}$ tenth transistor M10_4 may be set as an N-type transistor, and then the active level is high level and the inactive level is low level for the signal of the pull-down node PD. Alternatively, the $4^{th}$ tenth transistor M10_4 may also be set as a P-type transistor, and then the active level is low level and the inactive level is high level for the signal of the pull-down node PD.

Figure 18:
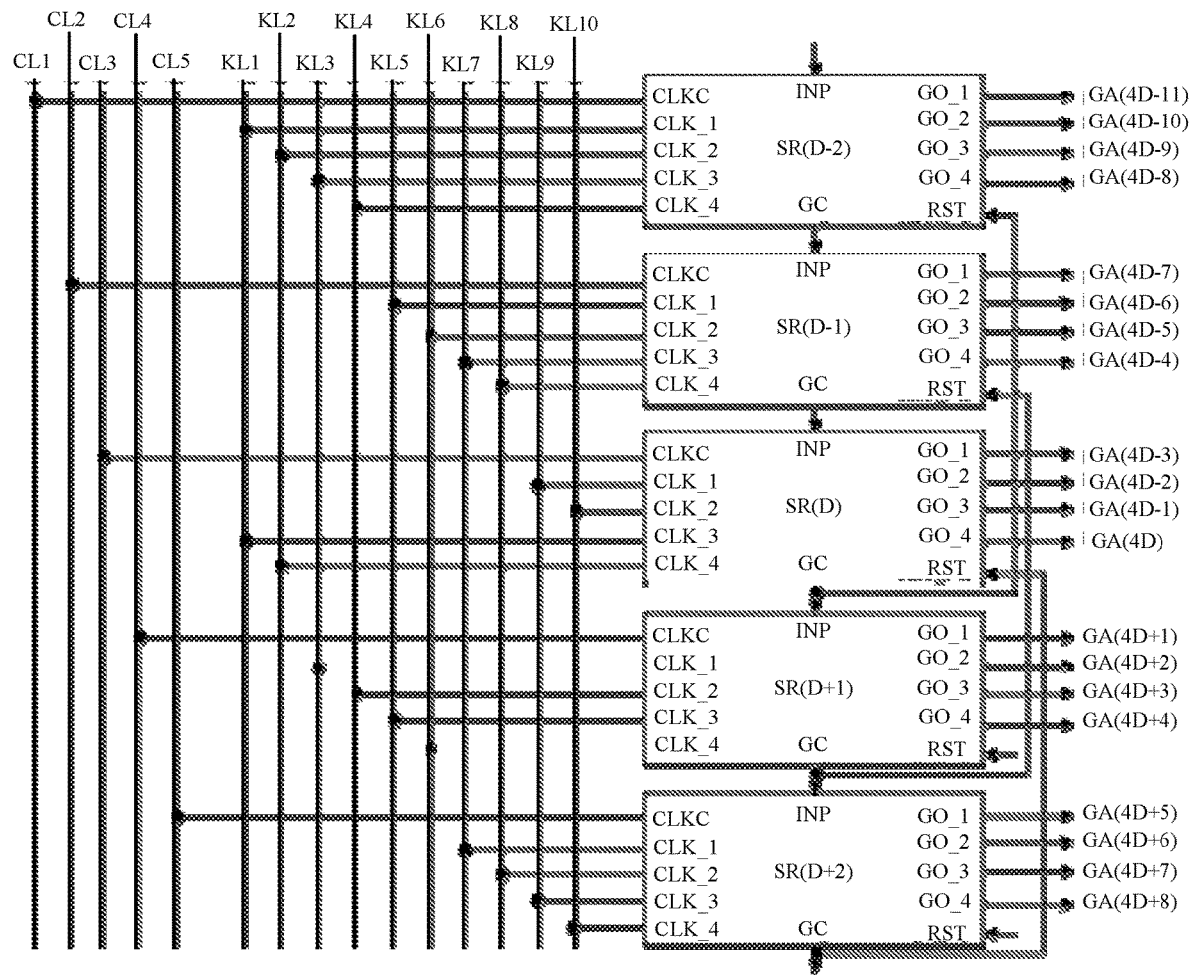
FIG. 18 is a schematic structural diagram of yet other gate drive circuits according to an embodiment of the disclosure.

In some embodiments of the disclosure, as shown in FIG. 18, the input signal terminal INP of the $1^{st}$ shift register unit is coupled to the frame start signal terminal, and the cascade output terminal GC of the $D^{th}$ shift register unit is coupled to the reset signal terminal RST of the $D-2^{th}$ shift register unit and the input signal terminal INP of the $D+1^{th}$ shift register unit respectively, where D is positive integer.

Exemplarily, as shown in FIG. 18, in the $D-2^{th}$ shift register unit, the $1^{st}$ drive output terminal GO_1 is coupled to the gate line GA(4D−11), the $2^{nd}$ drive output terminal GO_2 is coupled to the gate line GA(4D−10), the $3^{rd}$ drive output terminal GO_3 is coupled to the gate line GA(4D−9), and the $4^{th}$ drive output terminal GO_4 is coupled to the gate line GA(4D−8).

In the $D-1^{th}$ shift register unit, the $1^{st}$ drive output terminal GO_1 is coupled to the gate line GA(4D−7), the $2^{nd}$ drive output terminal GO_2 is coupled to the gate line GA(4D−6), the $3^{rd}$ drive output terminal GO_3 is coupled to the gate line GA(4D−5), and the $4^{th}$ drive output terminal GO_4 is coupled to the gate line GA(4D−4).

In the $D^{th}$ shift register unit, the $1^{st}$ drive output terminal GO_1 is coupled to the gate line GA(4D−3), the $2^{nd}$ drive output terminal GO_2 is coupled to the gate line GA(4D−2), the $3^{rd}$ drive output terminal GO_3 is coupled to the gate line GA(4D−1), and the $4^{th}$ drive output terminal GO_4 is coupled to the gate line GA(4D).

In the $D+1^{th}$ shift register unit, the $1^{st}$ drive output terminal GO_1 is coupled to the gate line GA(4D+1), the $2^{nd}$ drive output terminal GO_2 is coupled to the gate line GA(4D+2), the $3^{rd}$ drive output terminal GO_3 is coupled to the gate line GA(4D+3), and the $4^{th}$ drive output terminal GO_4 is coupled to the gate line GA(4D+4).

In the $D+2^{th}$ shift register unit, the $1^{st}$ drive output terminal GO_1 is coupled to the gate line GA(4D+5), the $2^{nd}$ drive output terminal GO_2 is coupled to the gate line GA(4D+6), the $3^{rd}$ drive output terminal GO_3 is coupled to the gate line GA(4D+7), and the $4^{th}$ drive output terminal GO_4 is coupled to the gate line GA(4D+8).

In some embodiments of the disclosure, as shown in FIG. 18, the array substrate further includes 5 cascade clock signal lines and 10 drive clock signal lines. Here, the first clock signal clkc1 transmitted on the $1^{st}$ cascade clock signal line CL1 among the 5 cascade clock signal lines is the same as the second clock signal clk1$b$ transmitted on the $1^{st}$ drive clock signal line KL1 among the 10 drive clock signal lines. The first clock signal clkc2 transmitted on the $2^{nd}$ cascade clock signal line CL2 among the 5 cascade clock signal lines is the same as the second clock signal clk5$b$ transmitted on the $5^{th}$ drive clock signal line KL5 among the 10 drive clock signal lines. The first clock signal clkc3 transmitted on the $3^{rd}$ cascade clock signal line CL3 among the 5 cascade clock signal lines is the same as the second clock signal clk9$b$ transmitted on the $9^{th}$ drive clock signal line KL9 among the 10 drive clock signal lines. The first clock signal clkc4 transmitted on the $4^{th}$ cascade clock signal line CL4 among the 5 cascade clock signal lines is the same as the second clock signal clk3$b$ transmitted on the $3^{rd}$ drive clock signal line KL3 among the 10 drive clock signal lines. The first clock signal clkc5 transmitted on the $5^{th}$ cascade clock signal line CL5 among the 5 cascade clock signal lines is the same as the second clock signal clk7$b$ transmitted on the $7^{th}$ drive clock signal line KL7 among the 10 drive clock signal lines.

Figure 19:
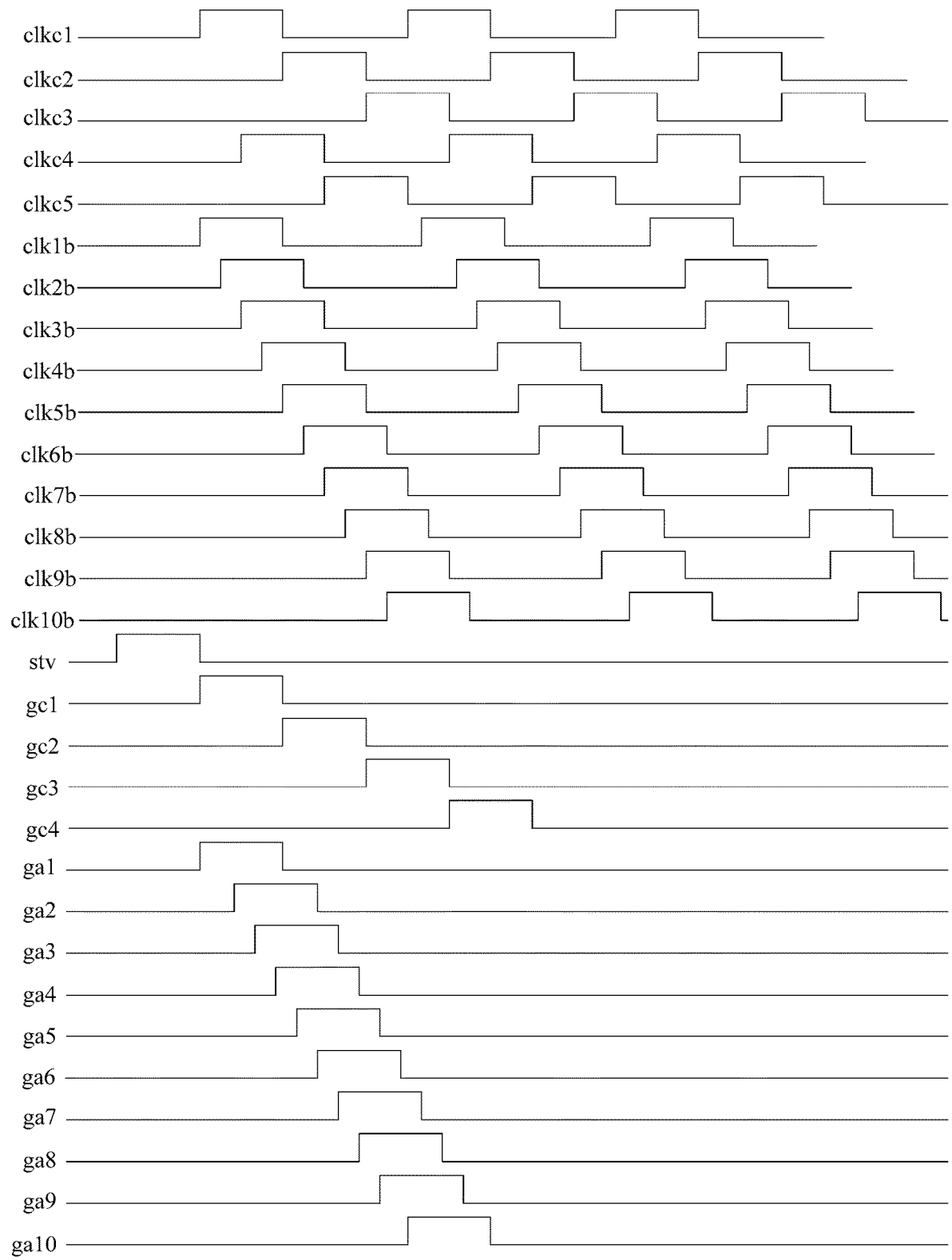
FIG. 19 is a timing diagram of yet other signals according to an embodiment of the disclosure.
Figure 20:
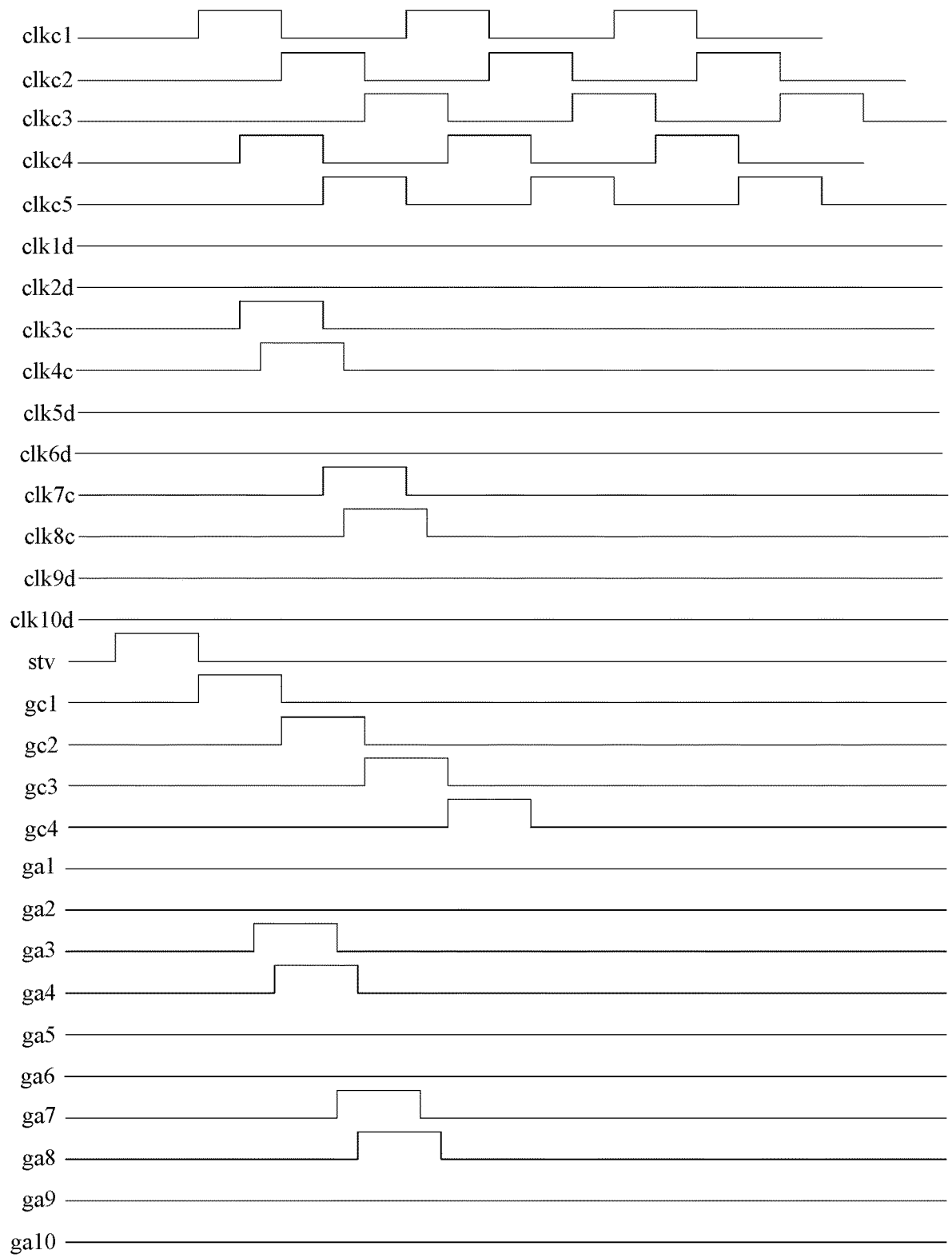
FIG. 20 is a timing diagram of yet other signals according to an embodiment of the disclosure.

In some embodiments of the disclosure, as shown in FIG. 18 to FIG. 20, the cascade clock signal terminal CLKC of the 5z−$4^{th}$ shift register unit is coupled to the $1^{st}$ cascade clock signal line CL1, to input the first clock signal clkc1 through the $1^{st}$ cascade clock signal line CL1. The cascade clock signal terminal CLKC of the 5z−$3^{th}$ shift register unit is coupled to the $2^{nd}$ cascade clock signal line CL2, to input the first clock signal clkc2 through the $2^{nd}$ cascade clock signal line CL2. The cascade clock signal terminal CLKC of the 5z−$2^{th}$ shift register unit is coupled to the $3^{rd}$ cascade clock signal line CL3, to input the first clock signal clkc3 through the $3^{rd}$ cascade clock signal line CL3. The cascade clock signal terminal CLKC of the 5z−$1^{th}$ shift register unit is coupled to the $4^{th}$ cascade clock signal line CL4, to input the first clock signal clkc4 through the $4^{th}$ cascade clock signal line CL4. The cascade clock signal terminal CLKC of the 5z$^{th}$ shift register unit is coupled to the $5^{th}$ cascade clock signal line CL5, to input the first clock signal clkc5 through the $5^{th}$ cascade clock signal line CL5. Here, z is a positive integer.

In some embodiments of the disclosure, as shown in FIG. 18 to FIG. 20, the $1^{st}$ drive clock signal terminal CLK_1 of the 5r−$4^{th}$ shift register unit is coupled to the $1^{st}$ drive clock signal line KL1, to input a corresponding signal through the $1^{st}$ drive clock signal line KL1. The $2^{nd}$ drive clock signal terminal CLK_2 of the 5r−$4^{th}$ shift register unit is coupled to the $2^{nd}$ drive clock signal line KL2, to input a corresponding signal through the $2^{nd}$ drive clock signal line KL2. The $3^{rd}$ drive clock signal terminal CLK_3 of the 5r−$4^{th}$ shift register unit is coupled to the $3^{rd}$ drive clock signal line KL3, to input a corresponding signal through the $3^{rd}$ drive clock signal line KL3. The $4^{th}$ drive clock signal terminal CLK_4 of the 5r−$4^{th}$ shift register unit is coupled to the $4^{th}$ drive clock signal line KL4, to input a corresponding signal through the 4$^{th}$ drive clock signal line KL4. Here, r is a positive integer.

The 1$^{st}$ drive clock signal terminal CLK_1 of the 5r–3$^{th}$ shift register unit is coupled to the 5$^{th}$ drive clock signal line KL5, to input a corresponding signal through the 5$^{th}$ drive clock signal line KL5. The 2$^{nd}$ drive clock signal terminal CLK_2 of the 5r–3$^{th}$ shift register unit is coupled to the 6$^{th}$ drive clock signal line KL6, to input a corresponding signal through the 6$^{th}$ drive clock signal line KL6. The 3$^{rd}$ drive clock signal terminal CLK_3 of the 5r–3$^{th}$ shift register unit is coupled to the 7$^{th}$ drive clock signal line KL7, to input a corresponding signal through the 7$^{th}$ drive clock signal line KL7. The 4$^{th}$ drive clock signal terminal CLK_4 of the 5r–3$^{th}$ shift register unit is coupled to the 8$^{th}$ drive clock signal line KL8, to input a corresponding signal through the 8$^{th}$ drive clock signal line KL8.

The 1$^{st}$ drive clock signal terminal CLK_1 of the 5r–2$^{th}$ shift register unit is coupled to the 9$^{th}$ drive clock signal line KL9, to input a corresponding signal through the 9$^{th}$ drive clock signal line KL9. The 2$^{nd}$ drive clock signal terminal CLK_2 of the 5r–2$^{th}$ shift register unit is coupled to the 10$^{th}$ drive clock signal line KL10, to input a corresponding signal through the 10$^{th}$ drive clock signal line KL10. The 3$^{rd}$ drive clock signal terminal CLK_3 of the 5r–2$^{th}$ shift register unit is coupled to the 1$^{st}$ drive clock signal line KL1, to input a corresponding signal through the 1$^{st}$ drive clock signal line KL1. The 4$^{th}$ drive clock signal terminal CLK_4 of the 5r–2$^{th}$ shift register unit is coupled to the 2$^{nd}$ drive clock signal line KL2, to input a corresponding signal through the 2$^{nd}$ drive clock signal line KL2.

The 1$^{st}$ drive clock signal terminal CLK_1 of the 5r–1$^{th}$ shift register unit is coupled to the 3$^{rd}$ drive clock signal line KL3, to input a corresponding signal through the 3$^{rd}$ drive clock signal line KL3. The 2$^{nd}$ drive clock signal terminal CLK_2 of the 5r–1$^{th}$ shift register unit is coupled to the 4$^{th}$ drive clock signal line KL4, to input a corresponding signal through the 4$^{th}$ drive clock signal line KL4. The 3$^{rd}$ drive clock signal terminal CLK_3 of the 5r–1$^{th}$ shift register unit is coupled to the 5$^{th}$ drive clock signal line KL5, to input a corresponding signal through the 5$^{th}$ drive clock signal line KL5. The 4$^{th}$ drive clock signal terminal CLK_4 of the 5r–1$^{th}$ shift register unit is coupled to the 6$^{th}$ drive clock signal line KL6, to input a corresponding signal through the 6$^{th}$ drive clock signal line KL6.

The 1$^{st}$ drive clock signal terminal CLK_1 of the 5r$^{th}$ shift register unit is coupled to the 7$^{th}$ drive clock signal line KL7, to input a corresponding signal through the 7$^{th}$ drive clock signal line KL7. The 2$^{nd}$ drive clock signal terminal CLK_2 of the 5r$^{th}$ shift register unit is coupled to the 8$^{th}$ drive clock signal line KL8, to input a corresponding signal through the 8$^{th}$ drive clock signal line KL8. The 3$^{rd}$ drive clock signal terminal CLK_3 of the 5r$^{th}$ shift register unit is coupled to the 9$^{th}$ drive clock signal line KL9, to input a corresponding signal through the 9$^{th}$ drive clock signal line KL9. The 4$^{th}$ drive clock signal terminal CLK_4 of the 5r$^{th}$ shift register unit is coupled to the 10$^{th}$ drive clock signal line KL10, to input a corresponding signal through the 10$^{th}$ drive clock signal line KL10.

In some embodiments of the disclosure, in one clock cycle of the first clock signal, the duration of the active level accounts for no more than ⅔ of the clock cycle of the first clock signal. Exemplarily, as shown in FIGS. 19 and 20, taking the active level as high level as an example, in one clock cycle of the first clock signal, the duration of the high level accounts for no more than ⅔ (for example, may be 0.4, 0.3, 0.2, 0.1, etc., which is not limited here) of the clock cycle of the first clock signal.

In some embodiments of the disclosure, in one clock cycle of the second clock signal, the duration of the active level accounts for no more than ⅔ of the clock cycle of the second clock signal. Exemplarily, as shown in FIGS. 19 and 20, taking the active level as high level as an example, in one clock cycle of the second clock signal, the duration of the high level accounts for no more than ⅔ (for example, may be 0.4, 0.3, 0.2, 0.1, etc., which is not limited here) of the clock cycle of the second clock signal.

Exemplarily, as shown in FIGS. 19 and 20, taking the active level as high level as an example, the high level in one clock cycle has the same duration in the first clock signal, the second clock signal and the third clock signal.

Exemplarily, taking K=4 as an example, in the first driving mode, the first clock signal with an active level and an inactive level alternating periodically is loaded to the cascade clock signal terminal CLKC of each shift register unit so that the cascade output terminal GC of the shift register unit outputs a cascade signal, and the second clock signal with an active level and an inactive level alternating periodically is loaded to the 1$^{st}$ drive clock signal terminal CLK_1 to the 4$^{th}$ drive clock signal terminal CLK_4 of each shift register unit respectively, so that the 1$^{st}$ drive output terminal GO_1 to the 4$^{th}$ drive output terminal GO_4 output gate turn-on signals respectively.

Exemplarily, in the first driving mode, the first clock signal is input to the cascade clock signal terminal CLKC through the cascade clock signal line, and the second clock signal is input to the drive clock signal terminal through the drive clock signal line. Exemplarily, as shown in FIG. 19, stv represents the signal of the frame start signal terminal, clkc1 represents the first clock signal transmitted on the 1$^{st}$ cascade clock signal line CL1, clkc2 represents the first clock signal transmitted on the 2$^{nd}$ cascade clock signal line CL2, clkc3 represents the first clock signal transmitted on the 3$^{rd}$ cascade clock signal line CL3, clkc4 represents the first clock signal transmitted on the 4$^{th}$ cascade clock signal line CL4, clkc5 represents the first clock signal transmitted on the 5$^{th}$ cascade clock signal line CL5, clk1b represents the second clock signal transmitted on the 1$^{st}$ drive clock signal line KL1, clk2b represents the second clock signal transmitted on the 2$^{nd}$ drive clock signal line KL2, clk3b represents the second clock signal transmitted on the 3$^{rd}$ drive clock signal line KL3, clk4b represents the second clock signal transmitted on the 4$^{th}$ drive clock signal line KL4, clk5b represents the second clock signal transmitted on the 5$^{th}$ drive clock signal line KL5, clk6b represents the second clock signal transmitted on the 6$^{th}$ drive clock signal line KL6, clk7b represents the second clock signal transmitted on the 7$^{th}$ drive clock signal line KL7, clk8b represents the second clock signal transmitted on the 8$^{th}$ drive clock signal line KL8, clk9b represents the second clock signal transmitted on the 9$^{th}$ drive clock signal line KL9, and clk10b represents the second clock signal transmitted on the 10$^{th}$ drive clock signal line KL10. gc1 to gc4 represent the cascade signals output by the cascade output terminals GC of the 1$^{st}$ to 4$^{th}$ shift register units, and ga1 to ga10 represent signals output by the drive output terminals of the 1$^{st}$ to 3$^{rd}$ shift register units onto the gate lines GA1 to GA10, where the high level in the signals ga1 to ga10 is the gate turn-on signal, and the low level in the signals ga1 to ga10 is the gate turn-off signal. Also, each shift register unit may input the high level of the first clock signal input to the cascade clock signal terminal CLKC to the cascade output terminal GC, as the high level output of the cascade signals gc1 to gc4, so as to realize the output process of the cascade signals gc1 to gc4. And, each shift register unit may input the high level of the second clock signal input to the 1$^{st}$ drive clock signal terminal CLK_1 to the 1$^{st}$ drive output terminal GO_1, as the high-level gate turn-on signal in the signals ga1, ga5 and ga9; and each shift register unit may input the high level of the second clock signal input to the 2$^{nd}$ drive clock signal terminal CLK_2 to the 2$^{nd}$ drive output terminal GO_2, as the high-level gate turn-on signal in the signals ga2, ga6 and ga10, so as to realize the output process of the gate turn-on signal. And, each shift register unit may input the high level of the second clock signal input to the 3$^{rd}$ drive clock signal terminal CLK_3 to the 3$^{rd}$ drive output terminal GO_3, as the high-level gate turn-on signal in the signals ga3 and ga7, so as to realize the output process of the gate turn-on signal. And, each shift register unit may input the high level of the second clock signal input to the 4$^{th}$ drive clock signal terminal CLK_4 to the 4$^{th}$ drive output terminal GO_4, as the high-level gate turn-on signal in the signals ga4 and ga8, so as to realize the output process of the gate turn-on signal. Thus the gate drive circuit can output the gate turn-on signal row by row. Therefore, when the display device displays a picture, the timing controller controls the gate drive circuit to output the gate turn-on signal (that is, the high level in the gate turn-on signal) to the pixel area row by row from top to bottom, and the gates of the transistors in the sub-pixel rows are turned on row by row while the source drive circuit outputs the sub-pixel display data and writes it into the corresponding sub-pixel row, so that the sub-pixels in the pixel area refresh the display data row by row. After all rows are refreshed, the refresh of the overall display picture is achieved.

Exemplarily, taking K=4 as an example, in the second driving mode, the first clock signal is loaded to the cascade clock signal terminal CLKC of each shift register unit so that the cascade output terminal GC of the shift register unit outputs a cascade signal, and the third clock signal with the active level appearing within the target time period is loaded to the target drive clock signal terminals (i.e., the 3$^{rd}$ drive clock signal terminal CLK_3 and the 4$^{th}$ drive clock signal terminal CLK_4 of the 1$^{st}$ shift register unit, and the 3$^{rd}$ drive clock signal terminal CLK_3 and the 4$^{th}$ drive clock signal terminal CLK_4 of the 2$^{nd}$ shift register unit) of the target shift register units (taking the drive gate lines GA3 to GA4 and GA7 to GA8 as an example, the target shift register units include the 1$^{st}$ shift register unit and the 2$^{nd}$ shift register unit), so that the target drive output terminals (i.e., the 3$^{rd}$ drive output terminal GO_3 and the 4$^{th}$ drive output terminal GO_4 of the 1$^{st}$ shift register unit, and the 3$^{rd}$ drive output terminal GO_3 and the 4$^{th}$ drive output terminal GO_4 of the 2$^{nd}$ shift register unit) corresponding to the target drive clock signal terminals (i.e., the 3$^{rd}$ drive clock signal terminal CLK_3 and the 4$^{th}$ drive clock signal terminal CLK_4 of the 1$^{st}$ shift register unit, and the 3$^{rd}$ drive clock signal terminal CLK_3 and the 4$^{th}$ drive clock signal terminal CLK_4 of the 2$^{nd}$ shift register unit) output gate turn-on signals.

For example, as shown in FIG. 20, clkc1 represents the first clock signal transmitted on the 1$^{st}$ cascade clock signal line CL1, clkc2 represents the first clock signal transmitted on the 2$^{nd}$ cascade clock signal line CL2, clkc3 represents the first clock signal transmitted on the 3$^{rd}$ cascade clock signal line CL3, clkc4 represents the first clock signal transmitted on the 4$^{th}$ cascade clock signal line CL4, and clkc5 represents the first clock signal transmitted on the 5$^{th}$ cascade clock signal line CL5. clk1$d$ represents the inactive level (such as low level) signal transmitted on the 1$^{st}$ drive clock signal line KL1, clk2$d$ represents the inactive level (such as low level) signal transmitted on the 2$^{nd}$ drive clock signal line KL2, clk3$c$ represents the third clock signal transmitted on the 3$^{rd}$ drive clock signal line KL3, clk4$c$ represents the third clock signal transmitted on the 4$^{th}$ drive clock signal line KL4, clk5$d$ represents the inactive level (such as low level) signal transmitted on the 5$^{th}$ drive clock signal line KL5, clk6$d$ represents the inactive level (such as low level) signal transmitted on the 6$^{th}$ drive clock signal line KL6, clk7$c$ represents the third clock signal transmitted on the 7$^{th}$ drive clock signal line KL7, clk8$c$ represents the third clock signal transmitted on the 8$^{th}$ drive clock signal line KL8, clk9$d$ represents the inactive level (such as low level) signal transmitted on the 9$^{th}$ drive clock signal line KL9, and clk10$d$ represents the inactive level (such as low level) signal transmitted on the 10$^{th}$ drive clock signal line KL10. Exemplarily, in the second driving mode, the first clock signal is input to the cascade clock signal terminal CLKC through the cascade clock signal line, and the third clock signal is input to the drive clock signal terminal through the drive clock signal line. Exemplarily, as shown in FIG. 20, stv represents the signal of the frame start signal terminal, and gc1 to gc4 represent the cascade signals output by the cascade output terminals GC of the 1$^{st}$ to 4$^{th}$ shift register units. ga1 to ga2 represent gate turn-off signals (such as low level) output by the 1$^{st}$ drive output terminal GO_1 and the 2$^{nd}$ drive output terminal GO_2 of the 1$^{st}$ shift register unit onto the gate lines GA1 to GA2. ga3 to ga4 represent signals output by the 3$^{rd}$ drive output terminal GO_3 and the 4$^{th}$ drive output terminal GO_4 of the 1$^{st}$ shift register unit onto the gate lines GA3 to GA4, where the high level is the gate turn-on signal, and the low level is the gate turn-off signal. ga5 to ga6 represent gate turn-off signals (such as low level) output by the 1$^{st}$ drive output terminal GO_1 and the 2$^{nd}$ drive output terminal GO_2 of the 2$^{nd}$ shift register unit onto the gate lines GA5 to GA6. ga7 to ga8 represent gate turn-on signals output by the 3$^{rd}$ drive output terminal GO_3 and the 4$^{th}$ drive output terminal GO_4 of the 2$^{nd}$ shift register unit onto the gate lines GA7 to GA8. ga9 to ga10 represent gate turn-off signals output by the 1$^{st}$ drive output terminal GO_1 and the 2$^{nd}$ drive output terminal GO_2 of the 3$^{rd}$ shift register unit onto the gate lines GA9 to GA10. Also, each shift register unit may input the high level of the first clock signal input to the cascade clock signal terminal CLKC to the cascade output terminal GC, as the high level output of the cascade signals gc1 to gc4, so as to realize the output process of the cascade signals gc1 to gc4. And, the target shift register unit (i.e., the 1$^{st}$ shift register unit) may input the high level of the third clock signal input to the 3$^{rd}$ drive clock signal terminal CLK_3 to the 3$^{rd}$ drive output terminal GO_3, as the high level output of the signal ga3; and input the high level of the third clock signal input to the 4$^{th}$ drive clock signal terminal CLK_4 to the 4$^{th}$ drive output terminal GO_4, as the high level output of the signal ga4, so as to realize the output process of the gate turn-on signals. And, the target shift register unit (i.e., the 2$^{nd}$ shift register unit) may input the high level of the third clock signal input to the 3$^{rd}$ drive clock signal terminal CLK_3 to the 3$^{rd}$ drive output terminal GO_3, as the high level output of the signal ga7; and input the high level of the third clock signal input to the 4$^{th}$ drive clock signal terminal CLK_4 to the 4$^{th}$ drive output terminal GO_4, as the high level output of the signal ga8, so as to realize the output process of the gate turn-on signals. Each of the remaining shift register units may input the low-level signals input to the 1$^{st}$ drive clock signal terminal CLK_1 to the 4$^{th}$ drive clock signal terminal CLK_4 to the 1$^{st}$ drive output terminal GO_1 to the 4$^{th}$ drive output terminal GO_4, as the low-level gate turn-off signals in the signals ga1 to ga2, ga5 to ga6 and ga9 to ga10, so as to realize the output process of the gate turn-off signals. In this way, the cascade circuit in the gate drive circuit can realize the cascade control function, and the output circuit can realize the output function of the gate turn-on signal, so that the cascade control function is separated from the output function of the gate turn-on signal. The gate turn-on signal may be output as needed, and then cooperate with the data voltage output of the source drive circuit to selectively refresh the changed part of the picture, that is, partial refresh, so as to reduce the operating power consumption of the overall display device under the condition of the unchanged refresh frequency.

Figure 21:
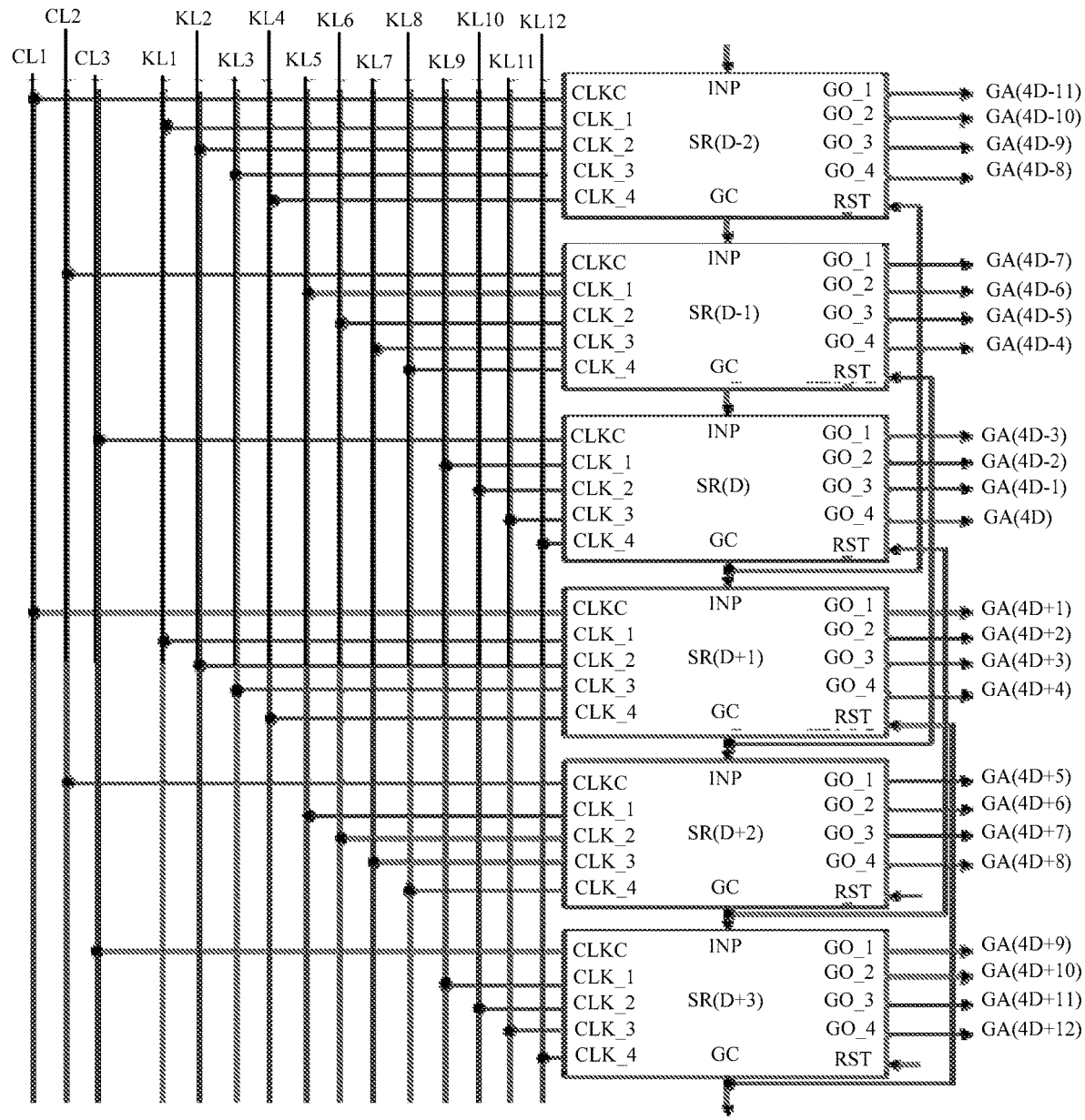
FIG. 21 is a schematic structural diagram of yet other gate drive circuits according to an embodiment of the disclosure.

Embodiments of the present invention provide yet other structural schematic diagrams of the array substrate, as shown in FIG. 21, which is modified from the implementations in the above embodiments. Only the differences between below embodiments and the above embodiments are illustrated below, and the similarities thereof are not repeated here.

In yet other embodiments of the disclosure, K may also be equal to 4. Exemplarily, the structure of the shift register units may be as shown in FIG. 16, and details will not be described again here. Of course, the specific value of K may also be other values, and is not limited in the disclosure.

In some embodiments of the disclosure, as shown in FIG. 21, the input signal terminal INP of the $1^{st}$ shift register unit is coupled to the frame start signal terminal, and the cascade output terminal GC of the $D^{th}$ shift register unit is coupled to the reset signal terminal RST of the $D-2^{th}$ shift register unit and the input signal terminal INP of the $D+1^{th}$ shift register unit respectively, where D is positive integer.

Exemplarily, as shown in FIG. 21, in the $D-2^{th}$ shift register unit, the $1^{st}$ drive output terminal GO_1 is coupled to the gate line GA(4D−11), the $2^{nd}$ drive output terminal GO_2 is coupled to the gate line GA(4D−10), the $3^{rd}$ drive output terminal GO_3 is coupled to the gate line GA(4D−9), and the $4^{th}$ drive output terminal GO_4 is coupled to the gate line GA(4D−8).

In the $D-1^{th}$ shift register unit, the $1^{st}$ drive output terminal GO_1 is coupled to the gate line GA(4D−7), the $2^{nd}$ drive output terminal GO_2 is coupled to the gate line GA(4D−6), the $3^{rd}$ drive output terminal GO_3 is coupled to the gate line GA(4D−5), and the $4^{th}$ drive output terminal GO_4 is coupled to the gate line GA(4D−4).

In the $D^{th}$ shift register unit, the $1^{st}$ drive output terminal GO_1 is coupled to the gate line GA(4D−3), the $2^{nd}$ drive output terminal GO_2 is coupled to the gate line GA(4D−2), the $3^{rd}$ drive output terminal GO_3 is coupled to the gate line GA(4D−1), and the $4^{th}$ drive output terminal GO_4 is coupled to the gate line GA(4D).

In the $D+1^{th}$ shift register unit, the $1^{st}$ drive output terminal GO_1 is coupled to the gate line GA(4D+1), the $2^{nd}$ drive output terminal GO_2 is coupled to the gate line GA(4D+2), the $3^{rd}$ drive output terminal GO_3 is coupled to the gate line GA(4D+3), and the $4^{th}$ drive output terminal GO_4 is coupled to the gate line GA(4D+4).

In the $D+2^{th}$ shift register unit, the $1^{st}$ drive output terminal GO_1 is coupled to the gate line GA(4D+5), the $2^{nd}$ drive output terminal GO_2 is coupled to the gate line GA(4D+6), the $3^{rd}$ drive output terminal GO_3 is coupled to the gate line GA(4D+7), and the $4^{th}$ drive output terminal GO_4 is coupled to the gate line GA(4D+8).

In the $D+3^{th}$ shift register unit, the $1^{st}$ drive output terminal GO_1 is coupled to the gate line GA(4D+9), the $2^{nd}$ drive output terminal GO_2 is coupled to the gate line GA(4D+10), the $3^{rd}$ drive output terminal GO_3 is coupled to the gate line GA(4D+11), and the $4^{th}$ drive output terminal GO_4 is coupled to the gate line GA(4D+12).

In some embodiments of the disclosure, as shown in FIG. 21, the array substrate further includes 3 cascade clock signal lines and 12 drive clock signal lines. Here, the first clock signal clkc1 transmitted on the $1^{st}$ cascade clock signal line CL1 among the 3 cascade clock signal lines is the same as the second clock signal clk1b transmitted on the $1^{st}$ drive clock signal line KL1 among the 12 drive clock signal lines. The first clock signal clkc2 transmitted on the $2^{nd}$ cascade clock signal line CL2 among the 3 cascade clock signal lines is the same as the second clock signal clk5b transmitted on the $5^{th}$ drive clock signal line KL5 among the 12 drive clock signal lines. The first clock signal clkc3 transmitted on the $3^{rd}$ cascade clock signal line CL3 among the 3 cascade clock signal lines is the same as the second clock signal clk9b transmitted on the $9^{th}$ drive clock signal line KL9 among the 12 drive clock signal lines. That is to say, the rising edge and falling edge of the first clock signal clkc1 transmitted on the $1^{st}$ cascade clock signal line CL1 are aligned with the rising edge and falling edge of the second clock signal clk1b transmitted on the $1^{st}$ drive clock signal line KL1. The rising edge and falling edge of the first clock signal clkc2 transmitted on the $2^{nd}$ cascade clock signal line CL2 are aligned with the rising edge and falling edge of the second clock signal clk5b transmitted on the $5^{th}$ drive clock signal line KL5. The rising edge and falling edge of the first clock signal clkc3 transmitted on the $3^{rd}$ cascade clock signal line CL3 are aligned with the rising edge and falling edge of the second clock signal clk9b transmitted on the $9^{th}$ drive clock signal line KL9.

Figure 22:
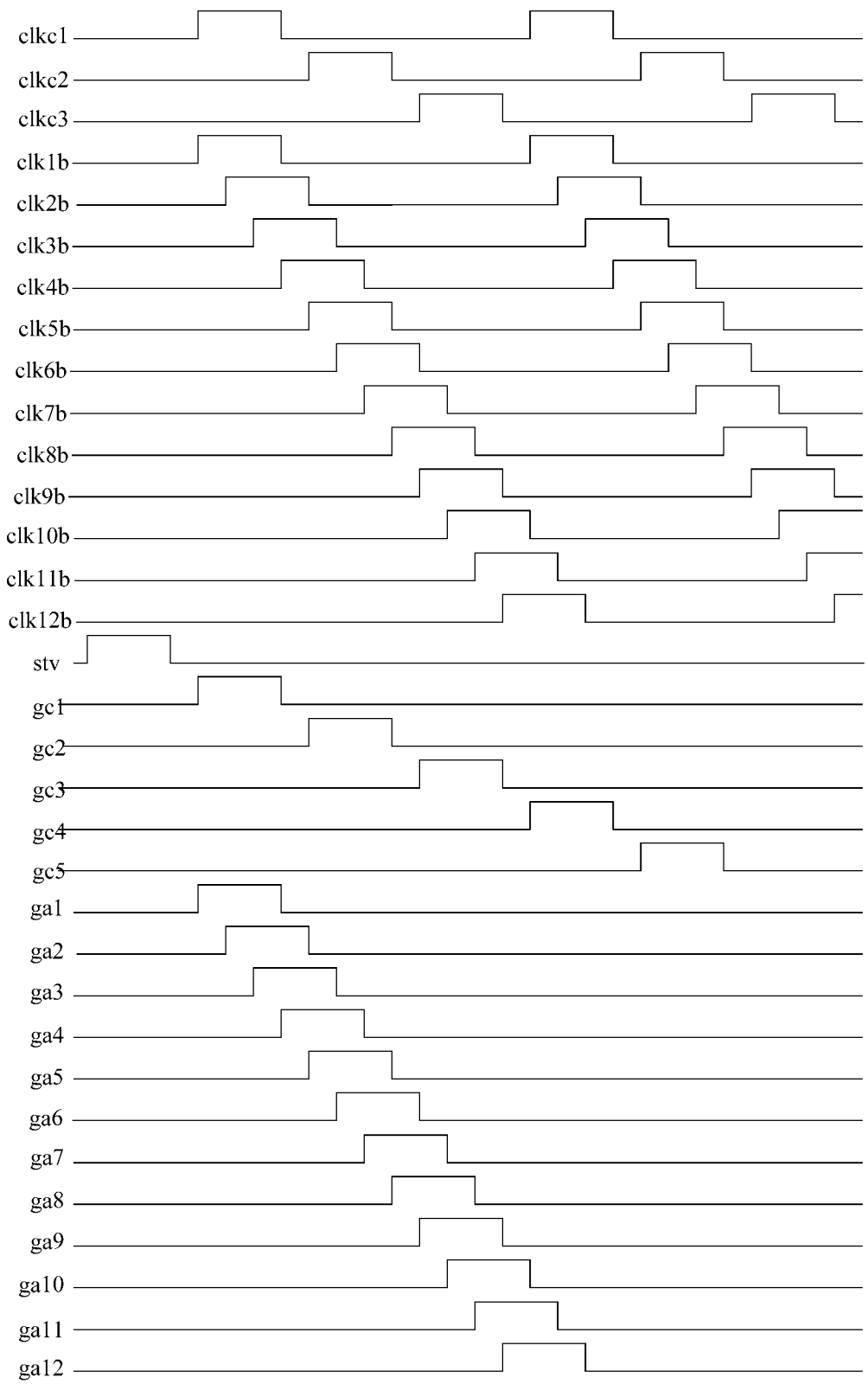
FIG. 22 is a timing diagram of yet other signals according to an embodiment of the disclosure.
Figure 23:
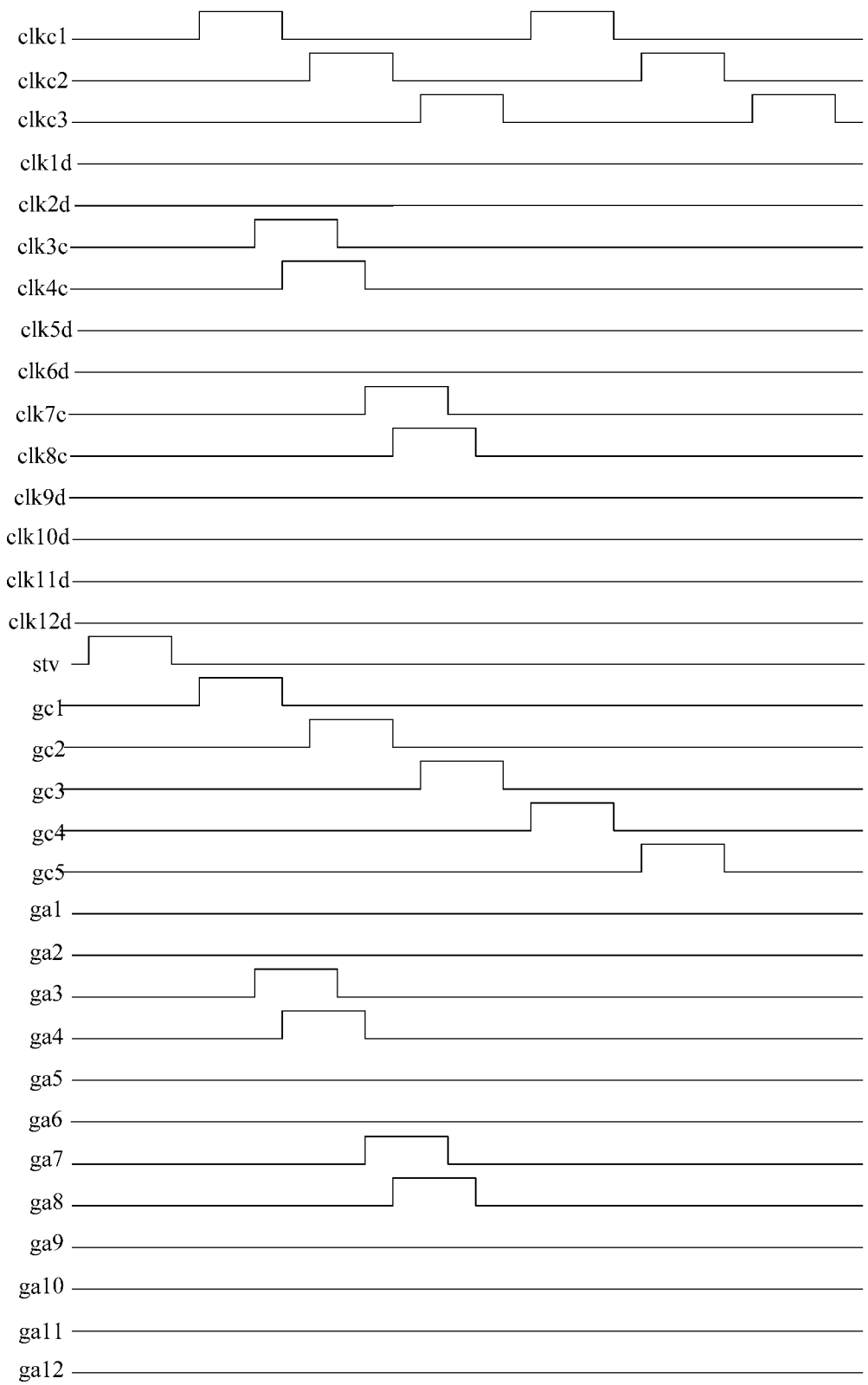
FIG. 23 is a timing diagram of yet other signals according to an embodiment of the disclosure.

In some embodiments of the disclosure, as shown in FIG. 21 to FIG. 23, the cascade clock signal terminal CLKC of the $3s-2^{th}$ shift register unit is coupled to the $1^{st}$ cascade clock signal line CL1, to input the first clock signal clkc1 through the $1^{st}$ cascade clock signal line CL1. The cascade clock signal terminal CLKC of the $3s-1^{th}$ shift register unit is coupled to the $2^{nd}$ cascade clock signal line CL2, to input the first clock signal clkc2 through the $2^{nd}$ cascade clock signal line CL2. The cascade clock signal terminal CLKC of the $3s^{th}$ shift register unit is coupled to the $3^{rd}$ cascade clock signal line CL3, to input the first clock signal clkc3 through the $3^{rd}$ cascade clock signal line CL3. Here, s is a positive integer.

In some embodiments of the disclosure, as shown in FIG. 21 to FIG. 23, in the $3s-2^{th}$ shift register unit, the $1^{st}$ drive clock signal terminal CLK_1 is coupled to the $1^{st}$ drive clock signal line KL1 to input a corresponding signal through the $1^{st}$ drive clock signal line KL1, the $2^{nd}$ drive clock signal terminal CLK_2 is coupled to the $2^{nd}$ drive clock signal line KL2 to input a corresponding signal through the $2^{nd}$ drive clock signal line KL2, the $3^{rd}$ drive clock signal terminal CLK_3 is coupled to the $3^{rd}$ drive clock signal line KL3 to input a corresponding signal through the $3^{rd}$ drive clock signal line KL3, and the $4^{th}$ drive clock signal terminal CLK_4 is coupled to the $4^{th}$ drive clock signal line KL4 to input a corresponding signal through the $4^{th}$ drive clock signal line KL4.

In the $3s-1^{th}$ shift register unit, the $1^{st}$ drive clock signal terminal CLK_1 is coupled to the $5^{th}$ drive clock signal line KL5 to input a corresponding signal through the $5^{th}$ drive clock signal line KL5, the $2^{nd}$ drive clock signal terminal CLK_2 is coupled to the $6^{th}$ drive clock signal line KL6 to input a corresponding signal through the $6^{th}$ drive clock signal line KL6, the $3^{rd}$ drive clock signal terminal CLK_3 is coupled to the $7^{th}$ drive clock signal line KL7 to input a corresponding signal through the $7^{th}$ drive clock signal line KL7, and the 4$^{th}$ drive clock signal terminal CLK_4 is coupled to the 8$^{th}$ drive clock signal line KL8 to input a corresponding signal through the 8$^{th}$ drive clock signal line KL8.

In the 3s$^{th}$ shift register unit, the 1$^{st}$ drive clock signal terminal CLK_1 is coupled to the 9$^{th}$ drive clock signal line KL9 to input a corresponding signal through the 9$^{th}$ drive clock signal line KL9, the 2$^{nd}$ drive clock signal terminal CLK_2 is coupled to the 10$^{th}$ drive clock signal line KL10 to input a corresponding signal through the 10$^{th}$ drive clock signal line KL10, the 3$^{rd}$ drive clock signal terminal CLK_3 is coupled to the 11$^{th}$ drive clock signal line KL11 to input a corresponding signal through the 11$^{th}$ drive clock signal line KL11, and the 4$^{th}$ drive clock signal terminal CLK_4 is coupled to the 12$^{th}$ drive clock signal line KL12 to input a corresponding signal through the 12$^{th}$ drive clock signal line KL12.

In some embodiments of the disclosure, in one clock cycle of the first clock signal, the duration of the active level accounts for no more than ⅓ of the clock cycle of the first clock signal. Exemplarily, as shown in FIGS. 22 and 23, taking the active level as high level as an example, in one clock cycle of the first clock signal, the duration of the high level accounts for no more than ⅓ (for example, may be ⅓, 0.3, 0.2, 0.1, etc., which is not limited here) of the clock cycle of the first clock signal.

In some embodiments of the disclosure, in one clock cycle of the second clock signal, the duration of the active level accounts for no more than ⅓ of the clock cycle of the second clock signal. Exemplarily, as shown in FIGS. 22 and 23, taking the active level as high level as an example, in one clock cycle of the second clock signal, the duration of the high level accounts for no more than ⅓ (for example, may be ⅓, 0.3, 0.2, 0.1, etc., which is not limited here) of the clock cycle of the second clock signal.

In some embodiments of the disclosure, the clock cycles of the second clock signal and the first clock signal are the same, and the duration of the active level (such as high level) in the second clock signal and the first clock signal has the same proportion in one clock cycle.

Exemplarily, taking K=4 as an example, in the first driving mode, the first clock signal with an active level and an inactive level alternating periodically is loaded to the cascade clock signal terminal CLKC of each shift register unit so that the cascade output terminal GC of the shift register unit outputs a cascade signal, and the second clock signal with an active level and an inactive level alternating periodically is loaded to the 1$^{st}$ drive clock signal terminal CLK_1 to the 4$^{th}$ drive clock signal terminal CLK_4 of each shift register unit respectively, so that the 1$^{st}$ drive output terminal GO_1 to the 4$^{th}$ drive output terminal GO_4 output gate turn-on signals respectively.

Exemplarily, in the first driving mode, the first clock signal is input to the cascade clock signal terminal CLKC through the cascade clock signal line, and the second clock signal is input to the drive clock signal terminal through the drive clock signal line. Exemplarily, as shown in FIG. 22, stv represents the signal of the frame start signal terminal, clkc1 represents the first clock signal transmitted on the 1$^{st}$ cascade clock signal line CL1, clkc2 represents the first clock signal transmitted on the 2$^{nd}$ cascade clock signal line CL2, and clkc3 represents the first clock signal transmitted on the 3$^{rd}$ cascade clock signal line CL3. clk1b represents the second clock signal transmitted on the 1$^{st}$ drive clock signal line KL1, clk2b represents the second clock signal transmitted on the 2$^{nd}$ drive clock signal line KL2, clk3b represents the second clock signal transmitted on the 3$^{rd}$ drive clock signal line KL3, clk4b represents the second clock signal transmitted on the 4$^{th}$ drive clock signal line KL4, clk5b represents the second clock signal transmitted on the 5$^{th}$ drive clock signal line KL5, clk6b represents the second clock signal transmitted on the 6$^{th}$ drive clock signal line KL6, clk7b represents the second clock signal transmitted on the 7$^{th}$ drive clock signal line KL7, clk8b represents the second clock signal transmitted on the 8$^{th}$ drive clock signal line KL8, clk9b represents the second clock signal transmitted on the 9$^{th}$ drive clock signal line KL9, clk10b represents the second clock signal transmitted on the 10$^{th}$ drive clock signal line KL10, clk11b represents the second clock signal transmitted on the 11$^{th}$ drive clock signal line KL11, and clk12b represents the second clock signal transmitted on the 12$^{th}$ drive clock signal line KL12. gc1 to gc5 represent the cascade signals output by the cascade output terminals GC of the 1$^{st}$ to 5$^{th}$ shift register units, and ga1 to ga12 represent signals output by the drive output terminals of the 1$^{st}$ to 3$^{rd}$ shift register units onto the gate lines GA1 to GA12, where the high level in the signals ga1 to ga12 is the gate turn-on signal, and the low level in the signals ga1 to ga12 is the gate turn-off signal. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, each shift register unit may input the high level of the second clock signal input to the 1$^{st}$ drive clock signal terminal CLK_1 to the 1$^{st}$ drive output terminal GO_1, as the high-level gate turn-on signal in the signals ga1, ga5 and ga9; and each shift register unit may input the high level of the second clock signal input to the 2$^{nd}$ drive clock signal terminal CLK_2 to the 2$^{nd}$ drive output terminal GO_2, as the high-level gate turn-on signal in the signals ga2, ga6 and ga10, so as to realize the output process of the gate turn-on signal. And, each shift register unit may input the high level of the second clock signal input to the 3$^{rd}$ drive clock signal terminal CLK_3 to the 3$^{rd}$ drive output terminal GO_3, as the high-level gate turn-on signal in the signals ga3, ga7 and ga11, so as to realize the output process of the gate turn-on signal. And, each shift register unit may input the high level of the second clock signal input to the 4$^{th}$ drive clock signal terminal CLK_4 to the 4$^{th}$ drive output terminal GO_4, as the high-level gate turn-on signal in the signals ga4, ga8 and ga12, so as to realize the output process of the gate turn-on signal. Thus the gate drive circuit can output the gate turn-on signal row by row. Therefore, when the display device displays a picture, the timing controller controls the gate drive circuit to output the gate turn-on signal (that is, the high level in the gate turn-on signal) to the pixel area row by row from top to bottom, and the gates of the transistors in the sub-pixel rows are turned on row by row while the source drive circuit outputs the sub-pixel display data and writes it into the corresponding sub-pixel row, so that the sub-pixels in the pixel area refresh the display data row by row. After all rows are refreshed, the refresh of the overall display picture is achieved.

Exemplarily, taking K=4 as an example, in the second driving mode, the first clock signal is loaded to the cascade clock signal terminal CLKC of each shift register unit so that the cascade output terminal GC of the shift register unit outputs a cascade signal, and the third clock signal with the active level appearing within the target time period is loaded to the target drive clock signal terminals (i.e., the 3$^{rd}$ drive clock signal terminal CLK_3 and the 4$^{th}$ drive clock signal terminal CLK_4 of the 1$^{st}$ shift register unit, and the 3$^{rd}$ drive clock signal terminal CLK_3 and the 4$^{th}$ drive clock signal terminal CLK_4 of the $2^{nd}$ shift register unit) of the target shift register units (taking the drive gate lines GA3 to GA4 and GA7 to GA8 as an example, the target shift register units include the $1^{st}$ shift register unit and the $2^{nd}$ shift register unit), so that the target drive output terminals (i.e., the $3^{rd}$ drive output terminal GO_3 and the $4^{th}$ drive output terminal GO_4 of the $1^{st}$ shift register unit, and the $3^{rd}$ drive output terminal GO_3 and the $4^{th}$ drive output terminal GO_4 of the $2^{nd}$ shift register unit) corresponding to the target drive clock signal terminals (i.e., the $3^{rd}$ drive clock signal terminal CLK_3 and the $4^{th}$ drive clock signal terminal CLK_4 of the $1^{st}$ shift register unit, and the $3^{rd}$ drive clock signal terminal CLK_3 and the $4^{th}$ drive clock signal terminal CLK_4 of the $2^{nd}$ shift register unit) output gate turn-on signals.

For example, as shown in FIG. 23, clkc1 represents the first clock signal transmitted on the $1^{st}$ cascade clock signal line CL1, clkc2 represents the first clock signal transmitted on the $2^{nd}$ cascade clock signal line CL2, and clkc3 represents the first clock signal transmitted on the $3^{rd}$ cascade clock signal line CL3. clk1$d$ represents the inactive level (such as low level) signal transmitted on the $1^{st}$ drive clock signal line KL1, clk2$d$ represents the inactive level (such as low level) signal transmitted on the $2^{nd}$ drive clock signal line KL2, clk3$c$ represents the third clock signal transmitted on the $3^{rd}$ drive clock signal line KL3, clk4$c$ represents the third clock signal transmitted on the $4^{th}$ drive clock signal line KL4, clk5$d$ represents the inactive level (such as low level) signal transmitted on the $5^{th}$ drive clock signal line KL5, clk6$d$ represents the inactive level (such as low level) signal transmitted on the $6^{th}$ drive clock signal line KL6, clk7$c$ represents the third clock signal transmitted on the $7^{th}$ drive clock signal line KL7, clk8$c$ represents the third clock signal transmitted on the $8^{th}$ drive clock signal line KL8, clk9$d$ represents the inactive level (such as low level) signal transmitted on the $9^{th}$ drive clock signal line KL9, clk10$d$ represents the inactive level (such as low level) signal transmitted on the $10^{th}$ drive clock signal line KL10, clk11$d$ represents the inactive level (such as low level) signal transmitted on the $11^{th}$ drive clock signal line KL11, and clk12$d$ represents the inactive level (such as low level) signal transmitted on the $12^{th}$ drive clock signal line KL12. Exemplarily, in the second driving mode, the first clock signal is input to the cascade clock signal terminal CLKC through the cascade clock signal line, and the third clock signal is input to the drive clock signal terminal through the drive clock signal line. Exemplarily, as shown in FIG. 23, stv represents the signal of the frame start signal terminal, gc1 to gc5 represent the cascade signals output by the cascade output terminals GC of the $1^{st}$ to $5^{th}$ shift register units, ga1 to ga2 represent gate turn-off signals (such as low level) output by the $1^{st}$ drive output terminal GO_1 and the $2^{nd}$ drive output terminal GO_2 of the $1^{st}$ shift register unit onto the gate lines GA1 to GA2, ga3 to ga4 represent signals output by the $3^{rd}$ drive output terminal GO_3 and the $4^{th}$ drive output terminal GO_4 of the $1^{st}$ shift register unit onto the gate lines GA3 to GA4, where the high level is the gate turn-on signal, and the low level is the gate turn-off signal. ga5 to ga6 represent gate turn-off signals (such as low level) output by the $1^{st}$ drive output terminal GO_1 and the $2^{nd}$ drive output terminal GO_2 of the $2^{nd}$ shift register unit onto the gate lines GA5 to GA6. ga7 to ga8 represent signals output by the $3^{rd}$ drive output terminal GO_3 and the $4^{th}$ drive output terminal GO_4 of the $2^{nd}$ shift register unit onto the gate lines GA7 to GA8, where the high level is the gate turn-on signal, and the low level is the gate turn-off signal. ga9 to ga12 represent gate turn-off signals output by the $1^{st}$ drive output terminal GO_1 to the $4^{th}$ drive output terminal GO_4 of the $3^{rd}$ shift register unit onto the gate lines GA9 to GA12. Also, each shift register unit may input the high level of the first clock signal input to the cascade clock signal terminal CLKC to the cascade output terminal GC, as the high level output of the cascade signals gc1 to gc4, so as to realize the output process of the cascade signals gc1 to gc4. And, the target shift register unit (i.e., the $1^{st}$ shift register unit) may input the high level of the third clock signal input to the $3^{rd}$ drive clock signal terminal CLK_3 to the $3^{rd}$ drive output terminal GO_3, as the high level output of the signal ga3, and input the high level of the third clock signal input to the $4^{th}$ drive clock signal terminal CLK_4 to the $4^{th}$ drive output terminal GO_4, as the high level output of the signal ga4, so as to realize the output process of the gate turn-on signals. The target shift register unit (i.e., the $2^{nd}$ shift register unit) may input the high level of the third clock signal input to the $3^{rd}$ drive clock signal terminal CLK_3 to the $3^{rd}$ drive output terminal GO_3, as the high level output of the signal ga7, and input the high level of the third clock signal input to the $4^{th}$ drive clock signal terminal CLK_4 to the $4^{th}$ drive output terminal GO_4, as the high level output of the signal ga8, so as to realize the output process of the gate turn-on signals. Each of the remaining shift register units may input the low-level signals input to the $1^{st}$ drive clock signal terminal CLK_1 to the $4^{th}$ drive clock signal terminal CLK_4 to the $1^{st}$ drive output terminal GO_1 to the $4^{th}$ drive output terminal GO_4, as the low-level gate turn-off signals in the signals ga1 to ga2, ga5 to ga6 and ga9 to ga12, so as to realize the output process of the gate turn-off signals. In this way, the cascade circuit in the gate drive circuit can realize the cascade control function, and the output circuit can realize the output function of the gate turn-on signal, so that the cascade control function is separated from the output function of the gate turn-on signal. The gate turn-on signal may be output as needed, and then cooperate with the data voltage output of the source drive circuit to selectively refresh the changed part of the picture, that is, partial refresh, so as to reduce the operating power consumption of the overall display device under the condition of the unchanged refresh frequency.

Figure 24:
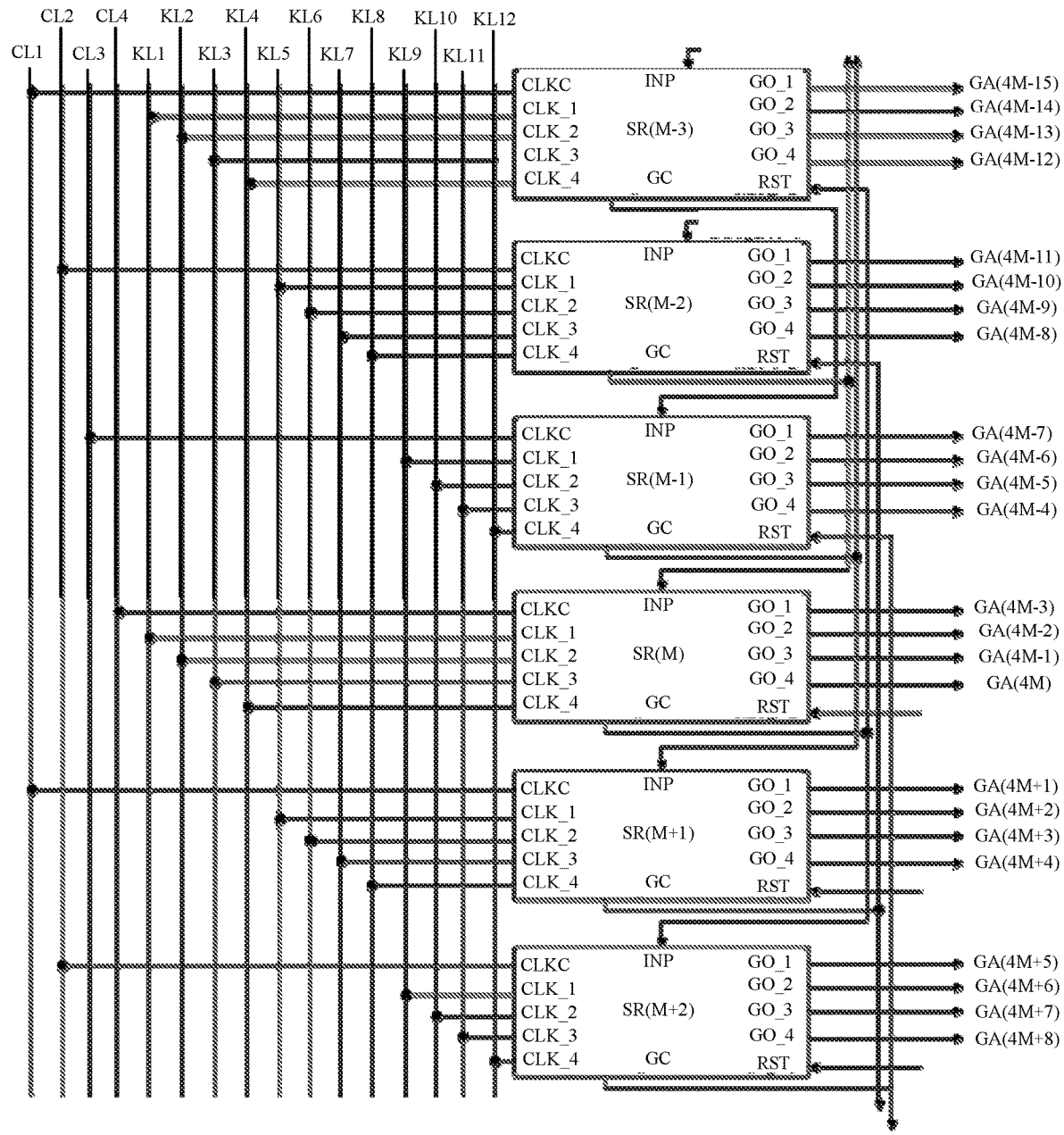
FIG. 24 is a schematic structural diagram of yet other gate drive circuits according to an embodiment of the disclosure.

Embodiments of the present invention provide yet other structural schematic diagrams of the array substrate, as shown in FIG. 24, which is modified from the implementations in the above embodiments. Only the differences between below embodiments and the above embodiments are illustrated below, and the similarities thereof are not repeated here.

In yet other embodiments of the disclosure, K may be equal to 2. Exemplarily, the structure of the shift register units may be as shown in FIG. 8, and details will not be described again here.

In yet other embodiments of the disclosure, K may also be equal to 4. Exemplarily, the structure of the shift register units may be as shown in FIG. 16, and details will not be described again here.

Of course, the specific value of K can be determined according to the requirements of the actual application, and is not limited in the disclosure.

In some embodiments of the disclosure, as shown in FIG. 24, the input signal terminal INP of the $1^{st}$ shift register unit is coupled to the frame start signal terminal, and the cascade output terminal GC of the $M^{th}$ shift register unit SR(M) is coupled to the reset signal terminal RST of the M−$3^{th}$ shift register unit SR(M−3) and the input signal terminal INP of the M+$2^{th}$ shift register unit SR(M+2) respectively, where M is positive integer.

Exemplarily, as shown in FIG. 24, in the M-3$^{th}$ shift register unit, the 1$^{st}$ drive output terminal GO_1 is coupled to the gate line GA(4M-15), the 2$^{nd}$ drive output terminal GO_2 is coupled to the gate line GA(4M-14), the 3$^{rd}$ drive output terminal GO_3 is coupled to the gate line GA(4M-13), and the 4$^{th}$ drive output terminal GO_4 is coupled to the gate line GA(4M-12).

In the M-2$^{th}$ shift register unit, the 1$^{st}$ drive output terminal GO_1 is coupled to the gate line GA(4M-11), the 2$^{nd}$ drive output terminal GO_2 is coupled to the gate line GA(4M-10), the 3$^{rd}$ drive output terminal GO_3 is coupled to the gate line GA(4M-9), and the 4$^{th}$ drive output terminal GO_4 is coupled to the gate line GA(4M-8).

In the M-1$^{th}$ shift register unit, the 1$^{st}$ drive output terminal GO_1 is coupled to the gate line GA(4M-7), the 2$^{nd}$ drive output terminal GO_2 is coupled to the gate line GA(4M-6), the 3$^{rd}$ drive output terminal GO_3 is coupled to the gate line GA(4M-5), and the 4$^{th}$ drive output terminal GO_4 is coupled to the gate line GA(4M-4).

In the M$^{th}$ shift register unit, the 1$^{st}$ drive output terminal GO_1 is coupled to the gate line GA(4M-3), the 2$^{nd}$ drive output terminal GO_2 is coupled to the gate line GA(4M-2), the 3$^{rd}$ drive output terminal GO_3 is coupled to the gate line GA(4M-1), and the 4$^{th}$ drive output terminal GO_4 is coupled to the gate line GA(4M).

In the M+1$^{th}$ shift register unit, the 1$^{st}$ drive output terminal GO_1 is coupled to the gate line GA(4M+1), the 2$^{nd}$ drive output terminal GO_2 is coupled to the gate line GA(4M+2), the 3$^{rd}$ drive output terminal GO_3 is coupled to the gate line GA(4M+3), and the 4$^{th}$ drive output terminal GO_4 is coupled to the gate line GA(4M+4).

In the M+2$^{th}$ shift register unit, the 1$^{st}$ drive output terminal GO_1 is coupled to the gate line GA(4M+5), the 2$^{nd}$ drive output terminal GO_2 is coupled to the gate line GA(4M+6), the 3$^{rd}$ drive output terminal GO_3 is coupled to the gate line GA(4M+7), and the 4$^{th}$ drive output terminal GO_4 is coupled to the gate line GA(4M+8).

In yet other embodiments of the disclosure, as shown in FIG. 24, the array substrate further includes four cascade clock signal lines. Here, among the plurality of shift register units, the cascade clock signal terminal CLKC of the 4p-3$^{th}$ shift register unit is coupled to the 1$^{st}$ cascade clock signal line CL1 among the 4 cascade clock signal lines, the cascade clock signal terminal CLKC of the 4p-2$^{th}$ shift register unit is coupled to the 2$^{nd}$ cascade clock signal line CL2 among the 4 cascade clock signal lines, the cascade clock signal terminal CLKC of the 4p-1$^{th}$ shift register unit is coupled to the 3$^{rd}$ cascade clock signal line CL3 among the 4 cascade clock signal lines, and the cascade clock signal terminal CLKC of the 4p$^{th}$ shift register unit is coupled to the 4$^{th}$ cascade clock signal line CL4 among the 4 cascade clock signal lines, where p is a positive integer.

In yet other embodiments of the disclosure, the array substrate further includes three drive clock signal line groups. Each of the 3 drive clock signal line groups includes K drive clock signal lines, and drive clock signal lines in different drive clock signal line groups are different. Here, among the plurality of shift register units, K drive clock signal terminals of the 3q-2$^{th}$ shift register unit are correspondingly coupled to K drive clock signal lines of a first drive clock signal group among the 3 drive clock signal line groups, K drive clock signal terminals of the 3q-1$^{th}$ shift register unit are correspondingly coupled to K drive clock signal lines of a second drive clock signal group among the 3 drive clock signal line groups, and K drive clock signal terminals of the 3q$^{th}$ shift register unit are correspondingly coupled to K drive clock signal lines of a third drive clock signal group among the 3 drive clock signal line groups, where q is a positive integer.

Exemplarily, as shown in FIG. 24, taking K=4 as an example, there are three drive clock signal groups. Each drive clock signal line group includes four drive clock signal lines, and the drive clock signal lines in different drive clock signal line groups are different. Here, the first drive clock signal group includes the 1$^{st}$ drive clock signal line KL1 to the 4$^{th}$ drive clock signal line KL4, the second drive clock signal group includes the 5$^{th}$ drive clock signal line KL5 to the 8$^{th}$ drive clock signal line KL8, and the third drive clock signal group includes the 9$^{th}$ drive clock signal line KL9 to the 12$^{th}$ drive clock signal line KL12. Moreover, in the 3q-2$^{th}$ shift register unit among the plurality of shift register units, the 1$^{st}$ drive clock signal terminal CLK_1 is coupled to the 1$^{st}$ drive clock signal line KL1, the 2$^{nd}$ drive clock signal terminal CLK_2 is coupled to the 2$^{nd}$ drive clock signal line KL2, the 3$^{rd}$ drive clock signal terminal CLK_3 is coupled to the 3$^{rd}$ drive clock signal line KL3, and the 4$^{th}$ drive clock signal terminal CLK_4 is coupled to the 4$^{th}$ drive clock signal line KL4.

In the 3q-1$^{th}$ shift register unit, the 1$^{st}$ drive clock signal terminal CLK_1 is coupled to the 5$^{th}$ drive clock signal line KL5, the 2$^{nd}$ drive clock signal terminal CLK_2 is coupled to the 6$^{th}$ drive clock signal line KL6, the 3$^{rd}$ drive clock signal terminal CLK_3 is coupled to the 7$^{th}$ drive clock signal line KL7, and the 4$^{th}$ drive clock signal terminal CLK_4 is coupled to the 8$^{th}$ drive clock signal line KL8.

In the 3q$^{th}$ shift register unit, the 1$^{st}$ drive clock signal terminal CLK_1 is coupled to the 9$^{th}$ drive clock signal line KL9, the 2$^{nd}$ drive clock signal terminal CLK_2 is coupled to the 10$^{th}$ drive clock signal line KL10, the 3$^{rd}$ drive clock signal terminal CLK_3 is coupled to the 11$^{th}$ drive clock signal line KL11, and the 4$^{th}$ drive clock signal terminal CLK_4 is coupled to the 12$^{th}$ drive clock signal line KL12.

Figure 25:
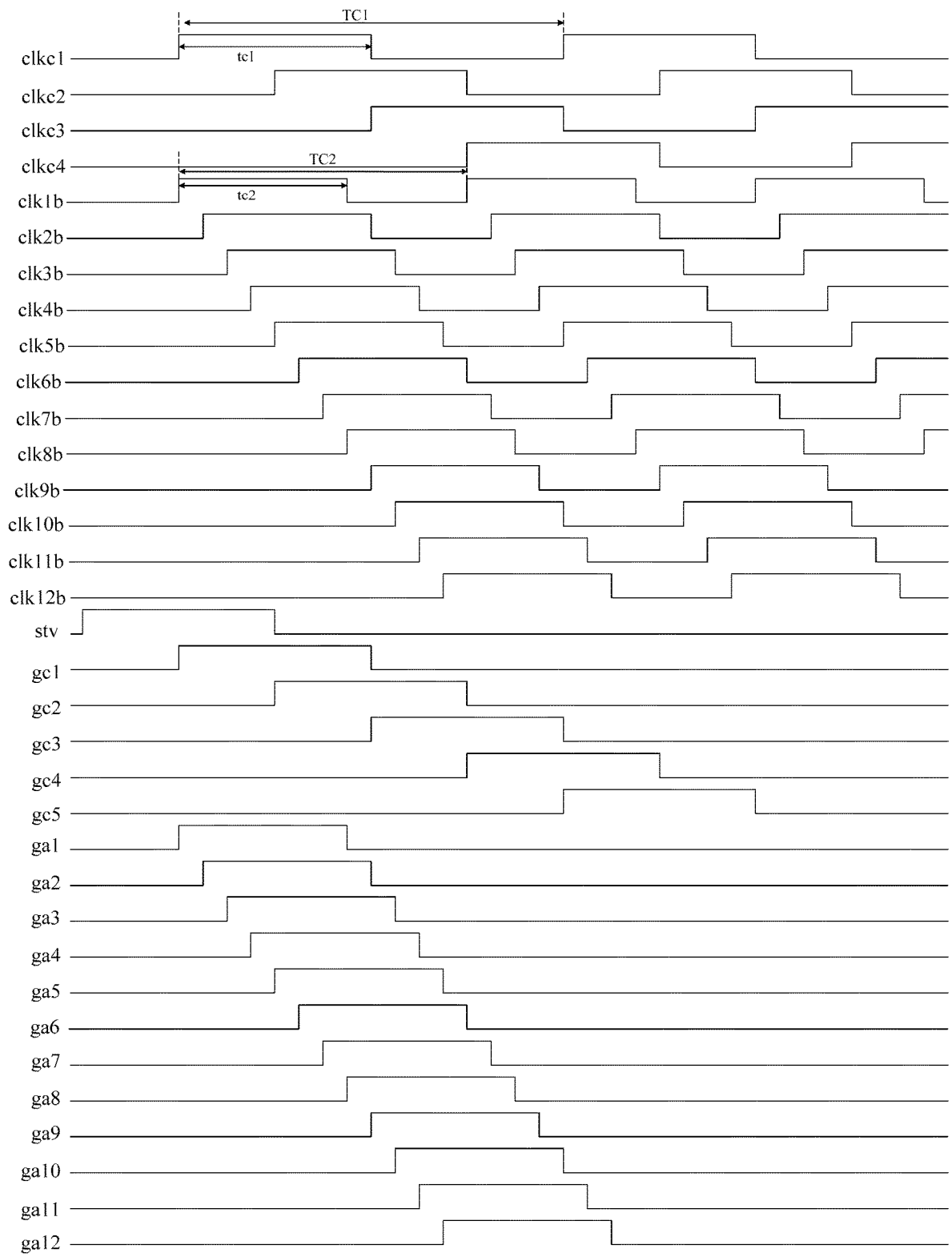
FIG. 25 is a timing diagram of yet other signals according to an embodiment of the disclosure.
Figure 26:
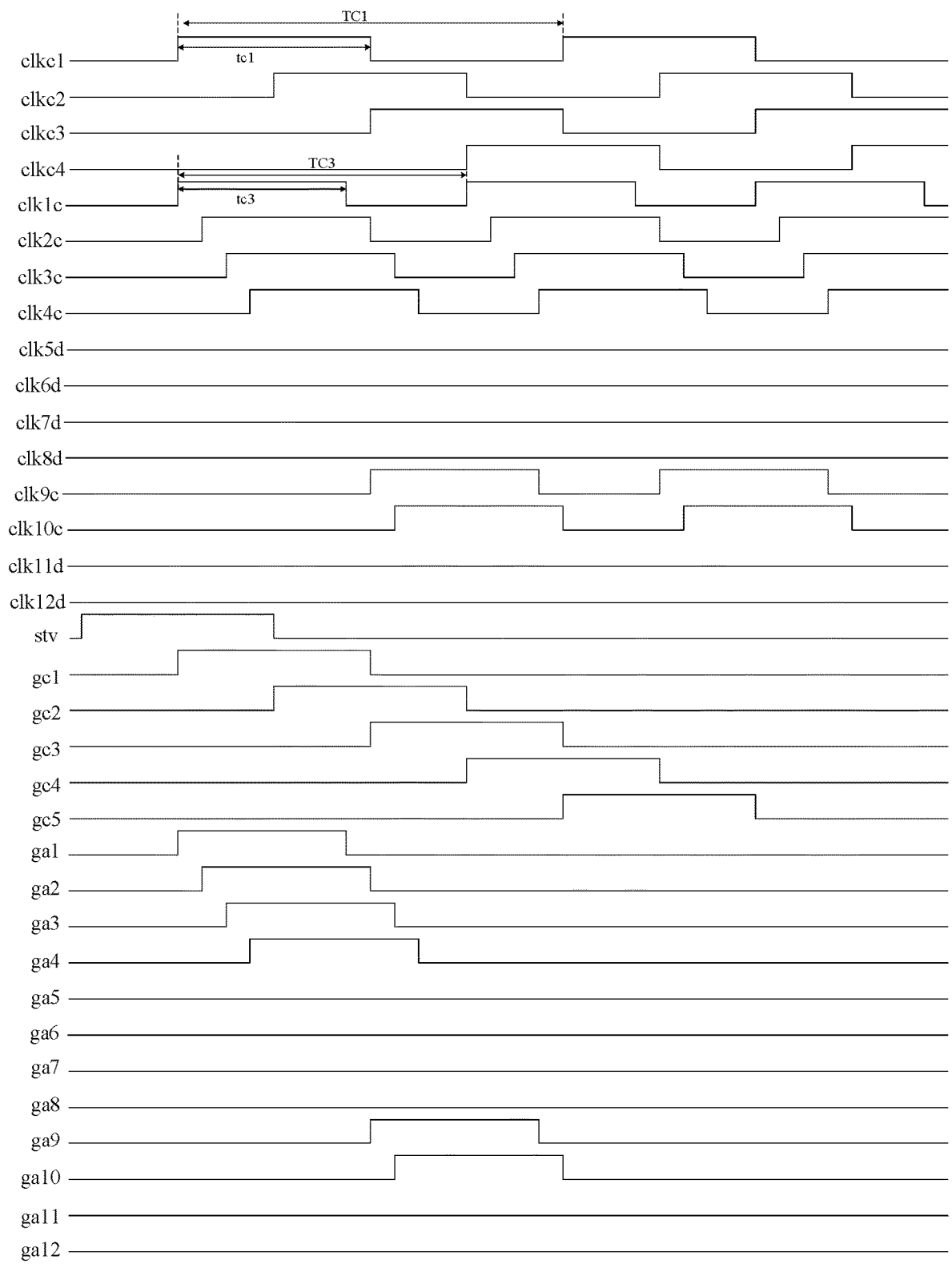
FIG. 26 is a timing diagram of yet other signals according to an embodiment of the disclosure.

In some embodiments of the disclosure, in one clock cycle of the first clock signal, a duration of the active level accounts for no more than 1¼K of the clock cycle of the first clock signal. Exemplarily, taking K=4 as an example, in one clock cycle of the first clock signal, the duration of the active level accounts for no more than 15/16 of the clock cycle of the first clock signal. For example, as shown in FIGS. 25 and 26, taking the first clock signal clkc1 and the active level as high level as an example, the duration tc1 of the high level in one clock cycle TC1 account for no more than 15/16 of this clock cycle TC1.

Optionally, in one clock cycle of the first clock signal, the duration of the active level may account for ½ of the clock cycle of the first clock signal. For example, as shown in FIGS. 25 and 26, taking the first clock signal clkc1 and the active level as high level as an example, the duration tc1 of the high level in one clock cycle TC1 may account for ½ of this clock cycle TC1.

Exemplarily, the clock cycle of the first clock signal is 4K*H, the duration of the active level is no more than 4(K-1)*H, and H represents the charging duration of a row of sub-pixels. That is, H represents the duration in which the transistor in one sub-pixel is turned on to input the data voltage on the data line into the pixel electrode. For example, as shown in FIGS. 25 and 26, taking K=4 as an example, the clock cycle of the first clock signal is 16H, and the duration of the high level is 8H.

In some embodiments of the disclosure, in one clock cycle of the second clock signal, a duration of the active level accounts for no more than (2K+1)/3K of the clock cycle of the second clock signal. Exemplarily, taking K=4 as an example, in one clock cycle of the second clock signal, the duration of the active level accounts for no more than ¾ of the clock cycle of the second clock signal. For example, as shown in FIG. 25, taking the second clock signal clk1*b* and the active level as high level as an example, the duration tc2 of the high level in one clock cycle TC2 accounts for no more than ¾ of this clock cycle TC2.

Optionally, in one clock cycle of the second clock signal, the duration of the active level may account for $7/12$ of the clock cycle of the second clock signal. For example, as shown in FIG. 25, taking the second clock signal clk1*b* and the active level as high level as an example, the duration tc2 of the high level in one clock cycle TC2 may account for $7/12$ of this clock cycle TC2.

Exemplarily, the clock cycle of the second clock signal is 3K*H, the duration of the active level is no more than (2K+1)*H, and H represents the charging duration of a row of sub-pixels. That is, H represents the duration in which the transistor in one sub-pixel is turned on to input the data voltage on the data line into the pixel electrode. For example, as shown in FIG. 25, taking K=4 as an example, the clock cycle of the second clock signal is 12H, and the duration of the high level is 7H.

In some embodiments of the disclosure, as shown in FIG. 26, the third clock signal is a clock signal with an active level and an inactive level alternately appearing in clock periodicity. Also, in one clock cycle of the third clock signal, the duration of the active level accounts for no more than (2K+1)/3K of the clock cycle of the third clock signal.

Exemplarily, taking K=4 as an example, in one clock cycle of the third clock signal, the duration of the active level accounts for no more than ¾ of the clock cycle of the third clock signal. For example, as shown in FIG. 26, taking the third clock signal clk1*c* and the active level as high level as an example, the duration tc3 of the high level in one clock cycle TC3 accounts for no more than ¾ of this clock cycle TC3.

Optionally, in one clock cycle of the third clock signal, the duration of the active level may account for $7/12$ of the clock cycle of the third clock signal. For example, as shown in FIG. 26, taking the third clock signal clk1*c* and the active level as high level as an example, the duration tc3 of the high level in one clock cycle TC3 may account for $7/12$ of this clock cycle TC3.

Exemplarily, the clock cycle of the third clock signal is 3K*H, the duration of the active level is no more than (2K+1)*H, and H represents the charging duration of a row of sub-pixels. That is, H represents the duration in which the transistor in one sub-pixel is turned on to input the data voltage on the data line into the pixel electrode. For example, as shown in FIG. 26, taking K=4 as an example, the clock cycle of the third clock signal is 12H, and the duration of the high level is 7H.

Exemplarily, the second clock signal and the third clock signal loaded on the same drive clock signal line are the same. For example, as shown in FIGS. 25 and 26, the second clock signal clk1*b* and the third clock signal clk1*c* loaded on the first drive clock signal line KL1 are the same. The rest are the same and will not be repeated here.

Exemplarily, the phase difference between the first clock signals loaded on two adjacent cascade clock signal lines is 4H. For example, as shown in FIGS. 25 and 26, the high level of the first clock signal clkc2 loaded on the $2^{nd}$ cascade clock signal line CL2 is later than the high level of the first clock signal clkc1 loaded on the $1^{st}$ cascade clock signal line CL1 by 4H.

The rest are the same and will not be repeated here.

Exemplarily, the phase difference between the second clock signals loaded on two adjacent drive clock signal lines is 1H. For example, as shown in FIG. 25, the high level of the second clock signal clk2*b* loaded on the $2^{nd}$ drive clock signal line KL2 is later than the high level of the second clock signal clk1*b* loaded on the $1^{st}$ drive clock signal line KL1 by 1H. The rest are the same and will not be repeated here.

Exemplarily, the rising edge of the first high level of the first clock signal clkc1 transmitted on the $1^{st}$ cascade clock signal line CL1 is aligned with the rising edge of the first high level of the second clock signal clk1*b* transmitted on the $1^{st}$ drive clock signal line KL1. The falling edge of the first high level of the first clock signal clkc1 transmitted on the $1^{st}$ cascade clock signal line CL1 is aligned with the falling edge of the first high level of the second clock signal clk2*b* transmitted on the $2^{nd}$ drive clock signal line KL2.

The rising edge of the first high level of the first clock signal clkc2 transmitted on the $2^{nd}$ cascade clock signal line CL2 is aligned with the rising edge of the first high level of the second clock signal clk5*b* transmitted on the $5^{th}$ drive clock signal line KL5. The falling edge of the first high level of the first clock signal clkc2 transmitted on the $2^{nd}$ cascade clock signal line CL2 is aligned with the falling edge of the first high level of the second clock signal clk6*b* transmitted on the $6^{th}$ drive clock signal line KL6.

The rising edge of the first high level of the first clock signal clkc3 transmitted on the $3^{rd}$ cascade clock signal line CL3 is aligned with the rising edge of the first high level of the second clock signal clk9*b* transmitted on the $9^{th}$ drive clock signal line KL9. The falling edge of the first high level of the first clock signal clkc3 transmitted on the $3^{rd}$ cascade clock signal line CL3 is aligned with the falling edge of the first high level of the second clock signal clk10*b* transmitted on the $10^{th}$ drive clock signal line KL10.

The rising edge of the first high level of the first clock signal clkc4 transmitted on the $4^{th}$ cascade clock signal line CL4 is aligned with the rising edge of the second high level of the second clock signal clk1*b* transmitted on the $1^{st}$ drive clock signal line KL1. The falling edge of the first high level of the first clock signal clkc4 transmitted on the $4^{th}$ cascade clock signal line CL4 is aligned with the falling edge of the second high level of the second clock signal clk2*b* transmitted on the $2^{nd}$ drive clock signal line KL2.

Exemplarily, taking K=4 as an example, in the first driving mode, the first clock signal with an active level and an inactive level alternating periodically is loaded to the cascade clock signal terminal CLKC of each shift register unit so that the cascade output terminal GC of the shift register unit outputs a cascade signal, and the second clock signal with an active level and an inactive level alternating periodically is loaded to the $1^{st}$ drive clock signal terminal CLK_1 to the $4^{th}$ drive clock signal terminal CLK_4 of each shift register unit respectively, so that the $1^{st}$ drive output terminal GO_1 to the $4^{th}$ drive output terminal GO_4 output gate turn-on signals respectively.

Exemplarily, in the first driving mode, the first clock signal is input to the cascade clock signal terminal CLKC through the cascade clock signal line, and the second clock signal is input to the drive clock signal terminal through the drive clock signal line. Exemplarily, as shown in FIG. 25, stv represents the signal of the frame start signal terminal, clkc1 represents the first clock signal transmitted on the $1^{st}$ cascade clock signal line CL1, clkc2 represents the first clock signal transmitted on the $2^{nd}$ cascade clock signal line CL2, clkc3 represents the first clock signal transmitted on the $3^{rd}$ cascade clock signal line CL3, and clkc4 represents the first clock signal transmitted on the $4^{th}$ cascade clock signal line CL4. clk1b represents the second clock signal transmitted on the $1^{st}$ drive clock signal line KL1, clk2b represents the second clock signal transmitted on the $2^{nd}$ drive clock signal line KL2, clk3b represents the second clock signal transmitted on the $3^{rd}$ drive clock signal line KL3, clk4b represents the second clock signal transmitted on the $4^{th}$ drive clock signal line KL4, clk5b represents the second clock signal transmitted on the $5^{th}$ drive clock signal line KL5, clk6b represents the second clock signal transmitted on the $6^{th}$ drive clock signal line KL6, clk7b represents the second clock signal transmitted on the $7^{th}$ drive clock signal line KL7, clk8b represents the second clock signal transmitted on the $8^{th}$ drive clock signal line KL8, clk9b represents the second clock signal transmitted on the $9^{th}$ drive clock signal line KL9, clk10b represents the second clock signal transmitted on the $10^{th}$ drive clock signal line KL10, clk11b represents the second clock signal transmitted on the $11^{th}$ drive clock signal line KL11, and clk12b represents the second clock signal transmitted on the $12^{th}$ drive clock signal line KL12. gc1 to gc5 represent the cascade signals output by the cascade output terminals GC of the $1^{st}$ to $5^{th}$ shift register units, and ga1 to ga12 represent signals output by the drive output terminals of the $1^{st}$ to $3^{rd}$ shift register units onto the gate lines GA1 to GA12, where the high level in the signals ga1 to ga12 is the gate turn-on signal, and the low level in the signals ga1 to ga12 is the gate turn-off signal. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, each shift register unit may input the high level of the second clock signal input to the $1^{st}$ drive clock signal terminal CLK_1 to the $1^{st}$ drive output terminal GO_1, as the high-level gate turn-on signal in the signals ga1, ga5 and ga9; and each shift register unit may input the high level of the second clock signal input to the $2^{nd}$ drive clock signal terminal CLK_2 to the $2^{nd}$ drive output terminal GO_2, as the high-level gate turn-on signal in the signals ga2, ga6 and ga10, so as to realize the output process of the gate turn-on signal. And, each shift register unit may input the high level of the second clock signal input to the $3^{rd}$ drive clock signal terminal CLK_3 to the $3^{rd}$ drive output terminal GO_3, as the high-level gate turn-on signal in the signals ga3, ga7 and ga11, so as to realize the output process of the gate turn-on signal. And, each shift register unit may input the high level of the second clock signal input to the $4^{th}$ drive clock signal terminal CLK_4 to the $4^{th}$ drive output terminal GO_4, as the high-level gate turn-on signal in the signals ga4, ga8 and ga12, so as to realize the output process of the gate turn-on signal. Thus the gate drive circuit can output the gate turn-on signal row by row. Therefore, when the display device displays a picture, the timing controller controls the gate drive circuit to output the gate turn-on signal (that is, the high level in the gate turn-on signal) to the pixel area row by row from top to bottom, and the gates of the transistors in the sub-pixel rows are turned on row by row while the source drive circuit outputs the sub-pixel display data and writes it into the corresponding sub-pixel row, so that the sub-pixels in the pixel area refresh the display data row by row. After all rows are refreshed, the refresh of the overall display picture is achieved.

Exemplarily, taking K=4 as an example, in the second driving mode, the first clock signal is loaded to the cascade clock signal terminal CLKC of each shift register unit so that the cascade output terminal GC of the shift register unit outputs a cascade signal, and the third clock signal with the active level appearing within the target time period is loaded to the target drive clock signal terminals (i.e., the $1^{st}$ drive clock signal terminal CLK_1 to the $4^{th}$ drive clock signal terminal CLK_4 of the $1^{st}$ shift register unit, and the $1^{st}$ drive clock signal terminal CLK_1 and the $2^{nd}$ drive clock signal terminal CLK_2 of the $3^{rd}$ shift register unit) of the target shift register units (taking the drive gate lines GA1 to GA4 and GA9 to GA10 as an example, the target shift register units include the $1^{st}$ shift register unit and the $3^{rd}$ shift register unit), so that the target drive output terminals (i.e., the $1^{st}$ drive output terminal GO_1 to the $4^{th}$ drive output terminal GO_4 of the $1^{st}$ shift register unit, and the $1^{st}$ drive output terminal GO_1 and the $2^{nd}$ drive output terminal GO_2 of the $3^{rd}$ shift register unit) corresponding to the target drive clock signal terminals (i.e., the $1^{st}$ drive clock signal terminal CLK_1 to the $4^{th}$ drive clock signal terminal CLK_4 of the $1^{st}$ shift register unit, and the $1^{st}$ drive clock signal terminal CLK_1 and the $2^{nd}$ drive clock signal terminal CLK_2 of the $3^{rd}$ shift register unit) output gate turn-on signals.

For example, as shown in FIG. 26, clkc1 represents the first clock signal transmitted on the $1^{st}$ cascade clock signal line CL1, clkc2 represents the first clock signal transmitted on the $2^{nd}$ cascade clock signal line CL2, clkc3 represents the first clock signal transmitted on the $3^{rd}$ cascade clock signal line CL3, and clkc4 represents the first clock signal transmitted on the $4^{th}$ cascade clock signal line CL4. clk1c represents the third clock signal transmitted on the $1^{st}$ drive clock signal line KL1, clk2c represents the third clock signal transmitted on the $2^{nd}$ drive clock signal line KL2, clk3c represents the third clock signal transmitted on the $3^{rd}$ drive clock signal line KL3, clk4c represents the third clock signal transmitted on the $4^{th}$ drive clock signal line KL4, clk5d represents the inactive level (such as low level) signal transmitted on the $5^{th}$ drive clock signal line KL5, clk6d represents the inactive level (such as low level) signal transmitted on the $6^{th}$ drive clock signal line KL6, clk7d represents the inactive level (such as low level) signal transmitted on the $7^{th}$ drive clock signal line KL7, clk8d represents the inactive level (such as low level) signal transmitted on the $8^{th}$ drive clock signal line KL8, clk9c represents the third clock signal transmitted on the $9^{th}$ drive clock signal line KL9, clk10c represents the third clock signal transmitted on the $10^{th}$ drive clock signal line KL10, clk11c represents the inactive level (such as low level) signal transmitted on the $11^{th}$ drive clock signal line KL11, and clk12c represents the inactive level (such as low level) signal transmitted on the $12^{th}$ drive clock signal line KL12. Exemplarily, in the second driving mode, the first clock signal is input to the cascade clock signal terminal CLKC through the cascade clock signal line, and the third clock signal is input to the drive clock signal terminal through the drive clock signal line. Exemplarily, as shown in FIG. 26, stv represents the signal of the frame start signal terminal, and gc1 to gc5 represent the cascade signals output by the cascade output terminals GC of the $1^{st}$ to $5^{th}$ shift register units. ga1 to ga4 represent signals output by the $1^{st}$ drive output terminal GO_1 to the $4^{th}$ drive output terminal GO_4 of the $1^{st}$ shift register unit onto the gate lines GA1 to GA4, where the high level is the gate turn-on signal, and the low level is the gate turn-off signal. ga5 to ga8 represent gate turn-off signals output by the $1^{st}$ drive output terminal GO_1 to the $4^{th}$ drive output terminal GO_4 of the $2^{nd}$ shift register unit onto the gate lines GA5 to GA8. ga9 to ga10 represent signals output by the $1^{st}$ drive output terminal GO_1 and the $2^{nd}$ drive output terminal GO_2 of the $3^{rd}$ shift register unit onto the gate lines GA9 to GA10, where the high level is the gate turn-on signal, and the low level is the gate turn-off signal. ga11 to ga12 represent gate turn-off signals output by the $3^{rd}$ drive output terminal GO_3 and the $4^{th}$ drive output terminal GO_4 of the $3^{rd}$ shift register unit onto the gate lines GA11 to GA12. Also, each shift register unit may input the high level of the first clock signal input to the cascade clock signal terminal CLKC to the cascade output terminal GC, as the high level output of the cascade signals gc1 to gc5, so as to realize the output process of the cascade signals gc1 to gc5. And, the target shift register unit (i.e., the $1^{st}$ shift register unit) may input the high level of the third clock signal input to the $1^{st}$ drive clock signal terminal CLK_1 to the $1^{st}$ drive output terminal GO_1, as the high level output of the signal ga1; input the high level of the third clock signal input to the $2^{nd}$ drive clock signal terminal CLK_2 to the $2^{nd}$ drive output terminal GO_2, as the high level output of the signal ga2; input the high level of the third clock signal input to the $3^{rd}$ drive clock signal terminal CLK_3 to the $3^{rd}$ drive output terminal GO_3, as the high level output of the signal ga3; and input the high level of the third clock signal input to the $4^{th}$ drive clock signal terminal CLK_4 to the $4^{th}$ drive output terminal GO_4, as the high level output of the signal ga4, so as to realize the output process of the gate turn-on signals. The target shift register unit (i.e., the $3^{rd}$ shift register unit) may input the high level of the third clock signal input to the $1^{st}$ drive clock signal terminal CLK_1 to the $1^{st}$ drive output terminal GO_1, as the high level output of the signal ga9; and input the high level of the third clock signal input to the $2^{nd}$ drive clock signal terminal CLK_2 to the $2^{nd}$ drive output terminal GO_2, as the high level output of the signal ga10, so as to realize the output process of the gate turn-on signals. Each of the remaining shift register units may input the low-level signals input to the $1^{st}$ drive clock signal terminal CLK_1 to the $4^{th}$ drive clock signal terminal CLK_4 to the $1^{st}$ drive output terminal GO_1 to the $4^{th}$ drive output terminal GO_4, as the low-level gate turn-off signals in the signals ga5 to ga8 and ga11 to ga12, so as to realize the output process of the gate turn-off signals. In this way, the cascade circuit in the gate drive circuit can realize the cascade control function, and the output circuit can realize the output function of the gate turn-on signal, so that the cascade control function is separated from the output function of the gate turn-on signal. The gate turn-on signal may be output as needed, and then cooperate with the data voltage output of the source drive circuit to selectively refresh the changed part of the picture, that is, partial refresh, so as to reduce the operating power consumption of the overall display device under the condition of the unchanged refresh frequency.

Embodiments of the disclosure further provide a driving method for the above-mentioned array substrate. The driving method includes:

in a first driving mode, loading a first clock signal with an active level and an inactive level alternating periodically to a cascade clock signal terminal of the shift register unit so that a cascade output terminal of the shift register unit outputs a cascade signal, and loading a second clock signal with an active level and an inactive level alternating periodically to any one of K drive clock signal terminals of the shift register unit so that a $k^{th}$ drive output terminal of the shift register unit corresponding to a $k^{th}$ drive clock signal terminal among the K drive clock signal terminals outputs a gate turn-on signal; where K is a positive integer, k is an integer and $1 \leq k \leq K$; and in a second driving mode, loading the first clock signal to the cascade clock signal terminal so that the cascade output terminal of the shift register unit outputs a cascade signal, and loading a third clock signal with an active level appearing within a target time period to a target drive clock signal terminal among the K drive clock signal terminals so that a target drive output terminal corresponding to the target drive clock signal terminal outputs a gate turn-on signal.

In some embodiments of the disclosure, in one clock cycle of the first clock signal, a duration of the active level accounts for no more than 1¼K of the clock cycle of the first clock signal.

In some embodiments of the disclosure, the clock cycle of the first clock signal is 4K*H, the duration of the active level is no more than 4(K−1)*H, and H represents a charging duration of a row of sub-pixels.

In some embodiments of the disclosure, in one clock cycle of the second clock signal, a duration of the active level accounts for no more than (2K+1)/3K of the clock cycle of the second clock signal.

In some embodiments of the disclosure, the clock cycle of the second clock signal is 3K*H, the duration of the active level is no more than (2K+1)*H, and H represents a charging duration of a row of sub-pixels.

In some embodiments of the disclosure, the third clock signal is a clock signal with an active level and an inactive level alternately appearing in clock periodicity.

In some embodiments of the disclosure, in one clock cycle of the third clock signal, a duration of the active level accounts for no more than (2K+1)/3K of the clock cycle of the third clock signal.

In some embodiments of the disclosure, the clock cycle of the third clock signal is 3K*H, the duration of the active level is no more than (2K+1)*H, and H represents a charging duration of a row of sub-pixels.

Embodiments of the disclosure further provide a display device, including the above-mentioned array substrate according to the embodiments of the present invention. The principle of the display device to solve the problem is similar to that of the above-mentioned array substrate, so the implementations of the display device can refer to the implementations of the above-mentioned array substrate, and the detailed description thereof will be omitted here.

During specific implementation, in embodiments of the invention, the display device may be a mobile phone, a tablet, a television, a display, a laptop, a digital photo frame, a navigator, or any other product or component with display functions. All of other indispensable components of the display device should be understood by those ordinary skilled in the art to be included, and will be omitted here and should not be considered as limitations on the invention.

Although the preferred embodiments of the invention have been described, those skilled in the art can make additional alterations and modifications to these embodiments once they learn about the basic creative concepts. Thus the attached claims are intended to be interpreted to include the preferred embodiments as well as all the alterations and modifications falling within the scope of the invention.

Evidently those skilled in the art can make various modifications and variations to the embodiments of the invention without departing from the spirit and scope of the embodiments of the invention. Thus the invention is also intended to encompass these modifications and variations therein as long as these modifications and variations to the embodiments of the invention come into the scope of the claims of the invention and their equivalents.

What is claimed is:

1. An array substrate, comprising: a gate drive circuit;
wherein the gate drive circuit comprises a plurality of shift register units in cascade;
any shift register unit among the plurality of shift register units is configured to: in a first driving mode, load a first clock signal with an active level and an inactive level alternating periodically to a cascade clock signal terminal of the shift register unit so that a cascade output terminal of the shift register unit outputs a cascade signal, and load a second clock signal with an active level and an inactive level alternating periodically to any one of K drive clock signal terminals of the shift register unit so that a $k^{th}$ drive output terminal of the shift register unit corresponding to a $k^{th}$ drive clock signal terminal among the K drive clock signal terminals outputs a gate turn-on signal; wherein K is a positive integer, k is an integer and $1 \leq k \leq K$; and
a target shift register unit among the plurality of shift register units is further configured to: in a second driving mode, load the first clock signal to a cascade clock signal terminal of the target shift register unit so that a cascade output terminal of the target shift register unit outputs a cascade signal, and load a third clock signal with an active level appearing within a target time period to a target drive clock signal terminal among K drive clock signal terminals of the target shift register unit so that a target drive output terminal of the target shift register unit corresponding to the target drive clock signal terminal outputs a gate turn-on signal.

2. The array substrate according to claim 1, wherein:
in one clock cycle of the first clock signal, a duration of the active level accounts for no more than 1¼K of the clock cycle of the first clock signal; and/or
in one clock cycle of the second clock signal, a duration of the active level accounts for no more than (2K+1)/3K of the clock cycle of the second clock signal; and/or
the third clock signal is a clock signal with an active level and an inactive level alternately appearing in clock periodicity; and in one clock cycle of the third clock signal, a duration of the active level accounts for no more than (2K+1)/3K of the clock cycle of the third clock signal.

3. The array substrate according to claim 2, wherein:
the clock cycle of the first clock signal is 4K*H, the duration of the active level is no more than 4 (K−1)*H, and H represents a charging duration of a row of sub-pixels; and/or
the clock cycle of the second clock signal is 3K*H, the duration of the active level is no more than (2K+1)*H, and H represents a charging duration of a row of sub-pixels; and/or
the clock cycle of the third clock signal is 3K*H, the duration of the active level is no more than (2K+1)*H, and H represents a charging duration of a row of sub-pixels.

4. The array substrate according to claim 1, wherein $K \geq 2$, and the array substrate further comprises 4 cascade clock signal lines and 3 drive clock signal line groups,
among the plurality of shift register units, a cascade clock signal terminal of a $4p-3^{th}$ shift register unit is coupled to a $1^{st}$ cascade clock signal line among the 4 cascade clock signal lines, a cascade clock signal terminal of a $4p-2^{th}$ shift register unit is coupled to a $2^{nd}$ cascade clock signal line among the 4 cascade clock signal lines, a cascade clock signal terminal of a $4p-1^{th}$ shift register unit is coupled to a $3^{rd}$ cascade clock signal line among the 4 cascade clock signal lines, and a cascade clock signal terminal of a $4p^{th}$ shift register unit is coupled to a $4^{th}$ cascade clock signal line among the 4 cascade clock signal lines, wherein p is a positive integer; and
each of the 3 drive clock signal line groups comprises K drive clock signal lines, and drive clock signal lines in different drive clock signal line groups are different;
wherein, among the plurality of shift register units, K drive clock signal terminals of a $3q-2^{th}$ shift register unit are correspondingly coupled to K drive clock signal lines of a first drive clock signal group among the 3 drive clock signal line groups, K drive clock signal terminals of a $3q-1^{th}$ shift register unit are correspondingly coupled to K drive clock signal lines of a second drive clock signal group among the 3 drive clock signal line groups, and K drive clock signal terminals of a $3q^{th}$ shift register unit are correspondingly coupled to K drive clock signal lines of a third drive clock signal group among the 3 drive clock signal line groups, wherein q is a positive integer.

5. The array substrate according to claim 4, wherein a cascade output terminal of an $M^{th}$ shift register unit is coupled to a reset signal terminal of an $M-3^{th}$ shift register unit and an input signal terminal of an $M+2^{th}$ shift register unit respectively, and M is a positive integer.

6. The array substrate according to claim 1, wherein K=1, and the first clock signal and the second clock signal input to the same shift register unit are same.

7. The array substrate according to claim 6, wherein the array substrate further comprises 2N cascade clock signal lines and 2N drive clock signal lines; and N is an integer greater than 0; and
a first clock signal transmitted on an $x^{th}$ cascade clock signal line among the 2N cascade clock signal lines is same as a second clock signal transmitted on an $x^{th}$ drive clock signal line among the 2N drive clock signal lines; wherein x is an integer and $1 \leq x \leq 2N$.

8. The array substrate according to claim 6, wherein a cascade output terminal of an $A^{th}$ shift register unit is coupled to a reset signal terminal of an $A-N-B^{th}$ shift register unit and an input signal terminal of an $A+N^{th}$ shift register unit respectively; A is a positive integer, B is an integer and $0 \leq B \leq N$.

9. The array substrate according to claim 1, wherein $K \geq 2$, and a clock cycle of the first clock signal is greater than a clock cycle of the second clock signal.

10. The array substrate according to claim 9, wherein the array substrate further comprises 4 cascade clock signal lines and 2K drive clock signal lines;
an active level of a first clock signal transmitted on a $1^{st}$ cascade clock signal line among the 4 cascade clock signal lines corresponds to an active level of a first part of a second clock signal transmitted on a $1^{st}$ drive clock signal line among the 2K drive clock signal lines, an active level of a first clock signal transmitted on a $3^{rd}$ cascade clock signal line among the 4 cascade clock signal lines corresponds to an active level of a second part of the second clock signal transmitted on the $1^{st}$ drive clock signal line, and the active level of the first part and the active level of the second part appear alternately; and
an active level of a first clock signal transmitted on a $2^{nd}$ cascade clock signal line among the 4 cascade clock signal lines corresponds to an active level of a third part of a second clock signal transmitted on a K+1$^{th}$ drive clock signal line among the 2K drive clock signal lines, an active level of a first clock signal transmitted on a 4$^{th}$ cascade clock signal line among the 4 cascade clock signal lines corresponds to an active level of a fourth part of the second clock signal transmitted on the K+1th drive clock signal line, and the active level of the third part and the active level of the fourth part appear alternately.

11. The array substrate according to claim 10, wherein the clock cycle of the first clock signal is K times the clock cycle of the second clock signal;
   in one clock cycle of the first clock signal, a duration of the active level accounts for no more than ½ of the clock cycle of the first clock signal; and
   a duration of an active level of the third clock signal is same as a duration of an active level of the first clock signal.

12. The array substrate according to claim 1, wherein K=4, and the array substrate further comprises 5 cascade clock signal lines and 10 drive clock signal lines;
   a first clock signal transmitted on a 1$^{st}$ cascade clock signal line among the 5 cascade clock signal lines is same as a second clock signal transmitted on a 1$^{st}$ drive clock signal line among the 10 drive clock signal lines;
   a first clock signal transmitted on a 2$^{nd}$ cascade clock signal line among the 5 cascade clock signal lines is same as a second clock signal transmitted on a 5th drive clock signal line among the 10 drive clock signal lines;
   a first clock signal transmitted on a 3$^{rd}$ cascade clock signal line among the 5 cascade clock signal lines is same as a second clock signal transmitted on a 9$^{th}$ drive clock signal line among the 10 drive clock signal lines;
   a first clock signal transmitted on a 4$^{th}$ cascade clock signal line among the 5 cascade clock signal lines is same as a second clock signal transmitted on a 3$^{rd}$ drive clock signal line among the 10 drive clock signal lines; and
   a first clock signal transmitted on a 5$^{th}$ cascade clock signal line among the 5 cascade clock signal lines is same as a second clock signal transmitted on a 7$^{th}$ drive clock signal line among the 10 drive clock signal lines.

13. The array substrate according to claim 12, wherein, in one clock cycle of the first clock signal, a duration of the active level accounts for no more than ⅖ of the clock cycle of the first clock signal; and
   in one clock cycle of the second clock signal, a duration of the active level accounts for no more than ⅖ of the clock cycle of the second clock signal.

14. The array substrate according to claim 1, wherein K=4, and the array substrate further comprises 3 cascade clock signal lines and 12 drive clock signal lines;
   a first clock signal transmitted on a 1$^{st}$ cascade clock signal line among the 3 cascade clock signal lines is same as a second clock signal transmitted on a 1$^{st}$ drive clock signal line among the 12 drive clock signal lines;
   a first clock signal transmitted on a 2$^{nd}$ cascade clock signal line among the 3 cascade clock signal lines is same as a second clock signal transmitted on a 5$^{th}$ drive clock signal line among the 12 drive clock signal lines; and
   a first clock signal transmitted on a 3$^{rd}$ cascade clock signal line among the 3 cascade clock signal lines is same as a second clock signal transmitted on a 9$^{th}$ drive clock signal line among the 12 drive clock signal lines.

15. The array substrate according to claim 14, wherein, in one clock cycle of the first clock signal, a duration of the active level accounts for no more than ⅓ of the clock cycle of the first clock signal; and
   in one clock cycle of the second clock signal, a duration of the active level accounts for no more than ⅓ of the clock cycle of the second clock signal.

16. The array substrate according to claim 9, wherein a cascade output terminal of a D$^{th}$ shift register unit is coupled to a reset signal terminal of a D−2$^{th}$ shift register unit and an input signal terminal of a D+1$^{th}$ shift register unit respectively, and D is a positive integer.

17. The array substrate according to claim 1, wherein K=2, the array substrate further comprises F cascade clock signal lines and 2F drive clock signal lines, and F is an integer greater than 2; and
   a first clock signal transmitted on an f$^{th}$ cascade clock signal line among the F cascade clock signal lines is same as a second clock signal transmitted on a 2f−1$^{th}$ drive clock signal line among the 2F drive clock signal lines; wherein f is an integer and 1≤f≤F.

18. The array substrate according to claim 17, wherein a cascade output terminal of a C$^{th}$ shift register unit is coupled to a reset signal terminal of a C−Y−1$^{th}$ shift register unit and an input signal terminal of a C+Y$^{th}$ shift register unit respectively, C is a positive integer, and Y is an integer part of F/2.

19. A driving method for an array substrate, wherein the array substrate comprises: a gate drive circuit comprising a plurality of shift register units in cascade; and
   the driving method comprises:
   in a first driving mode, loading a first clock signal with an active level and an inactive level alternating periodically to a cascade clock signal terminal of any shift register unit among the plurality of shift register units so that a cascade output terminal of the shift register unit outputs a cascade signal, and loading a second clock signal with an active level and an inactive level alternating periodically to any one of K drive clock signal terminals of the shift register unit so that a k$^{th}$ drive output terminal of the shift register unit corresponding to a k$^{th}$ drive clock signal terminal among the K drive clock signal terminals outputs a gate turn-on signal; wherein K is a positive integer, k is an integer and 1≤k≤K; and
   in a second driving mode, loading the first clock signal to a cascade clock signal terminal of a target shift register unit among the plurality of shift register units so that a cascade output terminal of the target shift register unit outputs a cascade signal, and loading a third clock signal with an active level appearing within a target time period to a target drive clock signal terminal among K drive clock signal terminals of the target shift register unit so that a target drive output terminal of the target shift register unit corresponding to the target drive clock signal terminal outputs a gate turn-on signal.

20. A display device, comprising an array substrate;
   wherein the array substrate comprises a gate drive circuit, and the gate drive circuit comprises a plurality of shift register units in cascade;
   any shift register unit among the plurality of shift register units is configured to: in a first driving mode, load a first clock signal with an active level and an inactive level alternating periodically to a cascade clock signal terminal of the shift register unit so that a cascade output terminal of the shift register unit outputs a cascade signal, and load a second clock signal with an active level and an inactive level alternating periodically to any one of K drive clock signal terminals of the shift register unit so that a $k^{th}$ drive output terminal of the shift register unit corresponding to a $k^{th}$ drive clock signal terminal among the K drive clock signal terminals outputs a gate turn-on signal; wherein K is a positive integer, k is an integer and $1 \leq k \leq K$; and a target shift register unit among the plurality of shift register units is further configured to: in a second driving mode, load the first clock signal to a cascade clock signal terminal of the target shift register unit so that a cascade output terminal of the target shift register unit outputs a cascade signal, and load a third clock signal with an active level appearing within a target time period to a target drive clock signal terminal among K drive clock signal terminals of the target shift register unit so that a target drive output terminal of the target shift register unit corresponding to the target drive clock signal terminal outputs a gate turn-on signal.

* * * * *